United States Patent
Purayath et al.

(10) Patent No.: US 8,603,890 B2
(45) Date of Patent: *Dec. 10, 2013

(54) AIR GAP ISOLATION IN NON-VOLATILE MEMORY

(75) Inventors: Vinod Robert Purayath, Santa Clara, CA (US); George Matamis, San Jose, CA (US); Eli Harari, Saratoga, CA (US); Hiroyuki Kinoshita, San Jose, CA (US); Tuan Pham, San Jose, CA (US)

(73) Assignee: SanDisk Technologies Inc., Plano, TX (US)

( * ) Notice: Subject to any disclaimer, the term of this patent is extended or adjusted under 35 U.S.C. 154(b) by 178 days.

This patent is subject to a terminal disclaimer.

(21) Appl. No.: 13/162,475

(22) Filed: Jun. 16, 2011

(65) Prior Publication Data

US 2011/0309425 A1 Dec. 22, 2011

Related U.S. Application Data

(60) Provisional application No. 61/356,603, filed on Jun. 19, 2010, provisional application No. 61/356,630, filed on Jun. 20, 2010.

(51) Int. Cl.
*H01L 21/76* (2006.01)
(52) U.S. Cl.
USPC ............... 438/421; 438/257; 257/E21.573
(58) Field of Classification Search
USPC .................. 438/421, 422, 619, 257
See application file for complete search history.

(56) References Cited

U.S. PATENT DOCUMENTS

| 7,737,015 | B2 | 6/2010 | Kohli et al. |
| 7,795,080 | B2 | 9/2010 | Orimoto et al. |
| 7,800,155 | B2 | 9/2010 | Matsuno |
| 7,863,190 | B1 | 1/2011 | Papasouliotis |
| 7,884,415 | B2 | 2/2011 | Nagano |
| 7,905,959 | B2 | 3/2011 | Tzu et al. |
| 8,053,347 | B2 | 11/2011 | Kang et al. |
| 8,129,264 | B2 | 3/2012 | Kim et al. |
| 8,362,542 | B2 | 1/2013 | Kang et al. |

(Continued)

FOREIGN PATENT DOCUMENTS

EP 1835530 A2 9/2007

OTHER PUBLICATIONS

International Search Report & The Written Opinion of the International Searching Authority dated Sep. 16, 2011, International Application No. PCT/US2011/040859.

(Continued)

*Primary Examiner* — Charles Garber
*Assistant Examiner* — Reema Patel
(74) *Attorney, Agent, or Firm* — Vierra Magen Marcus LLP

(57) ABSTRACT

Air gap isolation in non-volatile memory arrays and related fabrication processes are provided. Electrical isolation between adjacent active areas of a substrate can be provided, at least in part, by bit line air gaps that are elongated in a column direction between the active areas. At least one cap is formed over each isolation region, at least partially overlying air to provide an upper endpoint for the corresponding air gap. The caps may be formed at least partially along the sidewalls of adjacent charge storage regions. In various embodiments, selective growth processes are used to form capping strips over the isolation regions to define the air gaps. Word line air gaps that are elongated in a row direction between adjacent rows of storage elements are also provided.

24 Claims, 48 Drawing Sheets

(56) References Cited

U.S. PATENT DOCUMENTS

| | | |
|---|---|---|
| 8,383,479 B2 | 2/2013 | Purayath |
| 2006/0194390 A1 | 8/2006 | Imai et al. |
| 2007/0184615 A1 | 8/2007 | Brazzelli et al. |
| 2007/0257305 A1 | 11/2007 | Sasago et al. |
| 2008/0003743 A1 | 1/2008 | Lee |
| 2008/0283898 A1 | 11/2008 | Kuniya |
| 2009/0212352 A1 | 8/2009 | Aoyama et al. |
| 2009/0267131 A1 | 10/2009 | Nitta |
| 2010/0019311 A1 | 1/2010 | Sato et al. |
| 2010/0127320 A1 | 5/2010 | Nishihara et al. |
| 2010/0230741 A1* | 9/2010 | Choi et al. ............. 257/324 |
| 2011/0057250 A1 | 3/2011 | Higashi |
| 2011/0303967 A1* | 12/2011 | Harari et al. ............ 257/321 |

OTHER PUBLICATIONS

Ragunathan, Shyam, et al., "Investigation of Ballistic Current in Scaled Floating-gate NAND FLASH and a Solution," IEEE International Electron Devices Meeting (IEDM), Dec. 2009, pp. 34.1.1-34.1.4.

Ragunathan, Shyam, et al., "Investigation of Ballistic Current in Scaled Floating-gate NAND FLASH and a Solution," Powerpoint Presentation, IEEE International Electron Devices Meeting (IEDM), Dec. 2009, pp. 1-38.

U.S. Appl. No. 13/157,178, filed Jun. 9, 2011.
U.S. Appl. No. 13/162,550, filed Jun. 16, 2011.
U.S. Appl. No. 13/163,538, filed Jun. 17, 2011.
International Preliminary Report on Patentability dated Dec. 9, 2012, International Application No. PCT/US2011/040859.

* cited by examiner

FIG. 1 (Prior art)
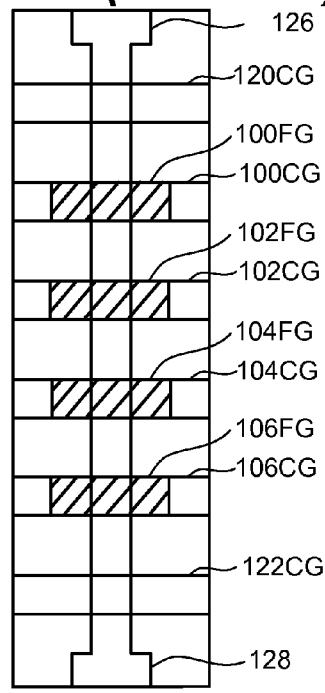
FIG. 2 (Prior art)
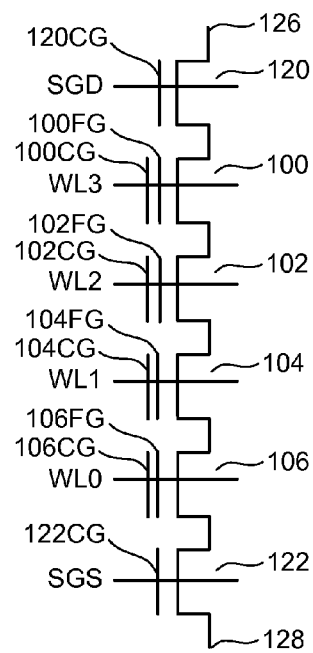
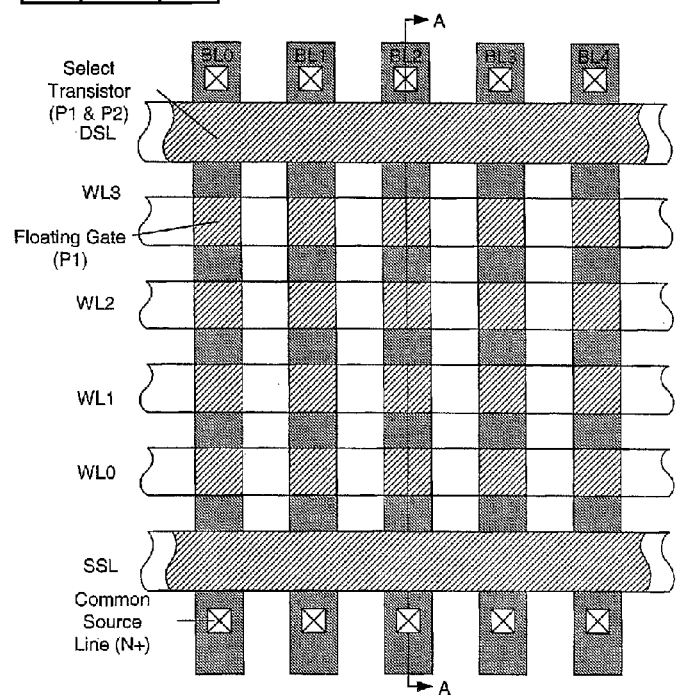
FIG. 3

US 8,603,890 B2

AIR GAP ISOLATION IN NON-VOLATILE MEMORY

PRIORITY CLAIM

The present application claims priority from:
U.S. Provisional Patent Application No. 61/356,603, entitled "Air Gap Isolation in Non-Volatile Memory," by Purayath, et al., filed Jun. 19, 2010, incorporated by reference herein in its entirety; and
U.S. Provisional Patent Application No. 61/356,630, entitled "Air Gap Isolation in Semiconductor Devices," by Purayath, et al., filed Jun. 20, 2010, incorporated by reference herein in its entirety.

BACKGROUND OF THE INVENTION

1. Field of the Disclosure

Embodiments of the present disclosure are directed to high density semiconductor devices, such as non-volatile storage, and methods of forming the same.

2. Description of the Related Art

In most integrated circuit applications, the substrate area allocated to implement the various integrated circuit functions continues to decrease. Semiconductor memory devices, for example, and their fabrication processes are continuously evolving to meet demands for increases in the amount of data that can be stored in a given area of the silicon substrate. These demands seek to increase the storage capacity of a given size of memory card or other type of package and/or decrease their size.

Electrical Erasable Programmable Read Only Memory (EEPROM), including flash EEPROM, and Electronically Programmable Read Only Memory (EPROM) are among the most popular non-volatile semiconductor memories. One popular flash EEPROM architecture utilizes a NAND array having a large number of strings of memory cells connected through one or more select transistors between individual bit lines and common source lines. FIG. 1 is a top view showing a single NAND string and FIG. 2 is an equivalent circuit thereof. The NAND string depicted in FIGS. 1 and 2 includes four transistors 100, 102, 104 and 106 in series between a first select gate 120 and a second select gate 122. Select gate 120 connects the NAND string to a bit line via bit line contact 126. Select gate 122 connects the NAND string to a common source line via source line contact 128. Each of the transistors 100, 102, 104 and 106 is an individual storage element and includes a control gate and a floating gate. For example, transistor 100 includes control gate 100CG and floating gate 100FG, transistor 102 includes control gate 102CG and floating gate 102FG, transistor 104 includes control gate 104CG and floating gate 104FG, and transistor 106 includes control gate 106CG and floating gate 106FG. Control gate 100CG is connected to word line WL3, control gate 102CG is connected to word line WL2, control gate 104CG is connected to word line WL1, and control gate 106CG is connected to word line WL0.

Note that although FIGS. 1 and 2 show four memory cells in the NAND string, the use of four transistors is only provided as an example. A NAND string can have less than four memory cells or more than four memory cells. For example, some NAND strings will include eight memory cells, 16 memory cells, 32 memory cells, or more.

The charge storage elements of current flash EEPROM arrays are most commonly electrically conductive floating gates, typically formed from a doped polysilicon material. Another type of memory cell useful in flash EEPROM systems utilizes a non-conductive dielectric material in place of a conductive floating gate to form a charge storage element capable of storing charge in a non-volatile manner. Such a cell is described in an article by Chan et al., "A True Single-Transistor Oxide-Nitride-Oxide EEPROM Device," IEEE Electron Device Letters, Vol. EDL-8, No. 3, March 1987, pp. 93-95. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. See also Nozaki et al., "A 1-Mb EEPROM with MONOS Memory Cell for Semiconductor Disk Application," EEE Journal of Solid-State Circuits, Vol. 26, No. 4, April 1991, pp. 497-501, which describes a similar cell in a split-gate configuration where a doped polysilicon gate extends over a portion of the memory cell channel to form a separate select transistor.

Memory cells of typical non-volatile flash arrays are divided into discrete blocks of cells that are erased together. That is, the block contains the minimum number of cells that are separately erasable together as an erase unit, although more than one block may be erased in a single erase operation. Additionally, more recent memories may provide erasing in smaller units than blocks. Each block typically stores one or more pages of data, where a page includes the minimum number of cells that are simultaneously subjected to a data programming and read operation as the basic unit of programming and reading, although more than one page may be programmed or read in a single operation. Each page typically stores one or more sectors of data, the size of the sector being defined by the host system. An example is a sector of 512 bytes of user data, following a standard established with magnetic disk drives, plus some number of bytes of overhead information about the user data and/or the block in which it is stored.

As demands for higher densities in integrated circuit applications have increased, fabrication processes have evolved to reduce the minimum feature sizes of circuit elements such as the gate and channel regions of transistors. As the feature sizes have decreased, modifications to the traditional NAND memory array have been made to, among other things, decrease parasitic capacitances associated with small feature sizes.

BRIEF DESCRIPTION OF THE DRAWINGS

FIG. 1 is a top view of a NAND string.
FIG. 2 is an equivalent circuit diagram of the NAND string depicted in FIG. 1.
FIG. 3 is a plan view of a portion of a NAND flash memory array.

DETAILED DESCRIPTION

Figure 4:
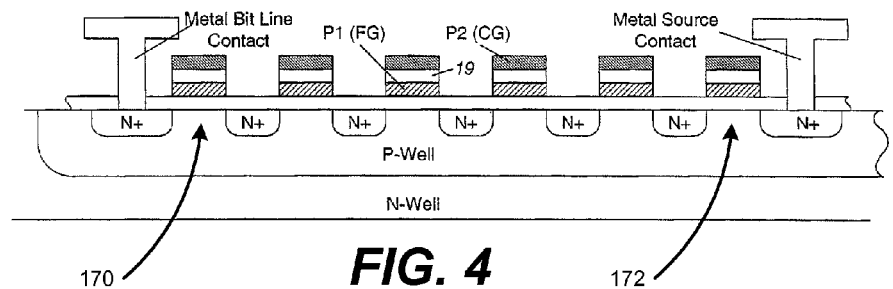
FIG. 4 is an orthogonal cross-sectional view taken along line A-A of the portion of the flash memory array depicted in FIG. 3.

Embodiments of the present disclosure are directed to high-density semiconductor memory, and more particularly to electrical isolation between discrete devices in non-volatile memory. Electrical isolation is provided, at least in part, by air gaps that are formed in the column (bit line) direction and/or air gaps that are formed in the row (word line) direction. Non-volatile memory arrays and related methods of fabrication are provided.

Air gaps formed in the column direction, referred to as bit line air gaps, can provide electrical isolation between devices adjacent in the row direction. For example, adjacent columns of non-volatile storage elements, such as adjacent strings in a NAND type non-volatile memory, can be isolated using air gaps that are formed in the substrate between active areas underlying the adjacent columns. Although principally described with respect to NAND type non-volatile memory, it will be understood that the various air gaps described herein can be utilized in other arrays utilizing column and/or row arrangements for storage elements.

In one embodiment, air gaps are formed in the substrate between adjacent active areas of the substrate. The air gaps can be formed in pre-defined isolation regions etched in the substrate. Strips of capping material can be formed that are elongated in the column direction over the isolation regions. These capping strips can seal or otherwise inhibit the accumulation of materials within the air gaps during subsequent process steps. Portions of the capping strips may be removed in later processes resulting in individual caps, with additional operations performed to seal or otherwise maintain the air gaps in the isolation regions where the material is removed. For example, additional air gaps may be formed in the row direction. A capping material used to define an upper endpoint for these air gaps, referred to as word line air gaps, may additionally define an upper endpoint for portion of the bit line air gaps.

In one embodiment, a dielectric capping material is selectively grown along the sidewalls (or a portion thereof) of adjacent strips of charge storage material. The strips of charge storage material are each part of individual layer stack columns. The columns include a layer of tunnel dielectric material between the charge storage strips and substrate surface. The capping material, at least temporarily, defines an upper endpoint region for the air gaps. It is noted that some amount of the capping material may grow in the isolation regions, even when using a liner as hereinafter described. Accordingly selectively growing the material does not preclude partially growing the material in the isolation regions. When the material is selectively grown on a layer such as that of the charge storage strips, it is grown or accumulated at a faster rate than at the isolation regions such that caps at least partially overlie air in the isolation regions.

A catalyst assisted selective growth process is used in one example. A catalyst layer is formed along the sidewalls prior to etching the substrate to define isolation regions. The isolation regions are then etched in the substrate between adjacent strips of charge storage material. A capping material is then selectively grown using the catalyst layer. The capping material is elongated in the column direction over the isolation regions. The selective growth process utilizes the catalyst layer to promote growth along sidewalls of the charge storage material. The capping material does not accumulate in the isolation regions to fill the regions. Thus, the capping material includes a lower surface at partially overlying air in the isolation regions.

In another example, a surface modification assisted growth process is used. The charge storage strips are subjected to ion implantation to promote growth along their sidewalls. After etching isolation regions between the strips, the capping material is selectively grown on the charge storage strips. The material accumulates, meeting at a location overlying the isolation regions. At least a portion of the material overlies air in each isolation region, defining an upper endpoint for the air gaps in the isolation regions.

An example of a NAND type of memory array that can be fabricated in accordance with embodiments of the present disclosure is shown in plan view in FIG. 3. BL0-BL4 represent bit line connections to global vertical metal bit lines (not shown). Four floating gate memory cells are shown in each string by way of example. Typically, the individual strings include 16, 32 or more memory cells, forming a column of memory cells. Control gate (word) lines labeled WL0-WL3 extend across multiple strings over rows of floating gates, often in polysilicon. FIG. 4 is a cross-sectional view taken along line A-A of FIG. 3, depicting polysilicon layer P2 from which the control gate lines are formed. The control gate lines are typically formed over the floating gates as a self-aligned stack, and are capacitively coupled to the floating gates through an intermediate dielectric layer 162. The top and bottom of the string connect to a bit line and a common source line through select transistors (gates) 170 and 172, respectively. Gate 170 is controlled by selection line DSL and gate 172 is controlled by selection line SSL. The floating gate material (P1) can be shorted to the control gate for the select transistors to be used as the active gate. Capacitive coupling between the floating gate and the control gate allows the voltage of the floating gate to be raised by increasing the voltage on the control gate. An individual cell within a column is read and verified during programming by causing the remaining cells in the string to be turned on hard by placing a relatively high voltage on their respective word lines and by placing a relatively lower voltage on the one selected word line so that the current flowing through each string is primarily dependent only upon the level of charge stored in the addressed cell below the selected word line. That current typically is sensed for a large number of strings in parallel, in order to read charge level states along a row of floating gates in parallel. Examples of NAND memory cell array architectures and their operation as part of a memory system are found in U.S. Pat. Nos. 5,570,315, 5,774,397 and 6,046,935.

Figure 5:
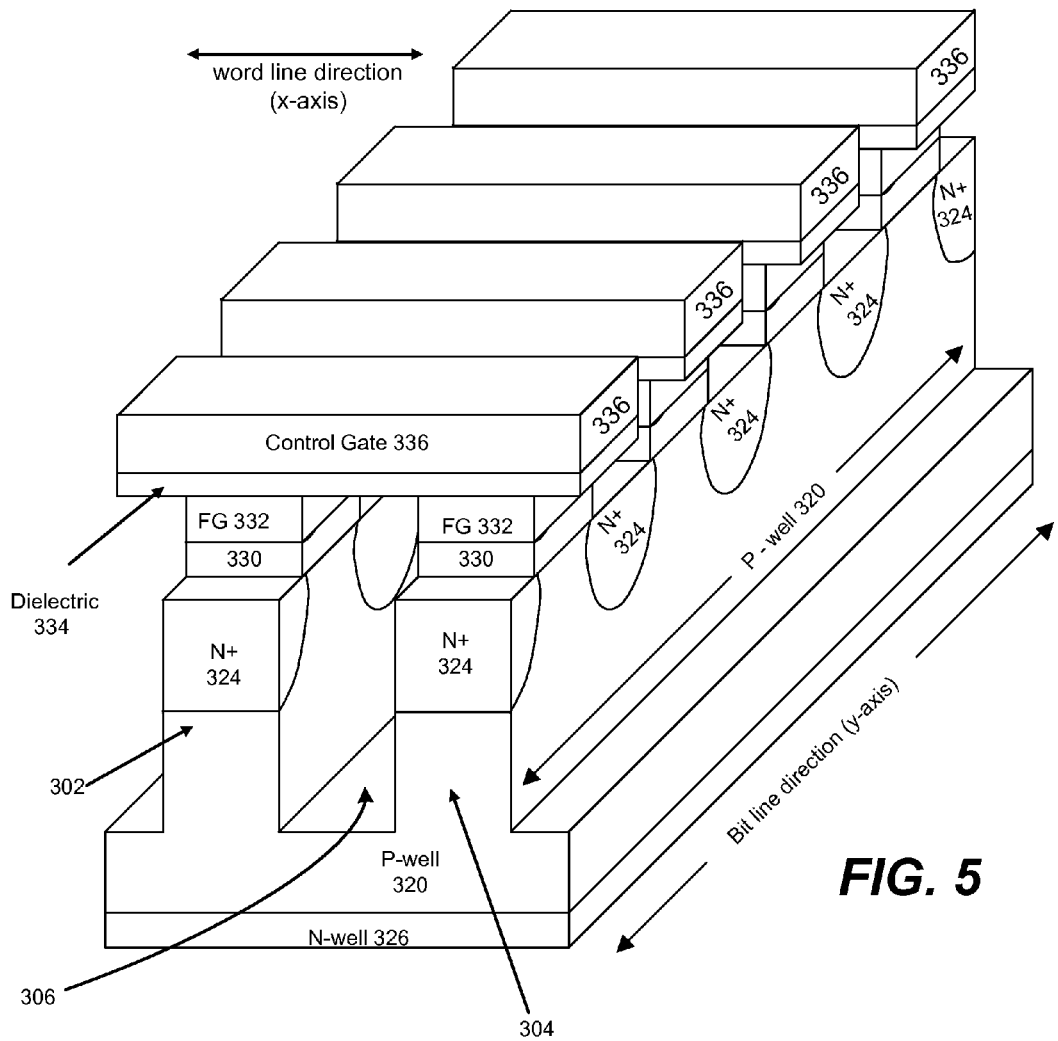
FIG. 5 is a three-dimensional drawing of a pair of four word line long portions of two NAND strings.

FIG. 5 is a three-dimensional block diagram of two exemplary NAND strings 302 and 304 that may be fabricated as part of a larger flash memory array. FIG. 5 depicts four memory cells on strings 302 and 304 as an example. FIG. 5 depicts N-well 326 below P-well 320. The bit line or y-direction runs along the NAND strings, and the word line or x-direction runs perpendicular to the NAND string or the bit line direction. The word line direction may also be referred to as the row direction and the bit line direction referred to as the column direction. The P-type substrate below N-well 336 is not shown in FIG. 5. In one embodiment, the control gates form the word lines. A continuous layer of conductive layer 336 can be formed which is consistent across a row in order to provide a common word line or control gate for each device on that word line. In such a case, this layer can be considered to form a control gate for each memory cell at the point where the layer overlaps a corresponding floating gate layer 332. In other embodiments, individual control gates can be formed and then interconnected by a separately formed word line.

When fabricating a NAND-type non-volatile memory system, including NAND strings as depicted in FIG. 5, electrical isolation is provided in the word line direction between adjacent strings. In the embodiment depicted in FIG. 5, NAND string 302 is separated from NAND string 304 by isolation area 306. Typically, an insulating material or dielectric is formed between adjacent NAND strings in this isolation area.

In accordance with embodiments of the present disclosure, air gaps are introduced in the column (bit line) and/or row (word line) direction to form electrical isolation between closely spaced components in the memory structure. Air gaps can decrease parasitic interferences between neighboring charge storage regions (e.g., floating gates), neighboring control gates and/or between neighboring floating and control gates. Air gaps can include various material compositions and need not correspond to atmospheric air. For example, concentrations of elemental gases may vary in the air gap regions. An air gap is simply a void where no solid material is formed in the semiconductor structure.

High dielectric constant (K) materials are used (e.g., for the intermediate dielectric material) in one embodiment. High K materials can enhance coupling between the control gates and floating gates. A self-aligned high-K approach is utilized in one embodiment to reduce or eliminate charge transfer through the intermediate dielectric material. Incorporation of thin metal/charge-trap type floating gates are used in one embodiment to reduce or eliminate concerns with ballistic charge programming issues that may exist with conventional polysilicon floating gates.

Figure 6:
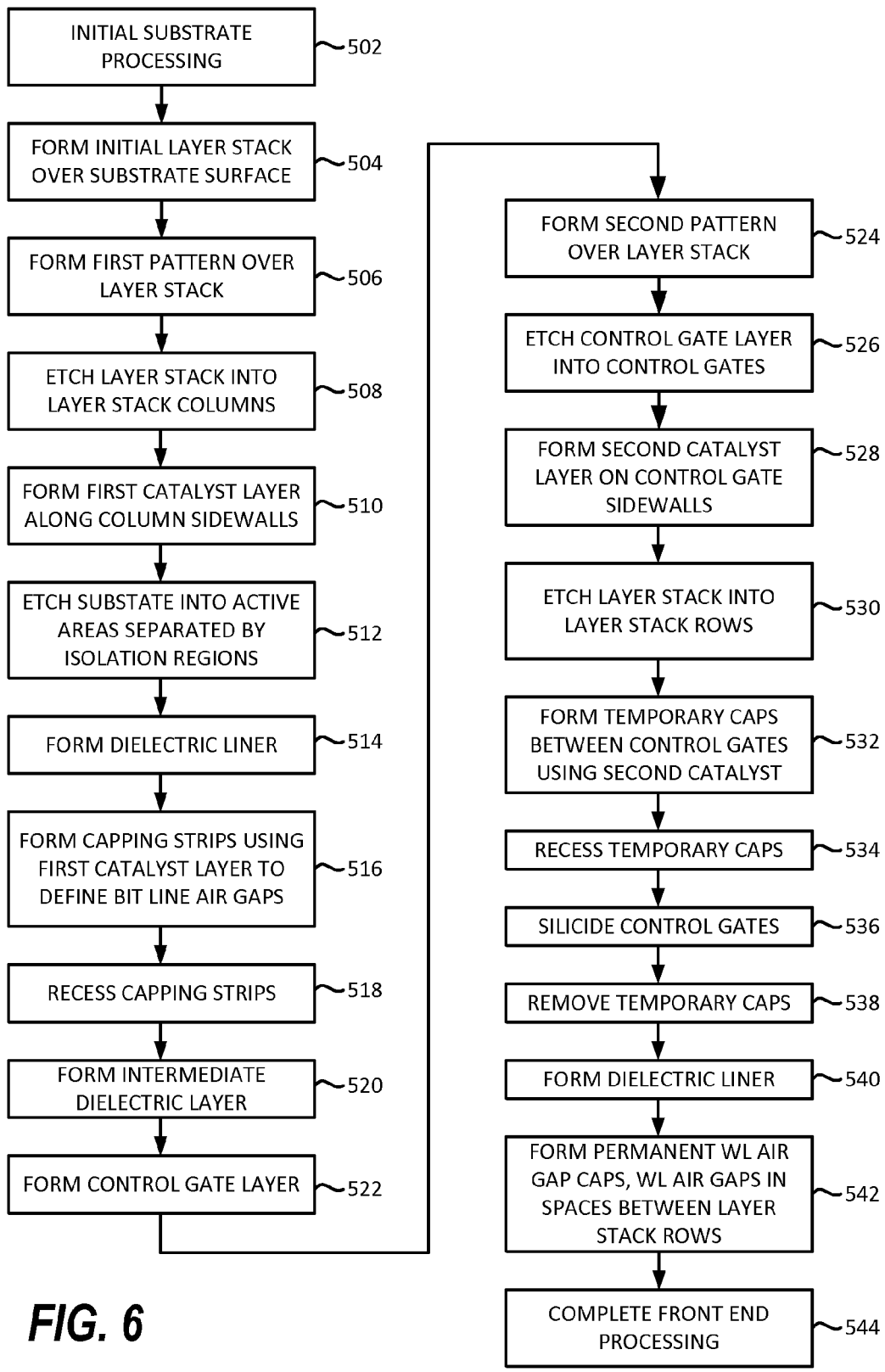
FIG. 6 is a flowchart describing a method of forming bit line and word line air gaps in accordance with one embodiment of the disclosure.
Figure 7A:
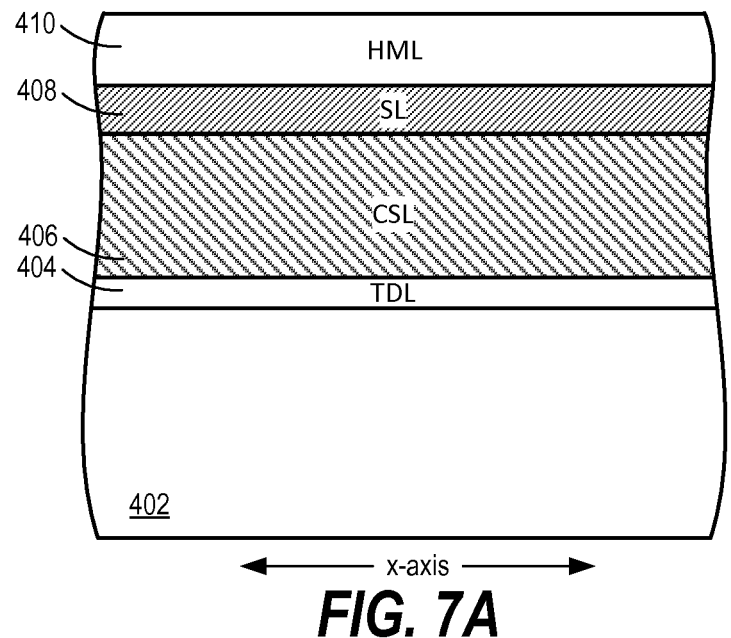
FIGS. 7A-7T are orthogonal cross-sectional views through a portion of a non-volatile memory array that may be fabricated according to the method of FIG. 6 in one embodiment.

FIG. 6 is a flowchart describing a method of fabricating non-volatile storage with air gap isolation in accordance with one embodiment. FIGS. 7A-7T are orthogonal cross-sectional views of one example of a non-volatile memory array that can be fabricated according to the method in FIG. 6. Processing in the row or word line direction is depicted, including the formation of active areas in the substrate, separated by isolation regions. Air gaps are formed in the bit line or column direction as part of the isolation regions. A catalyst selective dielectric growth process is used to form capping strips at upper portions of a trench etched in the substrate in order to seal the trenches before further processing. The described embodiment is exemplary only and its precise form should not be taken as limiting the disclosure. The exact materials, dimensions and order of processing may vary according to the requirements of a given implementation. It is noted that the dimensions of the various features are not necessarily drawn to scale.

At step 502, initial processing is performed to prepare a substrate for memory fabrication. One or more wells (e.g., a triple well) are typically formed in the substrate prior to forming a layer stack over the substrate surface. For example, a p-type substrate may be used. Within the p-type substrate, an n-type well may be created and within the n-type well a p-type well may be created. Various units of a memory array may be formed within individual p-type wells. The well(s) can be implanted and annealed to dope the substrate. A zero layer formation step may also precede well formation.

At step 504, an initial layer stack is formed over the substrate surface. FIG. 7A is a cross-sectional view along the x-axis in the row or word line direction of a memory array 400 showing a layer stack 401 formed over the surface of a substrate 402. In this example, layer stack 401 includes a tunnel dielectric layer (TDL) 404, a charge storage layer (CSL) 406, a sacrificial layer (SL) 408 and one or more hard masking layer(s) (HML) 410. It is noted that a layer may be said to be over another layer when one or more layers are between the two layers as well as when the two layers are in direct contact.

The tunnel dielectric layer 404 is a thin layer of oxide (e.g., $SiO_2$) grown by thermal oxidation in one embodiment, although different materials and processes can be used. Chemical vapor deposition (CVD) processes, metal organic CVD processes, physical vapor deposition (PVD) processes, atomic layer deposition (ALD) processes, or other suitable techniques can be used to form the various layers described herein except where otherwise noted. In one example, the tunnel oxide layer is formed to a thickness of about 8 nanometers (nm). Although not shown, one or more high voltage gate dielectric regions may be formed at a peripheral circuitry region before or after forming the tunnel dielectric layer. The high voltage gate dielectric regions may be formed with a larger thickness (e.g., 30-40 nm) than the tunnel dielectric layer.

The charge storage layer is a polysilicon floating gate layer in one embodiment. The vertical dimension (with respect to the substrate surface) or thickness of the charge storage layer can vary by embodiment. In one example, the charge storage layer has a vertical dimension of 30 nm. In another example, the charge storage layer has a vertical dimension of 70-80 nm.

Dielectric charge storage materials, metal and non-metal nanostructures (e.g., carbon) can also be used for the layer of charge storage material. In one embodiment, the charge storage layer is a metal layer forming a charge-trap type floating gate layer. A thin metal charge-trap type floating gate can reduce concerns with ballistic charge programming issues that may arise with conventional polysilicon floating gates. In one embodiment, a metal floating gate layer is formed to a thickness of between 10 nm and 20 nm. In another embodiment, metal thicknesses greater than 20 nm or less than 10 nm are used. In one embodiment, the metal floating gate layer is a high work function metal. In one example, the metal is ruthenium. Other metals such as titanium, tungsten, tantalum, nickel, cobalt, etc., and their alloys (e.g., TiN, WN, TaN, NiSi, CoSi, WSix) can be used.

The sacrificial layer 408 is a layer of silicon nitride (SiN) in one embodiment although other materials can be used. The hard masking layer(s) 412 is an oxide or combination of oxide and nitride in one embodiment although other materials can be used. In one example, layer 412 is tetraethyl orthosilicate (TEOS).

The layer stack is patterned at step 506. The first pattern applied at step 506 corresponds to intended columns of the memory array and may be repetitive in the row or direction of the x-axis. The pattern also corresponds to intended active areas of the substrate which will be separated by isolation regions. In one embodiment, conventional photolithography using photoresist is used to pattern the hard mask layer 410 into strips elongated in the direction of the y-axis with spaces between strips adjacent in the direction of the x-axis. The hard mask layer may be patterned into a first sub-pattern at the memory array area and one or more different sub-patterns at the peripheral circuitry areas to define active areas in the substrate with different dimensions in the direction of the x-axis. Spacer-assisted patterning, nano-imprint patterning, and other patterning techniques can also be used to form strips of the hard mask layer at reduced features sizes. The pattern, repetitive in the second or row direction, may define a first direction of etching to form columns of the targeted memory array.

After forming the pattern, the layer stack is etched at step 508. The layer stack is etched using the first pattern formed in step 506. The layer stack is etched into layer stack columns. The term layer stack is used to refer to the layers formed over the substrate throughout processing. Thus, layer stack 401 may refer to the collection of layer stack columns that result from etching the initial layer stack.

Figure 7B:
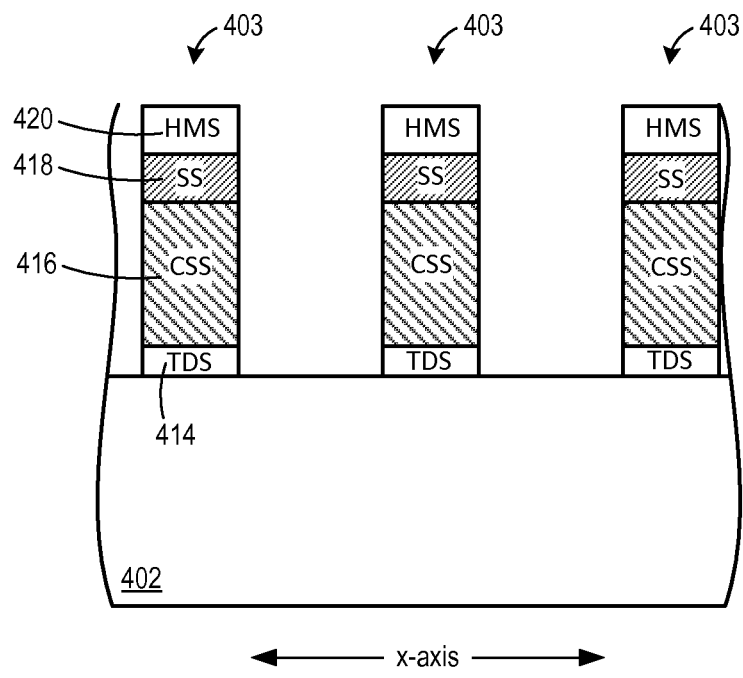

FIG. 7B depicts the memory array after etching in one example. Etching forms layer stack columns 403 that are elongated in the direction of the y-axis with spaces therebetween in the direction of the x-axis. Each layer stack column 403 includes a tunnel dielectric strip (TDS) 414, a charge storage strip (CSS) 416, a sacrificial strip (SS) 418 and a hard masking strip (HMS) 420. In one embodiment, reactive ion etching is used with various combinational etch chemistries to etch the different layers, however, any suitable etch process(es) can be used.

At step 510, a first catalyst layer and optional protective liner are formed along the vertical sidewalls of the layer stack columns. The catalyst layer is a material having properties that promote the growth and/or adherence of a capping layer applied in subsequent processing steps. For example, the catalyst can be a seed material upon which the capping layer will grow during subsequent deposition cycles. The catalyst can be a material upon which an oxide or nitride will grow and adhere in a process that will not form the oxide or nitride at all or at as fast a rate as on a silicon material such as the substrate. The optional protective liner can be formed along the vertical sidewalls of the catalyst layer to protect it during subsequent process steps.

Figure 7C:
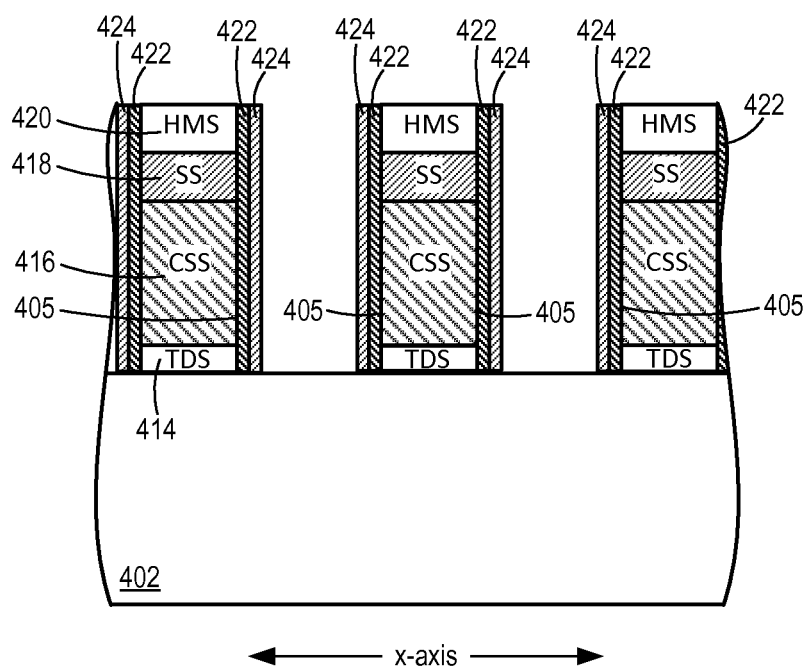

FIG. 7C depicts the results of step 510 after forming catalyst layer 422 and protective liner 424. The catalyst layer is formed along the vertical sidewalls 405 of the layer stack columns 403. In turn, the protective liner 424 is formed along the vertical sidewalls of the catalyst layer. In one example, the catalyst material is an oxide such as aluminum oxide (AlOx) having a thickness of about 0.5 nm. The catalyst layer can be deposited and then etched back to leave the individual portions along the column sidewalls.

In one embodiment, the catalyst layer is formed by introducing a catalyst or catalyst precursor, followed by a silicon-containing precursor (gas) for growth of a conformal catalyst layer. The catalyst or catalyst precursor may include aluminum based precursors such as trimethylaluminum (Al(CH3)3), hexakis (dimethylamino) aluminum (Al2(N(CH3)2)6) or trimethyl aluminum (AL(CH3)3), triethylaluminum (Al (CH2CH3)3) or aluminum trichloride (AlCl3). Other precursors can be used. Silicon containing precursors may include, but are not limited to, silanols and silanediols, such as alkoxysilanols, alkyl alkoxysilanols, alkyl alkoxysilanediols and alkoxysilanediols. Other precursors can include tris(tert-butoxy)silanol(((C.sub.4H.sub.9O).sub.3SiOH), tris(tert-pentoxy)silanok(C.sub.5H.sub.11O).sub.3SiOH), di(tert-butoxy)silandiol (((C.sub.4H.sub.9O).sub.2Si(OH).sub.2) and methyl di(tert-pentoxy)silanol. The precursor exposures may be repeated any number of times to form a catalyst layer of a desired thickness.

Figure 7D:
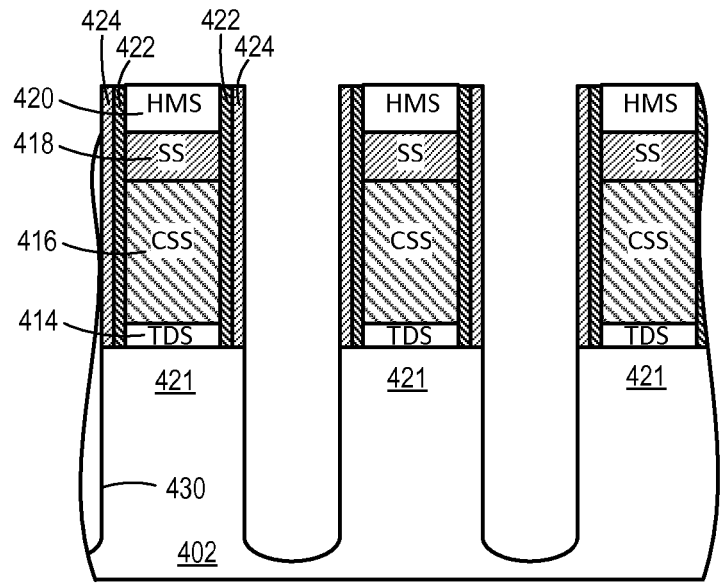

At step 512, the substrate is etched to form isolation regions. The substrate is divided into active areas that underlie the layer stack columns and isolation regions or trenches that separate the active areas. FIG. 7D depicts the memory array after etching to form isolation regions 430. Isolation regions 430 are separated by active areas 421 under each layer stack column 403. In one example, the depth of the isolation regions in the substrate is 200 nm. Various depth can be used, for example, ranging from 180-220 nm in one embodiment.

Figure 7E:
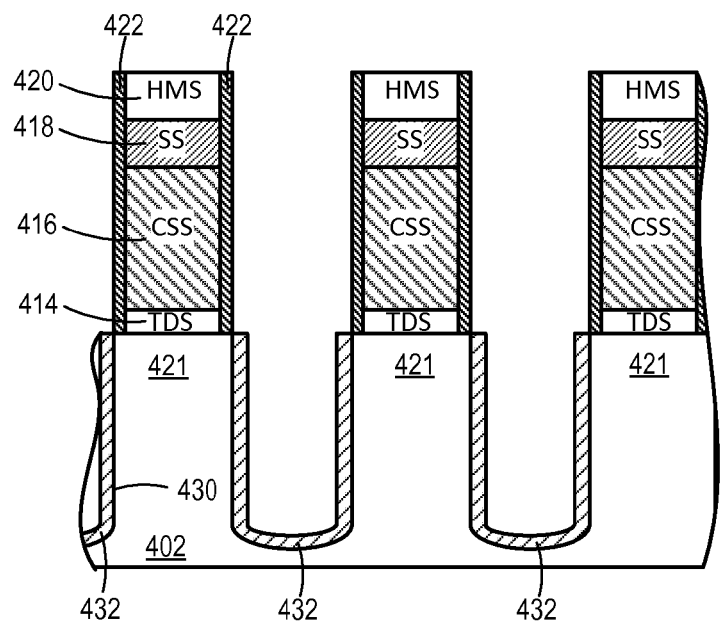

At step 512, a dielectric liner is formed along the exposed surfaces of the isolation regions in the substrate. The liner covers the sidewalls and lower surface of each isolation region. In another embodiment, no dielectric liner is formed in the isolation regions. FIG. 7E depicts the memory array after forming a dielectric liner 432 in each trench in one example. In one embodiment, the liner is a thermally grown oxide such as can be formed using direct partial oxidation. An oxide liner 432 will grow on the exposed surfaces of the silicon substrate but not catalyst layer 422 or protective layer 424. Other processes and materials (e.g., high temperature oxide (HTO)) may be used in other implementations, for example by selectively depositing a liner in the isolation regions. In one example, the liner has a thickness of 4 nm or less. In other examples, larger thicknesses may be used. As shown in FIG. 7E, etching regions 430 and forming liner 432 may result in removal of the protective liner 432. In other examples the protective liner may remain.

At step 516, capping strips are formed using the first catalyst layer. Each capping strip overlies an isolation region in the substrate to provide a solid upper surface or cap that defines an air gap in the corresponding isolation region. Specifically, the lower surface of each strip defines an upper endpoint of an air gap in the isolation region. The lower surface of each strip at least partially overlies air in the corresponding isolation region. Each air gap has a lower endpoint defined by an upper surface of the dielectric liner at the bottom of the corresponding isolation region.

Figure 7F:
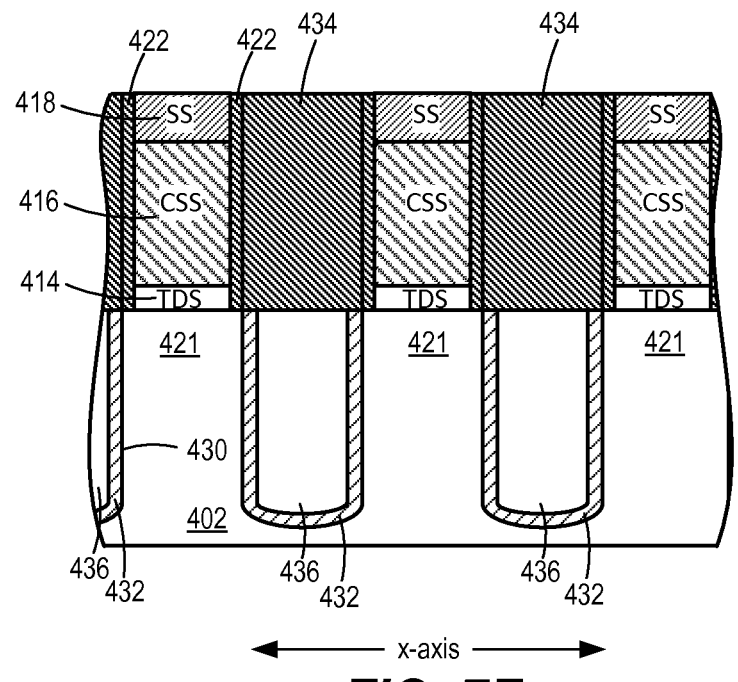

FIG. 7F depicts the results of step 516 in one embodiment. Capping strips 434 overlie isolation regions 430 and define air gaps 436 in each isolation region. The air gaps are elongated in the y-direction. They extend in the y-direction to provide electrical isolation between elements of adjacent layer stack columns 403 and/or adjacent active areas 421 of the substrate. The vertical dimension (with respect to substrate surface) and row dimension (along x-axis) of the air gaps can vary to meet the particular requirements (e.g., suitable isolation parameters) of a given implementation. The air gaps may be formed in a portion of the isolation regions and a portion of the spaces between adjacent layer stack columns or only within the isolation regions as shown in FIG. 7F.

In FIG. 7F, an example is depicted where a layer that selectively grows on the catalyst layer 422, but not the liner 432 in the isolation regions 430 is used. An oxide that selectively grows on an aluminum oxide (AlOx) catalyst layer is used in one example. Strips 434 can be strips of high density plasma (HDP) oxide. A cyclical deposition process can be used to selectively deposit the material for strips 434 along the vertical sidewalls of layer 422. A pulsed layer deposition (PLD) process is used in one embodiment using catalyst 422 as a seed layer. Various precursors can cyclically be deposited to enable growth of oxide capping material 434 along catalyst 422. In one embodiment, a silicon-oxide precursor gas is introduced in a pulsed laser deposition process to form strips 434. In another embodiment, a CVD process is used. In one example, a process as described in U.S. Pat. No. 7,863,190, incorporated by reference herein in its entirety, can be used to selectively deposit oxide strips 434.

As shown, material 434 does not form on liner 432 within the isolation regions. In this example, where the catalyst 422 extends fully to the level of the substrate surface, the resulting capping strips have a lower surface at a level of the substrate surface. Although shown extending in a straight line between columns, the lower surface of the capping strips may have a concave or convex shape such that the air gap 436 upper endpoint is below the substrate surface or above the substrate surface. In other examples, some amount of the capping material may accumulate within the isolation regions. Nevertheless, because selective growth on the catalyst layer is promoted, the accumulation in the isolation regions will be at a lower rate than on the catalyst layer. Accordingly, the material meets above the isolation regions before filling the isolation regions such that at least a portion of each capping strip overlies air in its corresponding isolation region. This may be referred to as selectively growing the capping strips along the catalyst layer or charge storage regions, for example.

FIG. 7F further depicts the results of a chemical mechanical polishing or an etch back process to remove hard masking layer 420 and planarize strips 418 and 434. A planar upper surface is formed from interleaving strips of sacrificial strips 418 and capping strips 434.

Figure 7G:
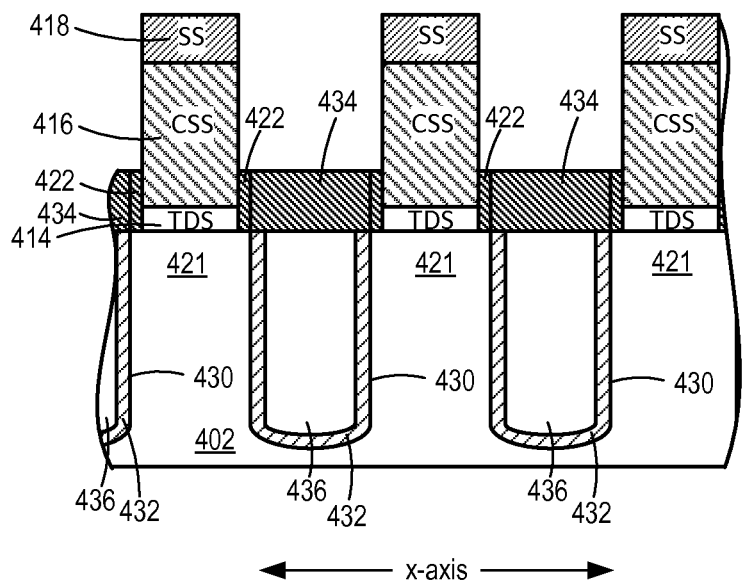

At step 518, the capping strips are recessed within the gaps between adjacent layer stack columns. FIG. 7G depicts the results of step 518 in one example. The upper surface of each capping strip 434 is recessed below the upper surface of each charge storage strip 416. The catalyst layer is recessed as well. The amount of recess may vary by embodiment. In one example, the distance between the upper surface of capping strips 434 and the level of the upper surface of the charge storage strips is 70-80 nm, although different distances may be used. In one embodiment, reactive ion etching selective to oxide 434 is used to etch back the oxide without etching or substantially etching sacrificial strips 418 or charge storage strips 416. Any remaining portions of sacrificial strips 418 can be removed as shown in FIG. 7H.

At step 520, an intermediate dielectric layer is formed. The intermediate dielectric layer is a triple layer of oxide, nitride and oxide (ONO) in one embodiment having a thickness of about 9-12 nm, although various materials and thicknesses may be used. In one embodiment, a high-K (dielectric constant) material is used for the intermediate dielectric to reduce or eliminate charge transfer through the intermediate layer while providing enhanced control gate to floating gate coupling.

At step 522, a control gate layer is formed over the layer stack upper surface. In one embodiment, the control gate layer is polysilicon. The polysilicon can be doped in-situ or after formation. In another embodiment, the control gate layer is formed at least partially of a metal. In one example, the control gate layer has a lower portion that is formed from polysilicon and an upper portion that is formed from metal. A barrier layer may be formed between the polysilicon and the metal, to prevent silicidation. The control gate layer can include, by way of example (from layers to upper layers as move away from substrate surface): a barrier metal and metal; a barrier metal, polysilicon and silicide; a barrier metal and silicide (e.g., FUSI); polysilicon, a barrier metal and metal. Barrier metals may include, but are not limited to, Ti, TiN, WN and TaN or a combination with related alloys that have a suitable electron work function. Metals may include, but are not limited to, W, WSix or other similar low resistivity metals. Silicides may include, but are not limited to, NiSi, CoSi. In one example, the control gate layer is polysilicon that is subjected to silicidation after being etched into control gates so as to form a partially or fully-silicided control gate structures. The control gate layer may be formed by chemical vapor deposition (CVD), atomic layer deposition (ALD), plating, or another technique.

Figure 7H:
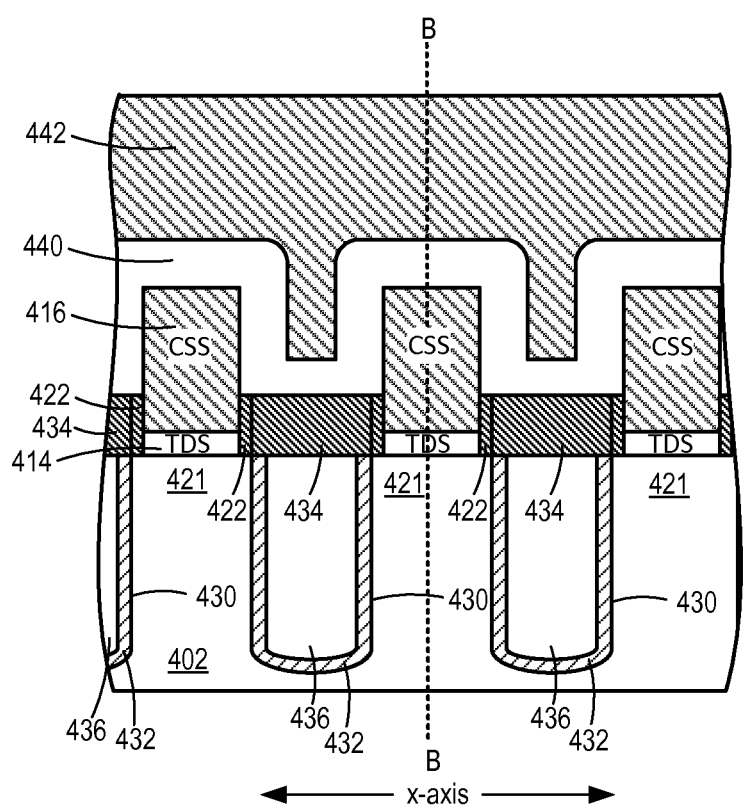

FIG. 7H depicts the results of steps 520 and 522 in one embodiment. Intermediate dielectric layer 440 is formed over the substrate. A conformal deposition process is used in this example so that the intermediate dielectric layer is formed to a substantially even thickness along the sidewalls and upper surface of each charge storage strip 416 and capping strip 434. Control gate layer 442 is formed over the intermediate dielectric layer. The control gate layer is a layer of polysilicon in one example, formed to a depth of about 100 nm, although various materials (e.g., metal) can be used and formed to different thicknesses. In another embodiment, the sacrificial strips and caps can be polished or etched back to remove the sacrificial strips and create a planar surface without recessing the caps. In this case, a flat type of cell structure can be formed.

At step 524, a second pattern is applied over the layer stack. The second pattern is formed for etching orthogonal to the direction of etching using the first pattern. The second pattern may include strips of hard masking material and/or photoresist, or other suitable mask, that are elongated in the row direction along the x-axis with a spacing between strips in the column direction along the y-axis. The pattern can be used to define the gate length for the charge storage region of each memory cell.

Figure 7I:
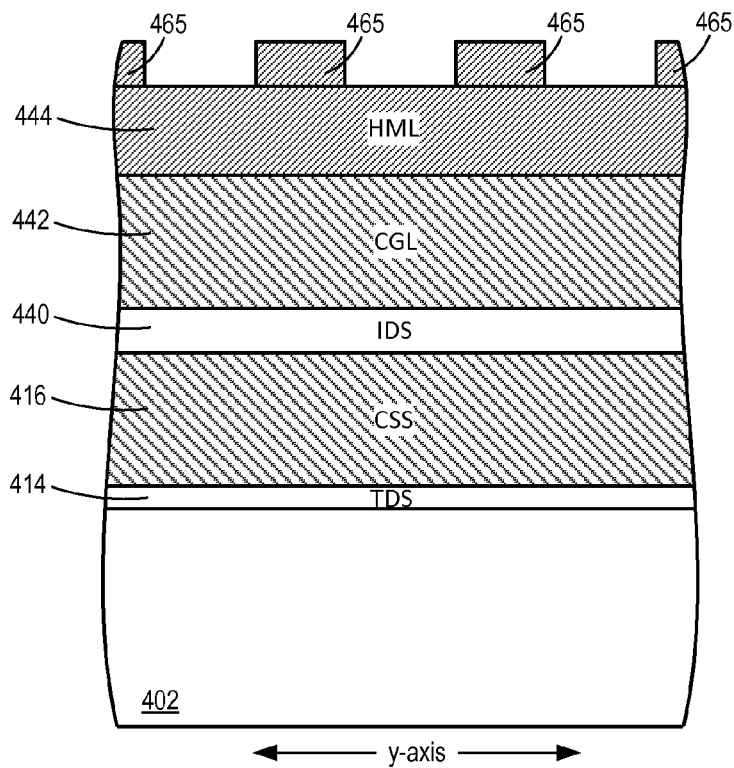

FIG. 7I is a cross-sectional view taken along line B-B of FIG. 7H, depicting the device in cross-section in the direction of the y-axis or bit line direction. FIG. 7I depicts the results of step 524 after forming the second pattern. Over the control gate layer 442 is formed one or more hard masking layers 444. Strips 465 of photoresist or another patterning agent are applied. The strips correspond to intended column dimensions for the control gates and charge storage regions. Etching according to the second pattern will be used to define the gate length of the charge storage regions extending in the column or bit line direction.

At step 526, the control gate layer is etched into individual control gates elongated in the row direction over the intermediate dielectric layer. Etching proceeds through the control gate layer and stops before etching the intermediate dielectric layer. Some portion of the intermediate dielectric layer may be etched but etching ends before completely etching the intermediate dielectric layer.

Figure 7J:
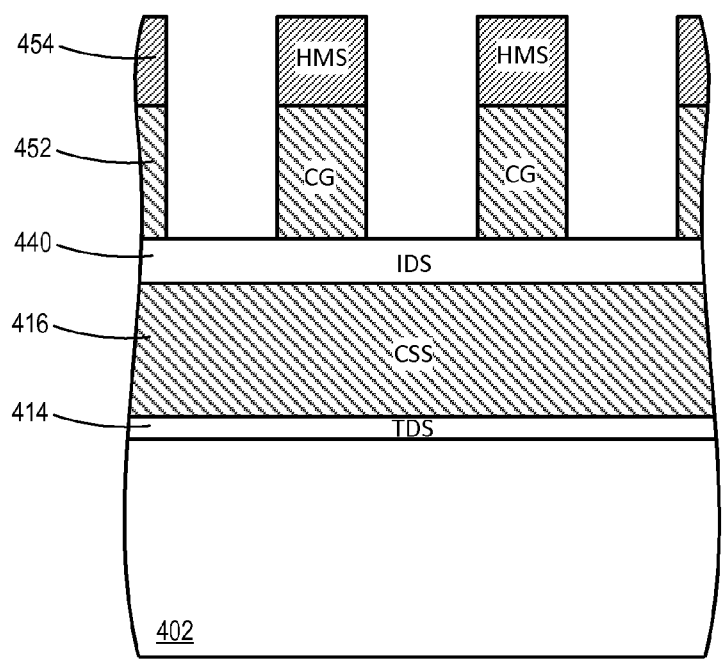

FIG. 7J depicts the results of step 526 in one embodiment. Hard masking layer 444 is etched into hard masking strips 454 and control gate layer 442 is etched into control gates 452. In one embodiment, the control gates 452 form word lines for the memory array. In another embodiment, word lines can be formed and connected to the control gates.

At step 528, a second catalyst layer is formed on the vertical sidewalls of the control gates and optionally, on the sidewalls of the hard mask strips 454. As described with respect to the first catalyst layer, the second catalyst layer enables or promotes the growth and/or adherence of a subsequently formed layer, in this case a temporary capping layer described below. An optional protective liner can be formed along the sidewalls of the second catalyst layer as well.

Figure 7K:
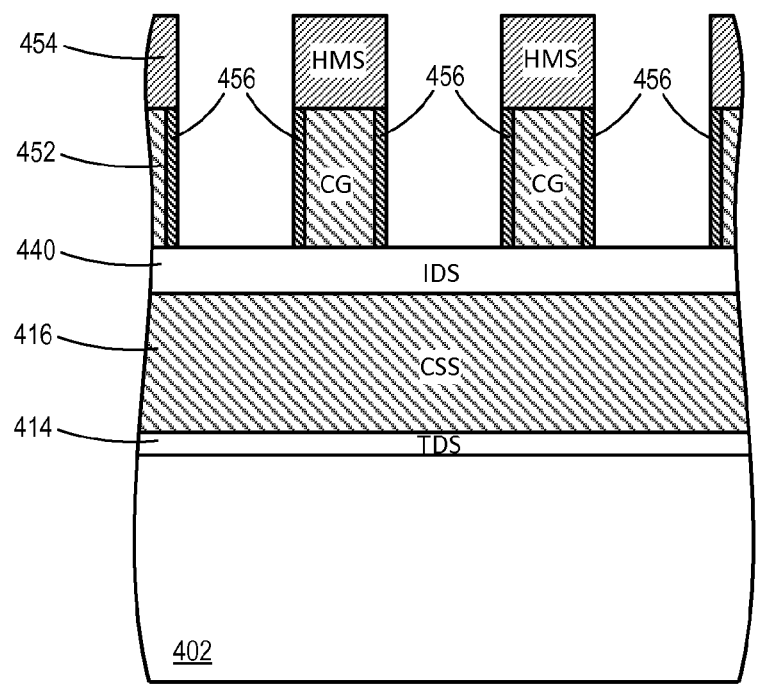

FIG. 7K depicts the results of step 528 in one embodiment. Second catalyst layer 456 is formed along the vertical sidewalls 407 of the control gates 452 using a selective growth process to only form the catalyst on the control gates. In one example, the catalyst is an oxide such as aluminum oxide (AlOx) having a thickness of about 0.5 nm but other materials and thicknesses may be used as described above. The catalyst layer can be deposited and then etched back to leave the individual portions along the column sidewalls as shown, while exposing the intermediate dielectric strips 440 between adjacent control gates.

At step 530, the layer stack is again etched using the second pattern. Etching continues through the intermediate dielectric strips 440, charge storage strips 416 and optionally some or all of the tunnel dielectric strips 414. Reactive ion or another suitable etch process may be used using one or more etch chemistries may be applied to etch through the various layers of the stack.

Figure 7L:
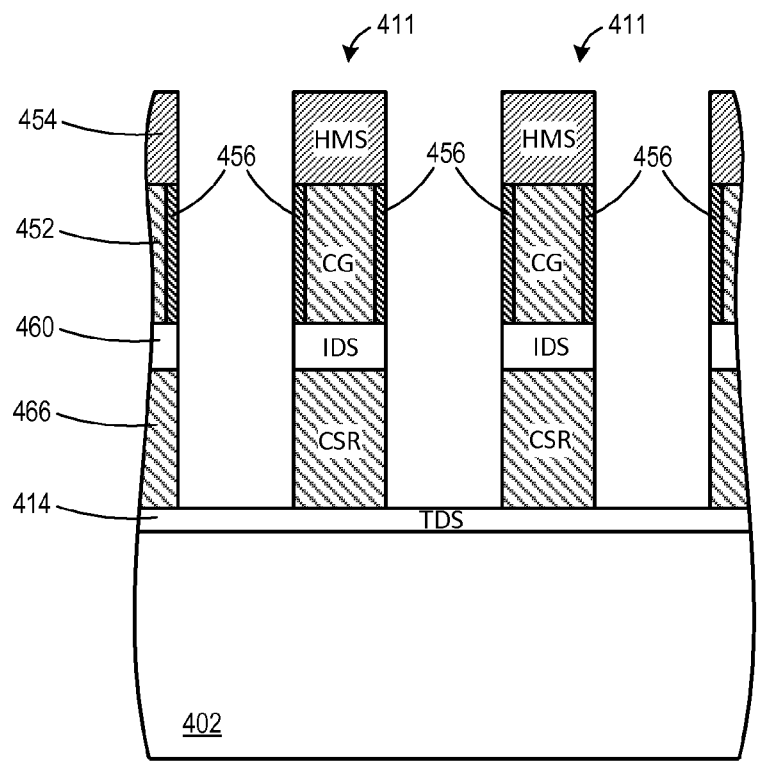

FIG. 7L depicts the results of step 530 in one embodiment. Etching forms layer stack rows 411. Layer 440 is etched into intermediate dielectric strips (IDS) 460 and the charge storage strips 416 are each etched into a column of charge storage regions (CSR) 466. Etching in the row direction will also etch capping strips 434 into individual caps (not shown), depending on the depth of the etch. After etching the layer stack into rows, an implant process can be performed to create n+ source/drain regions. In one embodiment, the n+ source/drain regions are created by implanting n-type dopants such as arsenic or phosphorus into the p-well at locations adjacent to the substrate channel regions underlying the charge storage regions.

At step 532, temporary caps are formed between the control gates. The temporary caps are an oxide such as an HDP oxide formed using PLD in one example. In one embodiment, the material for the caps is deposited, directly adhering to the catalyst layer 456. In another embodiment, one or more precursors in the PLD process react with the catalyst layer to grow the cap material.

Figure 7M:
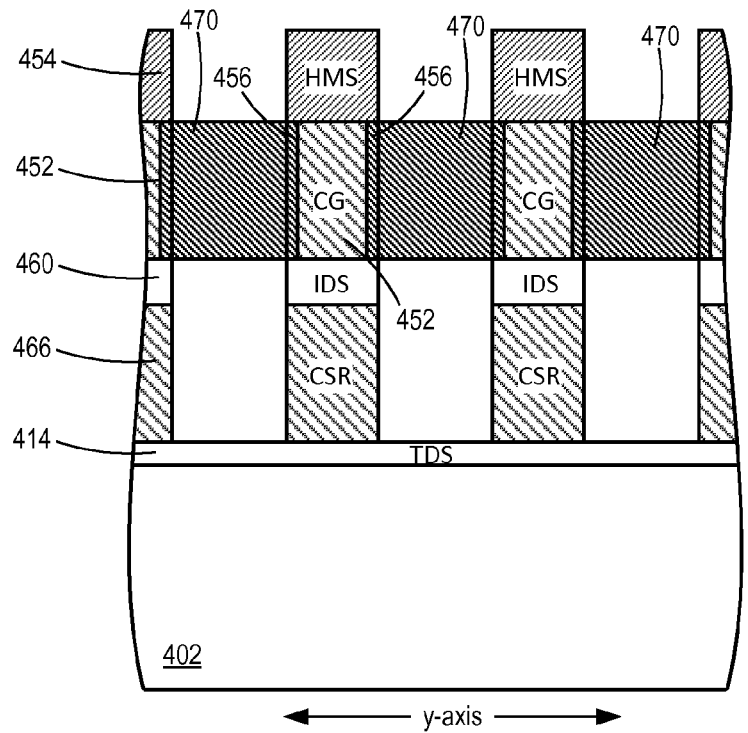

FIG. 7M depicts the results of step 532 in one embodiment. Temporary caps 470 are formed between control gates 452 extending vertically along the length of the catalyst layer 456. The caps fully extend between adjacent control gates in the column direction.

Figure 7N:
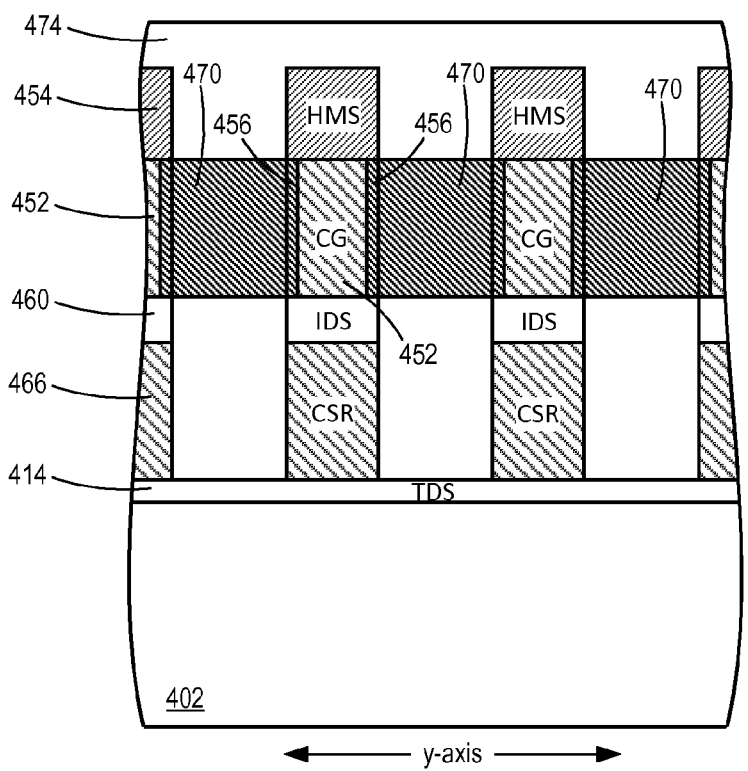
Figure 7O:
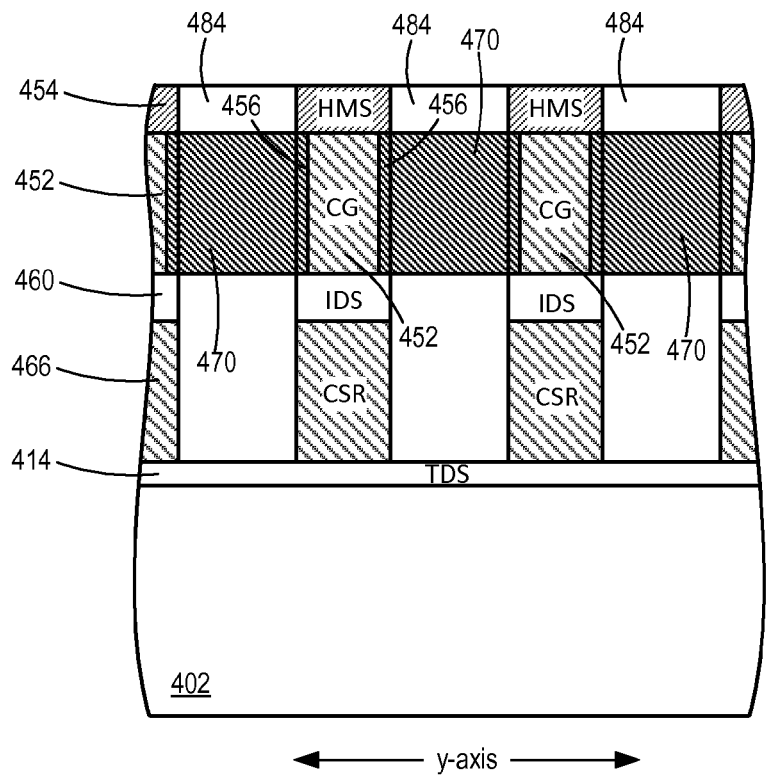

FIG. 7N depicts the formation of an optional spacer dielectric 474. The spacer dielectric is formed over the upper surfaces of the caps 470 between hard mask strips 454. The spacer dielectric, an oxide in one embodiment, can be deposited to overlie the caps and hard mask strips 454 as shown. After deposition, an etch back or polish process can be used to remove excess spacer material and create a planar upper surface for the layer stack as shown in FIG. 7O. Etching oxide 474 forms oxide spacers 484.

Figure 7P:
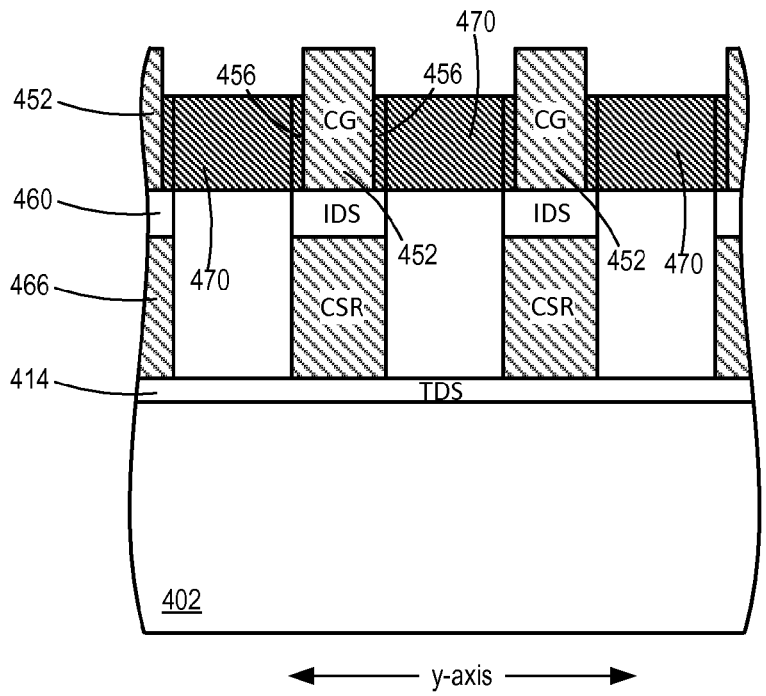

At step 534, the temporary caps are recessed to below the level of the upper surface of the control gates. FIG. 7P depicts the results of step 534 in one embodiment. Using the hard mask strips, the oxides spacers 484 and temporary caps can be etched to recess the caps below the control gates. This process exposes an upper portion of each control gate to enable subsequent silicidation.

At step 536, the control gates are silicided. Various silicides can be formed at step 538. For example, metal-Si alloys such as NiSi, CoSi2, TiSi2 can be formed. In one embodiment, a fully-silicided (FUSI) control gate is formed. A metal can be deposited over the exposed surfaces of the control gates, followed by a rapid thermal annealing process to create the silicide. The deposited metal will react with the exposed polysilicon transforming the control gates into fully silicided control gates.

Figure 7Q:
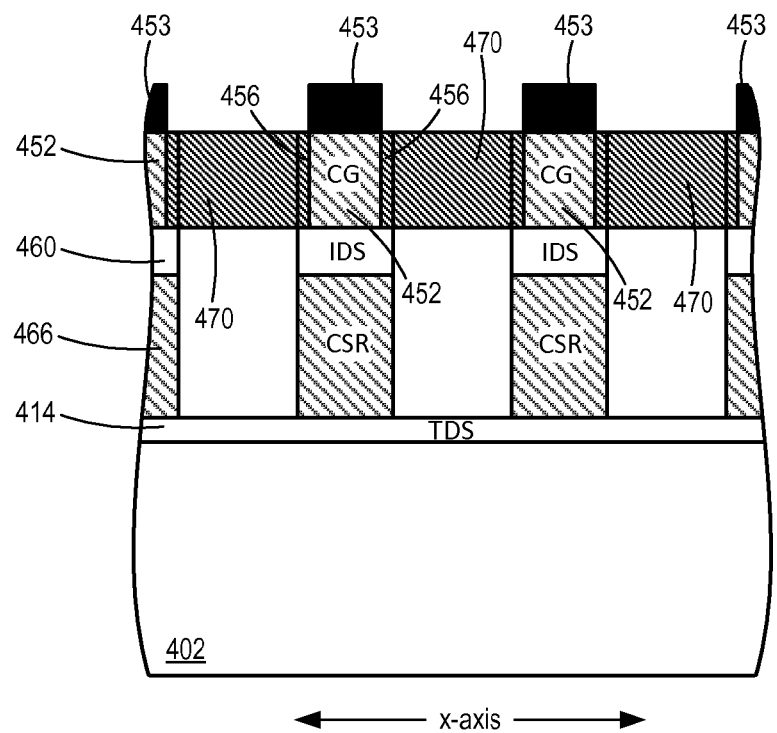
Figure 7R:
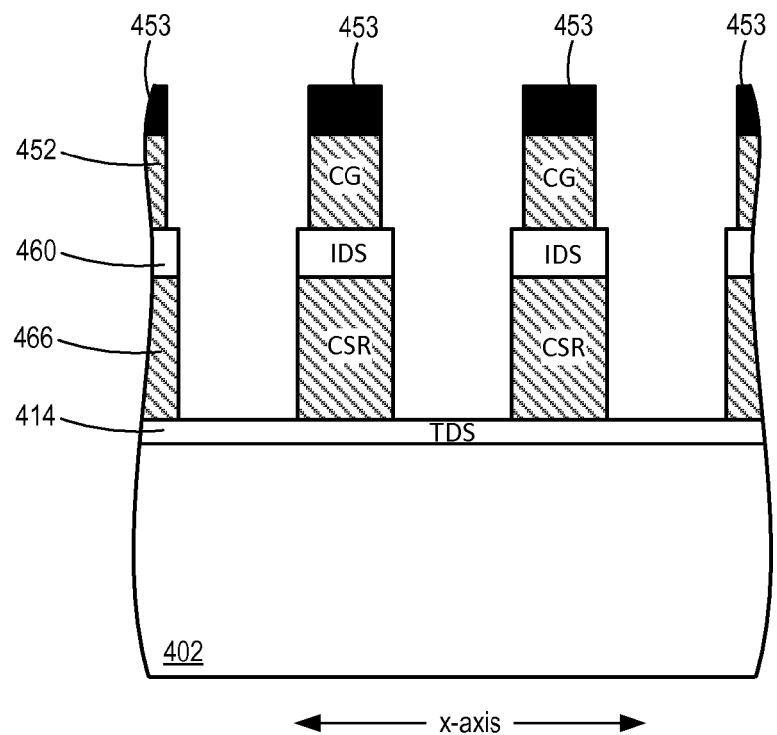

FIG. 7Q depicts the results of step 536 in one embodiment. An upper portion 453 of each control gate is transformed into silicide. At step 538, the temporary caps are removed, for example by etching selective to oxide. FIG. 7R depicts the results of step 538 in one embodiment.

Figure 7S:
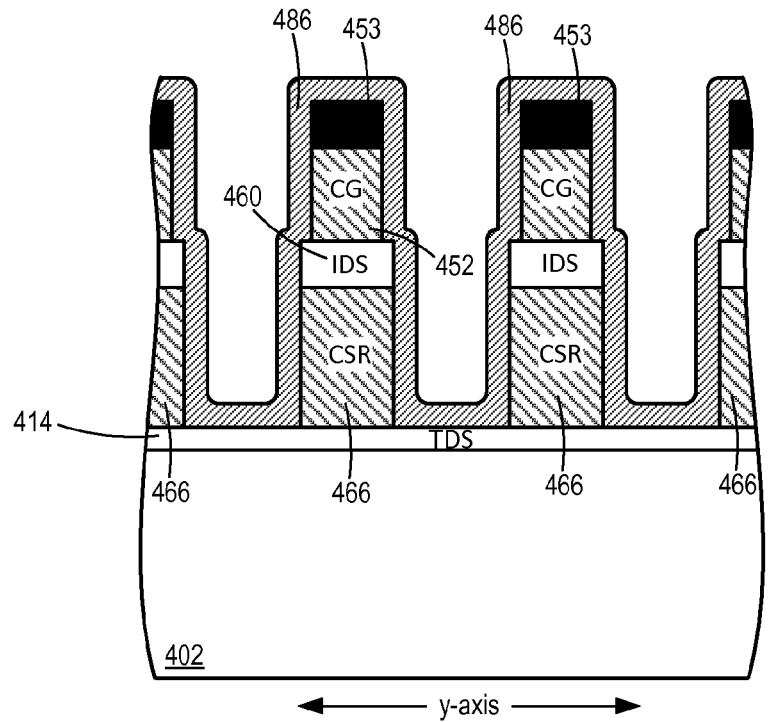
Figure 7T:
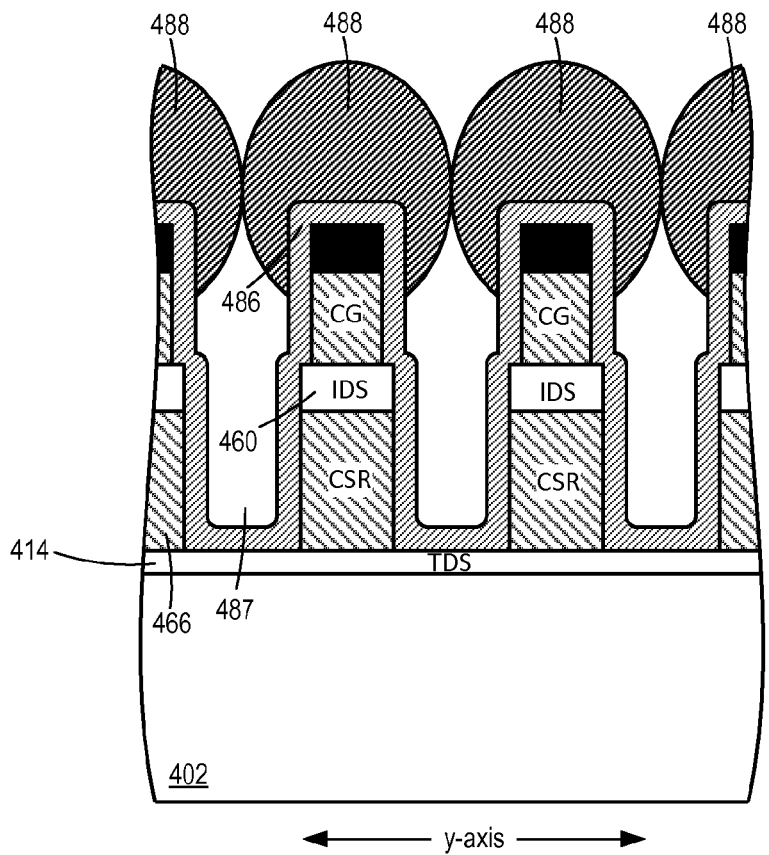

At step 540, a dielectric liner is formed along the sidewalls of the layer stack rows. FIG. 7S depicts the results of step 540 in one embodiment. Liner 484 (e.g., oxide) is formed along the sidewalls 413 of the layer stack rows, over the upper surface of the control gates 452, and over the exposed upper surface of the tunnel dielectric strips 414. The dielectric liner will also be formed along the sidewalls (not shown) of the rows (extending in the y-direction) that are exposed along the bit line air gaps 436.

At step 542, word line air gap caps are formed to define word line air gaps between the layer stack rows. The air gaps are elongated in the x-direction. They extend in the x-direction to provide electrical isolation or shielding between elements of adjacent layer stack rows. The vertical dimension and column dimension (along y-axis) of the air gaps can vary to meet the particular requirements of a given implementation. The air gaps extend in the word line direction between adjacent rows of cells. In one example, the air gaps extend from above the substrate surface (separated therefrom by tunnel dielectric layer 414 and liner 486) to above the upper surface of the control gates 452. The air gaps may be smaller or larger in other examples.

FIG. 7T depicts the results of step 544 in an example where a capping layer 488 is formed over the layer stack rows using a non-conformal deposition process. By using a non-conformal deposition process, material 488 will be deposited unequally at the upper portion of the layer stack rows. In one embodiment, layer 488 is an oxide (e.g., TEOS, PECVD silane oxide or HDP oxide) but other materials such as nitrides may used in other implementations. Material 488 quickly accumulates, meeting at a location over the spaces between rows to form air gaps 487 that are elongated in the x-direction. Material 488 extends vertically toward the substrate surface along the liner 486 on a portion of vertical sidewalls 413 of the layer stack rows. The amount of this vertical dimension will define an upper endpoint of the air gaps at a lower surface of material 486. In this example, it is seen that the air gap extends vertically beyond the level of the upper surface of the control gates. Although not shown, some portion of dielectric 488 may enter the spaces between rows. This portion of the dielectric 488 may raise the lower endpoint of the air gap. Any accumulation will be minor and only decrease the size of the air gap minimally. Although not shown, a polishing or etch back step can be applied to form individual caps from layer 488. The capping layer 488 can be polished to form plugs sealing the word line air gaps 487. A planar surface can be created for further processing steps.

It is noted that etching to form the layer stack rows as shown in FIG. 7L may etch through portions of the capping strips 434 between the layer stack rows. The temporary caps 470 formed as shown in FIG. 7N prevent the accumulate of material in the bit line air gaps during subsequent processing. Finally, the word line air gap caps formed of layer 488 thereafter provide an upper endpoint for the bit line air gaps at those exposed portions resulting from etching to form the layer stack rows. The caps, formed from layer 488, together may form the upper endpoints for the bit line air gaps. Thus, the bit line air gaps may have two different vertical dimensions corresponding to the locations. In another embodiment, strips 434 may not be etched through.

At step 546, front end processing is completed. In one example, step 546 may include interconnecting the floating gate and control gate regions of select and peripheral circuitry transistors. Peripheral gate connections can be formed using vias or contact holes, etc. to form contacts to individual gate regions or to connect multiple transistors to a common control line. The select gate transistors can have their floating gate regions shorted to the control gate regions to form a single gate structure. Array connections can also be patterned and formed. After forming contacts, etc., further backend processing to form metal layers, etc. to complete the device according to known techniques can be performed. Various backend processes can be performed to finalize fabrication of the array. For example, a passivation dielectric layer can be deposited, followed by forming metal conductive lines and vias to connect the lines with source and drain regions at the end of the memory cell strings, etc.

Figure 8A:
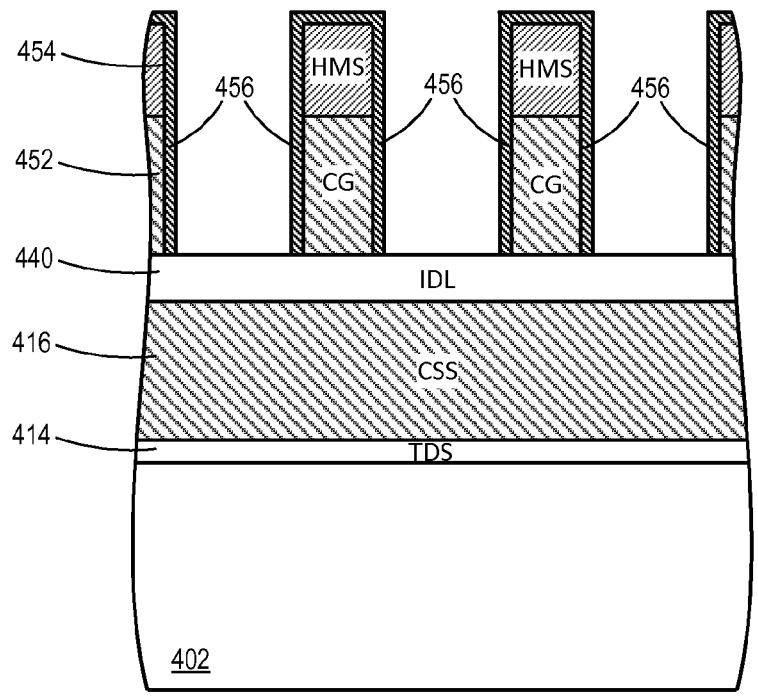
FIGS. 8A-8E are orthogonal cross-sectional views through a portion of a non-volatile memory array depicting a variation of the method of FIG. 6.
Figure 8B:
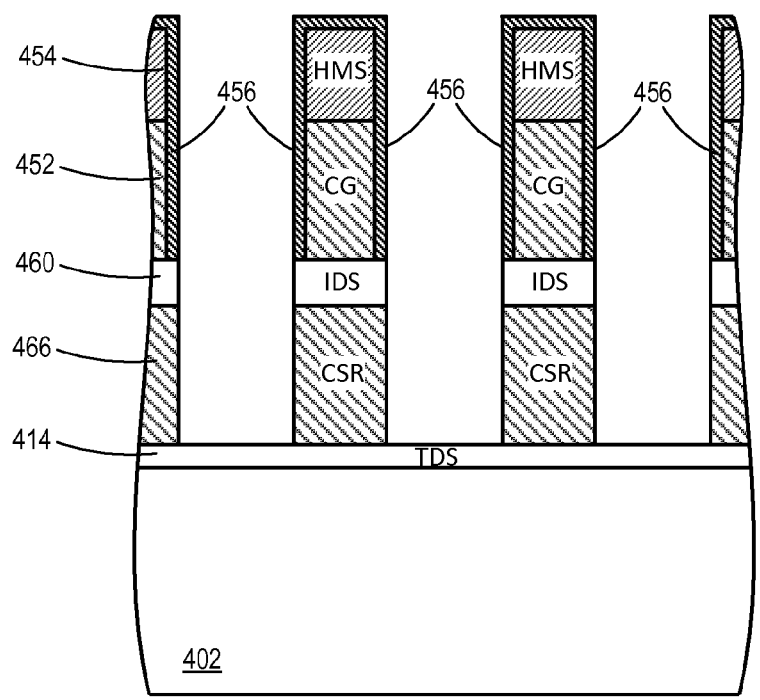
Figure 8C:
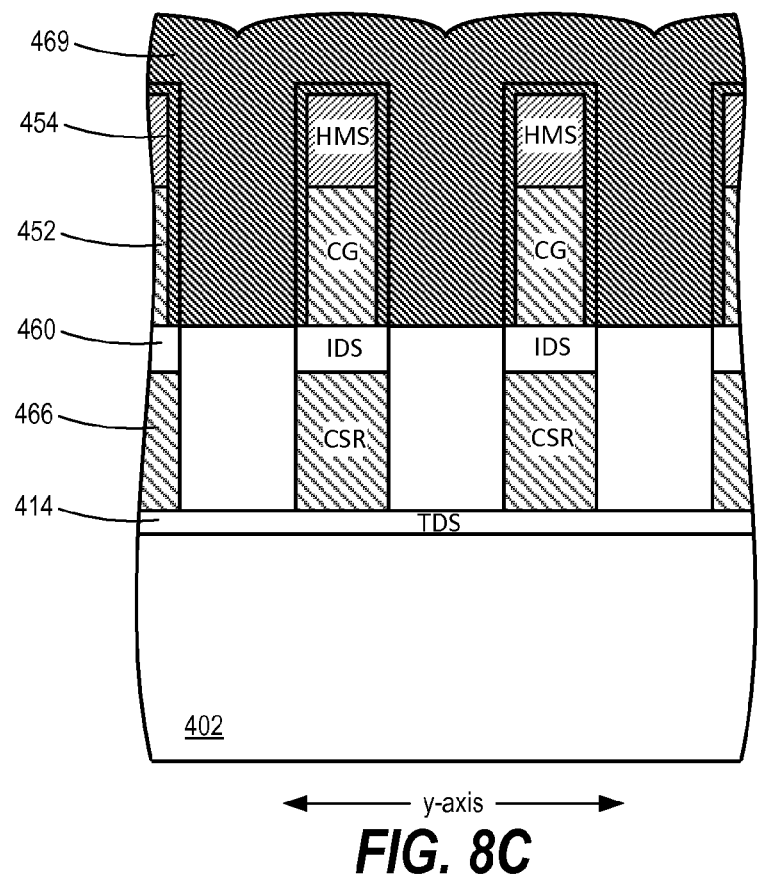

FIGS. 8A-8F are orthogonal cross-sectional views along the y-axis depicting another embodiment for forming the word line air gaps 487. FIG. 8A depicts the layer stack as shown in FIG. 7L after etching control gate layer 442 into control gates 452 and forming the second catalyst layer 456. In this example, the second catalyst layer is formed fully along the sidewalls and upper surfaces of the sacrificial strips 454 as well as the sidewalls of control gates 452. After forming the catalyst, the intermediate dielectric strips 440 and charge storage strips 416 are etched as shown in FIG. 8B. A temporary capping layer 469 for the capping strips 470 is formed as shown in FIG. 8C. As earlier described, a PLD process may be used to selectively grow the capping layer on the second catalyst layer 456 The capping material extends fully in the column direction between adjacent control gates and sacrificial strips 454.

Figure 8D:
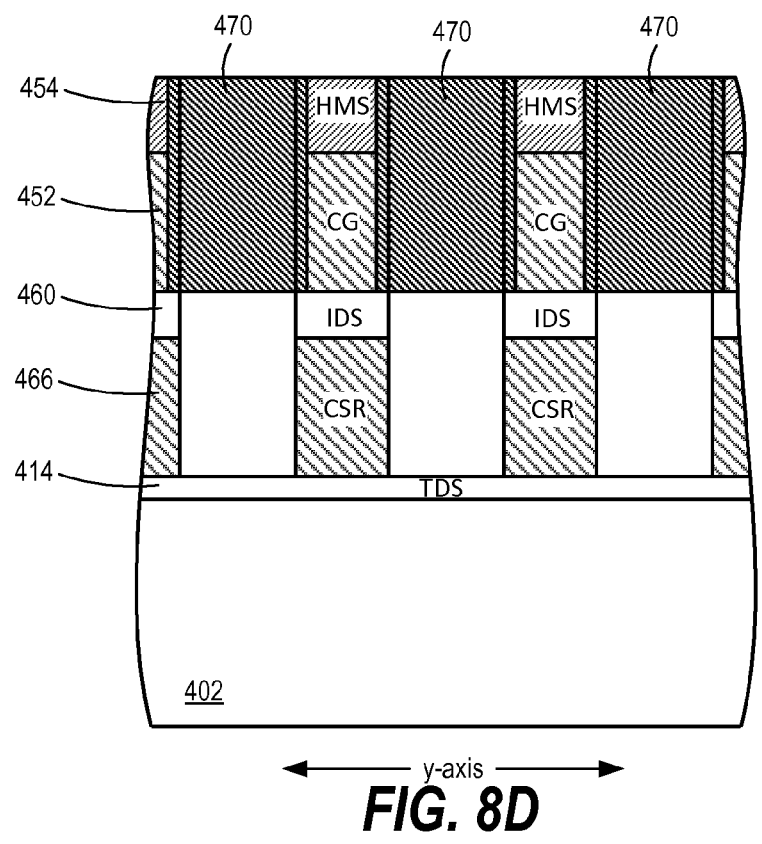
Figure 8E:
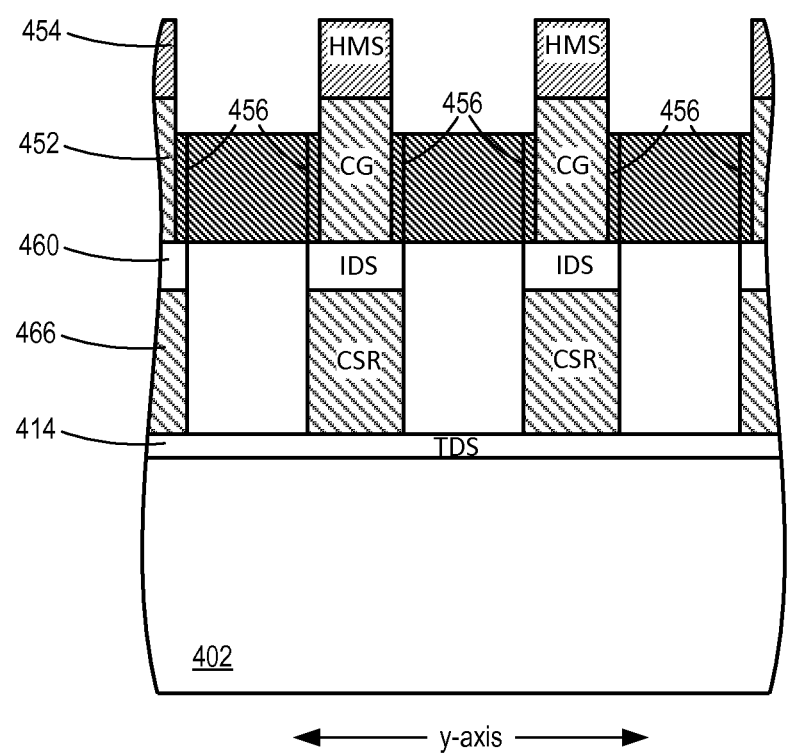

FIG. 8D depicts the layer stack after polishing or etching back to form a planar upper surface. Etching back the capping material forms the individual caps 470 elongated in the row direction. The individual caps are then recessed below the level of the control gates as shown in FIG. 8E. Sacrificial strips 454 serve as a mask to etch back the oxide and catalyst layers while protecting the control gates. After recessing the caps, the sacrificial strips can be removed. Processing can then continue as shown in FIG. 7R by siliciding the exposed control gates.

In one embodiment where silicided control gates are not used, word line air gaps can be formed by etching the layer stack into rows 411 as shown in FIG. 7L without forming a catalyst layer. Then, liner 486 can be formed as shown in FIG. 7S, followed by forming the capping material as shown in FIG. 7T.

Figure 9:
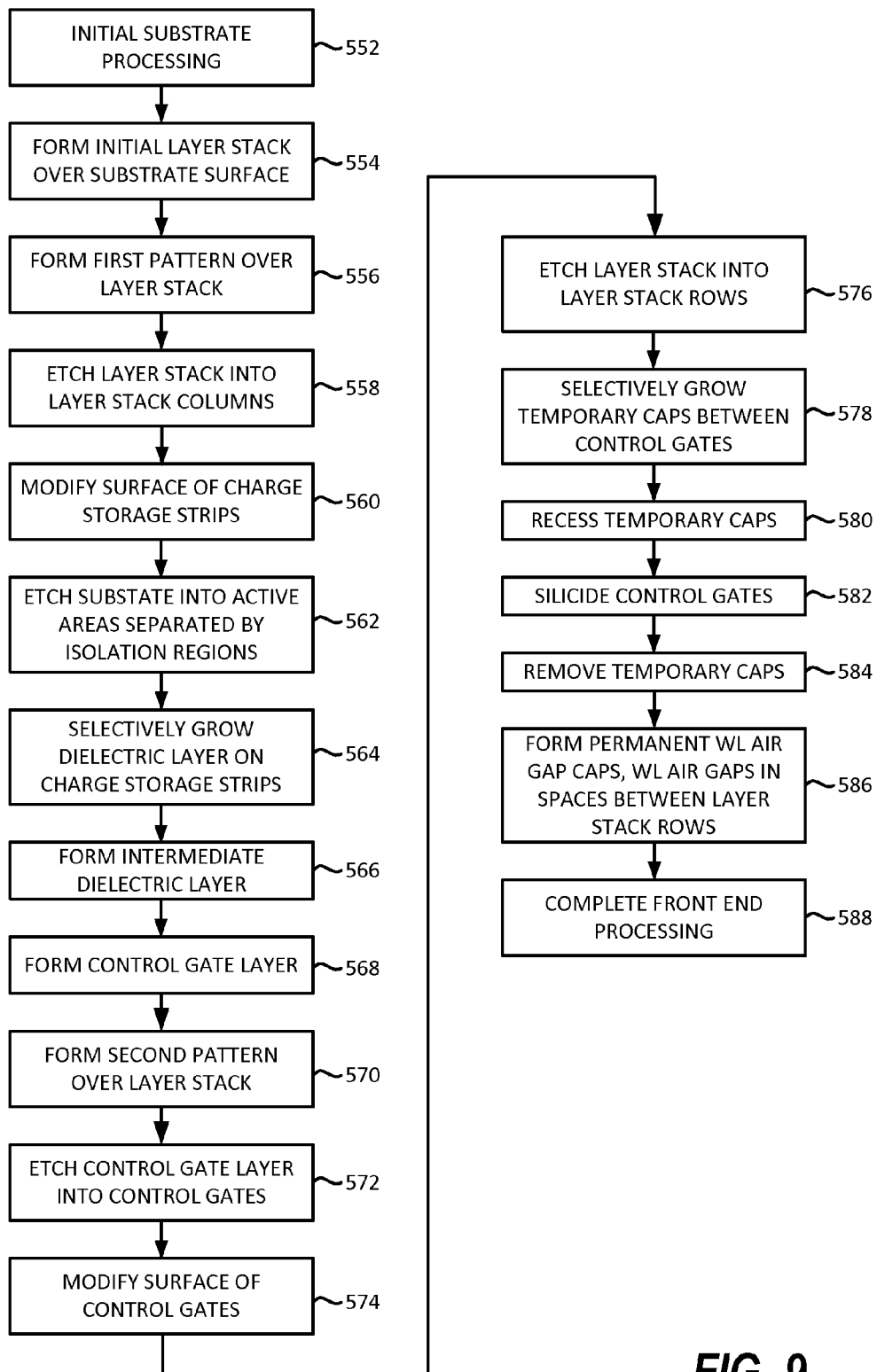
FIG. 9 is a flowchart describing a method of forming bit line and word line air gaps in accordance with one embodiment.
Figure 10A:
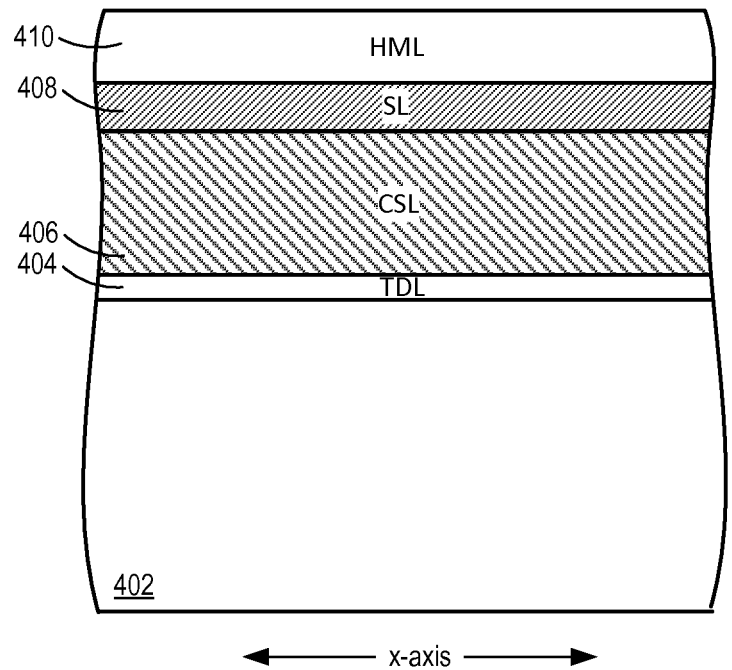
FIGS. 10A-10O are orthogonal cross-sectional views of a portion of a non-volatile memory array that may be fabricated according to the method of FIG. 9 in one embodiment.
Figure 10B:
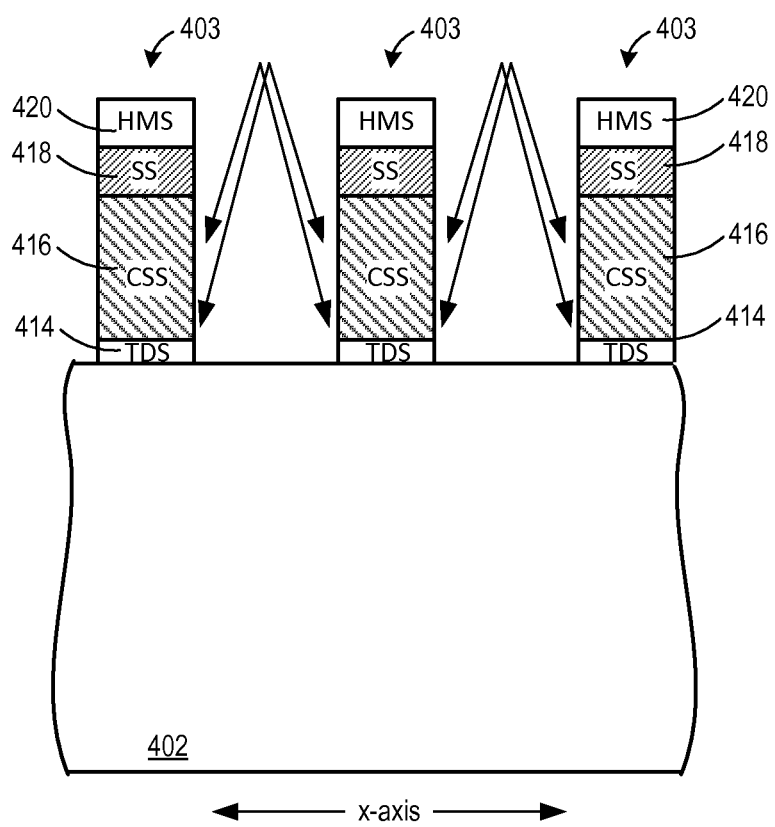
Figure 10C:
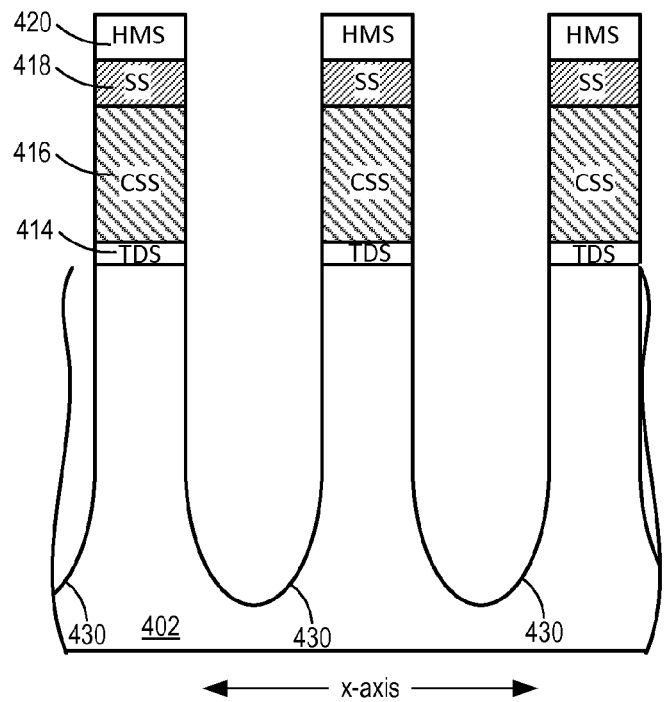
Figure 10D:
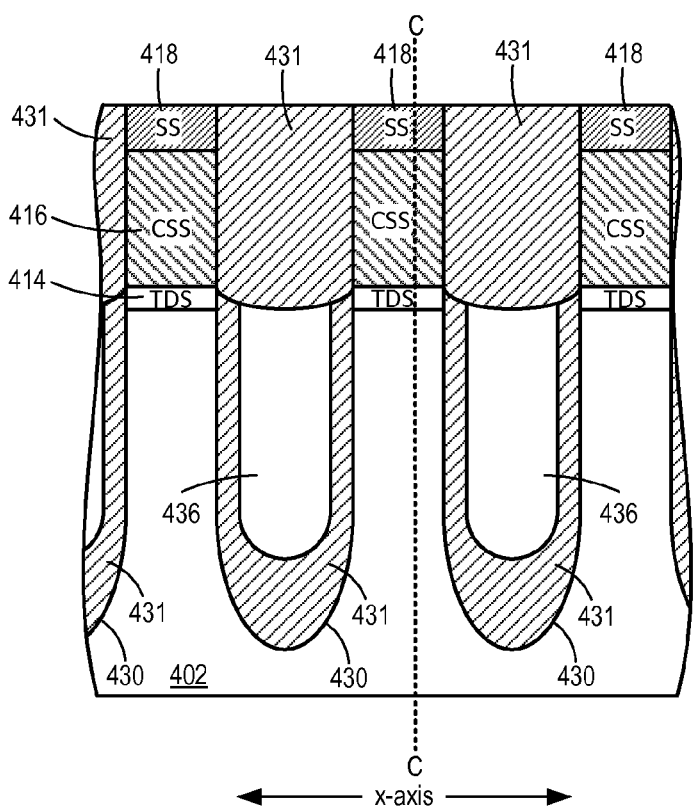
Figure 10E:
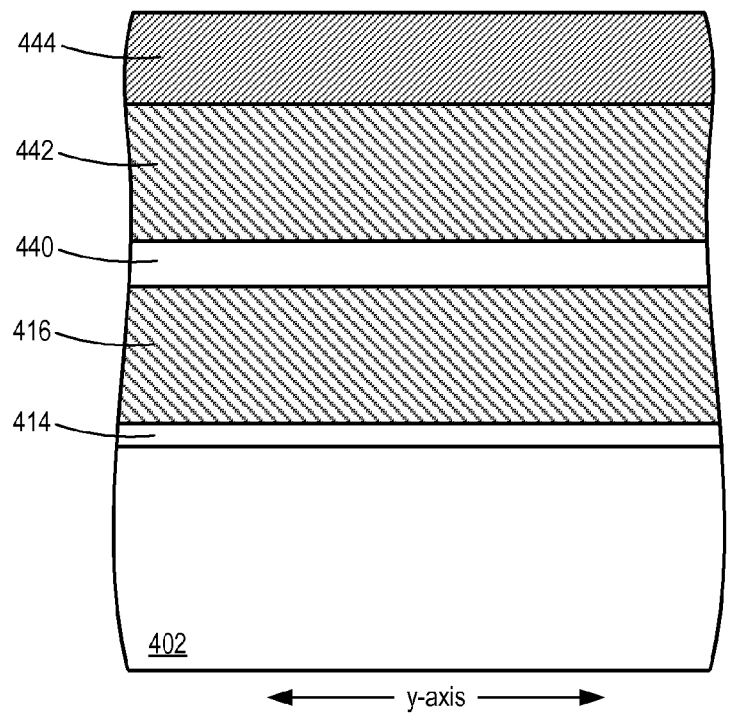
Figure 10F:
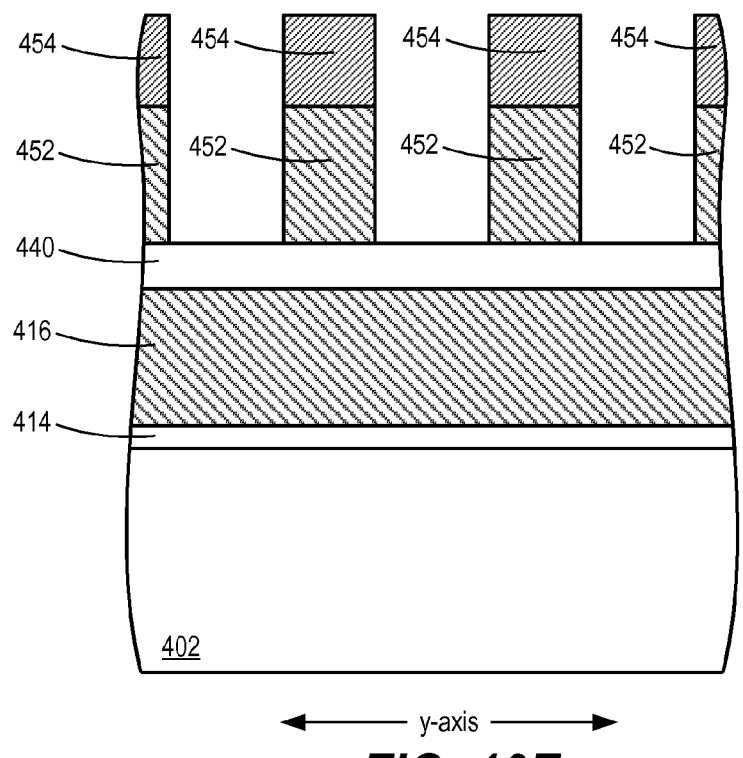
Figure 10G:
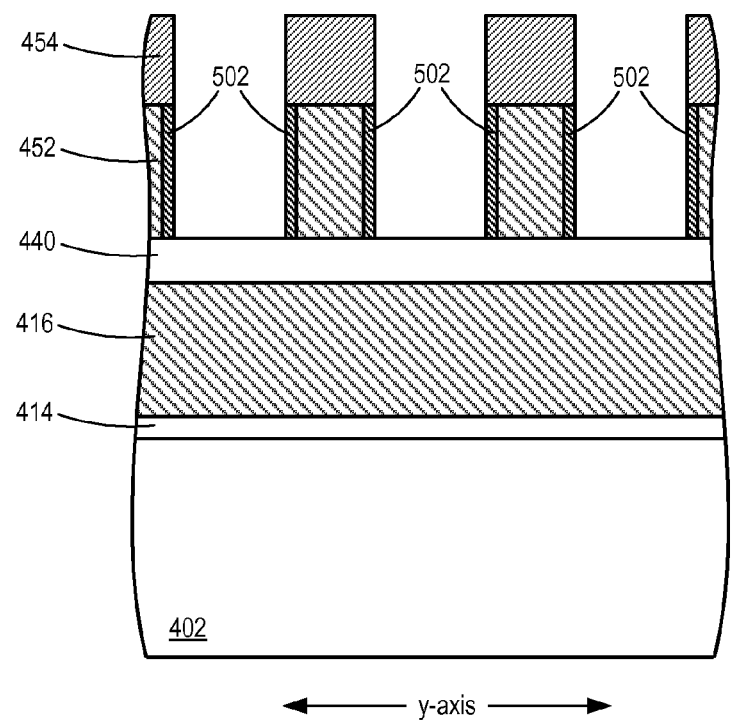
Figure 10H:
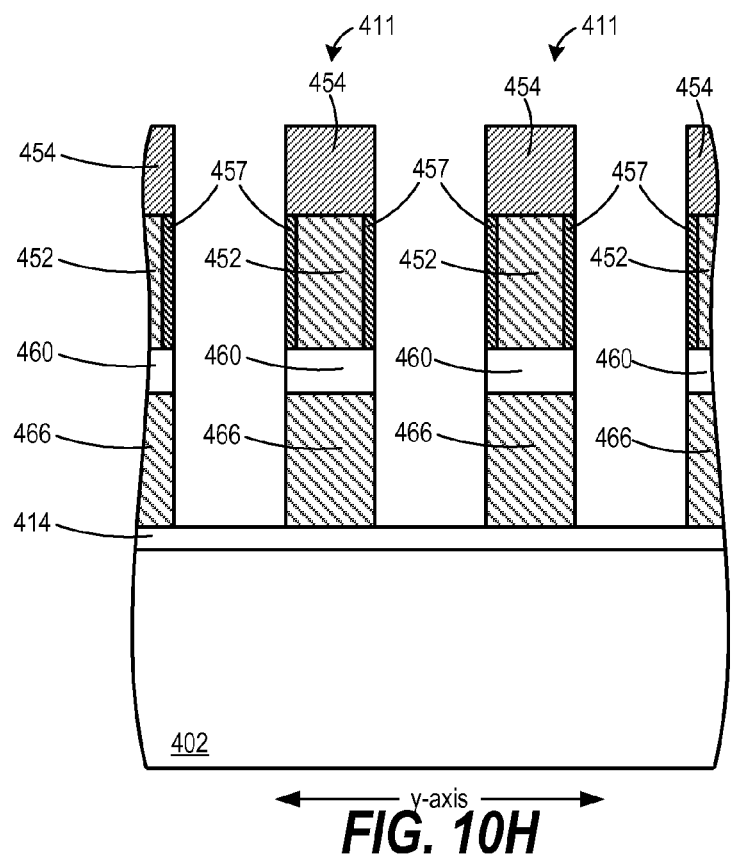
Figure 10I:
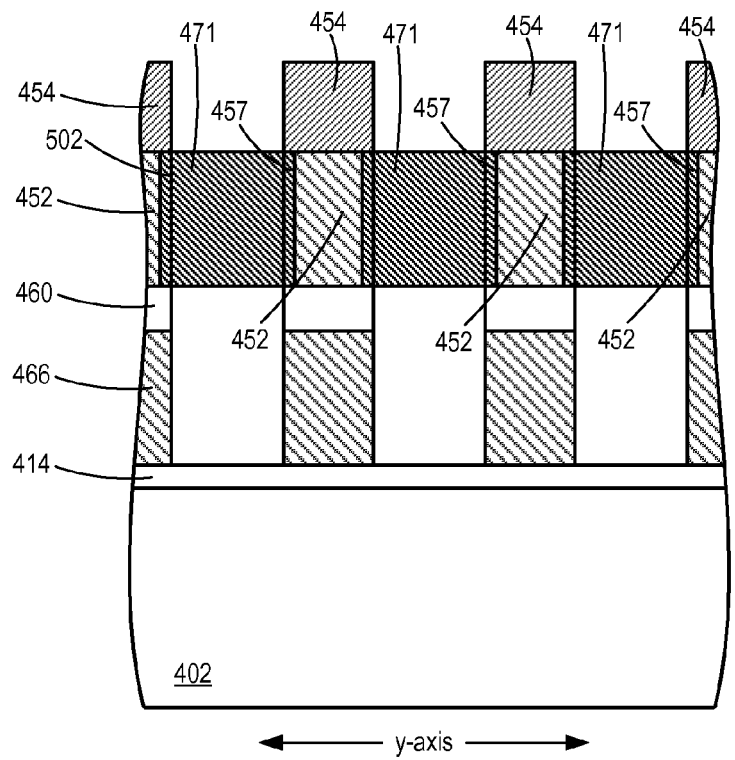
Figure 10J:
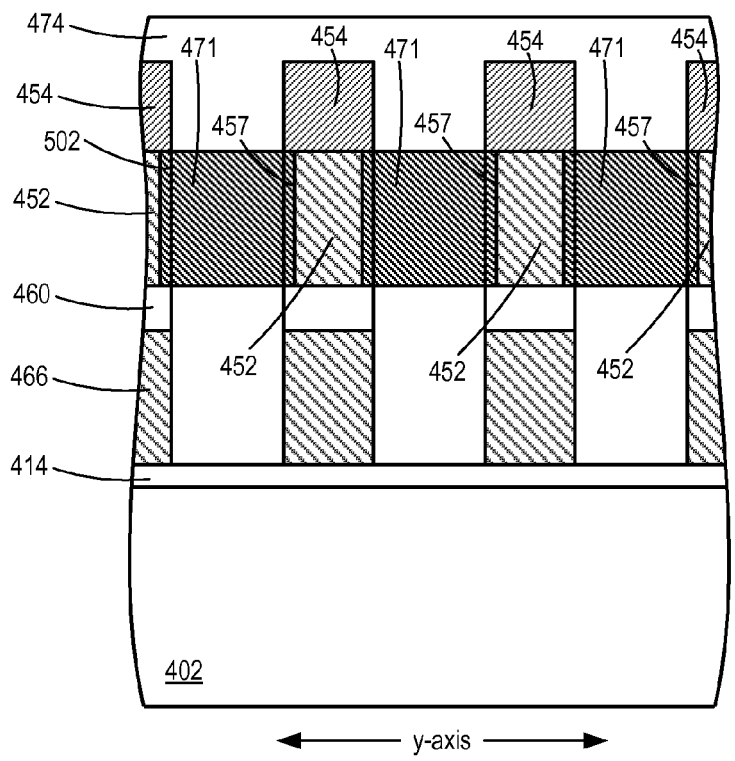
Figure 10K:
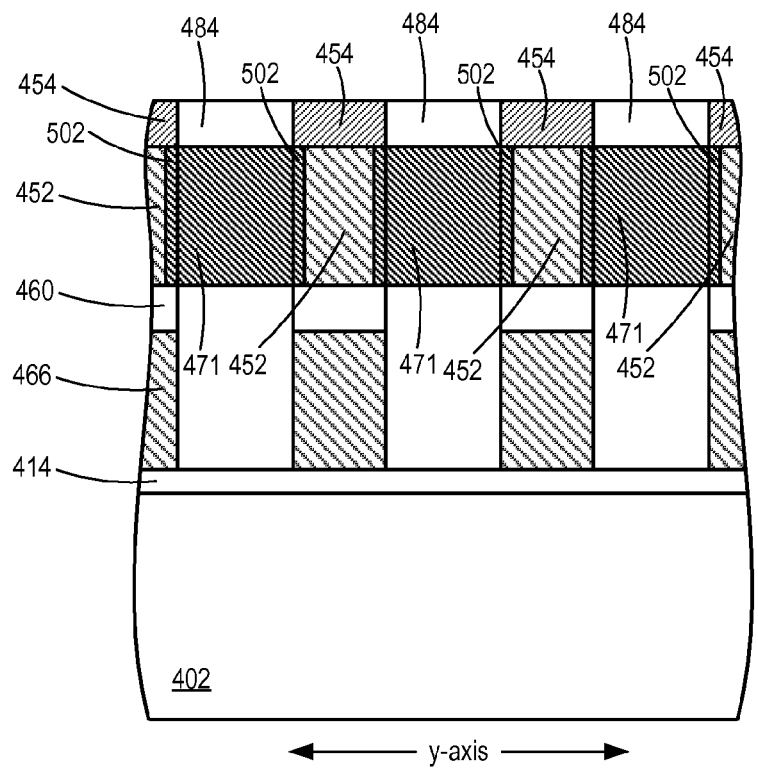
Figure 10L:
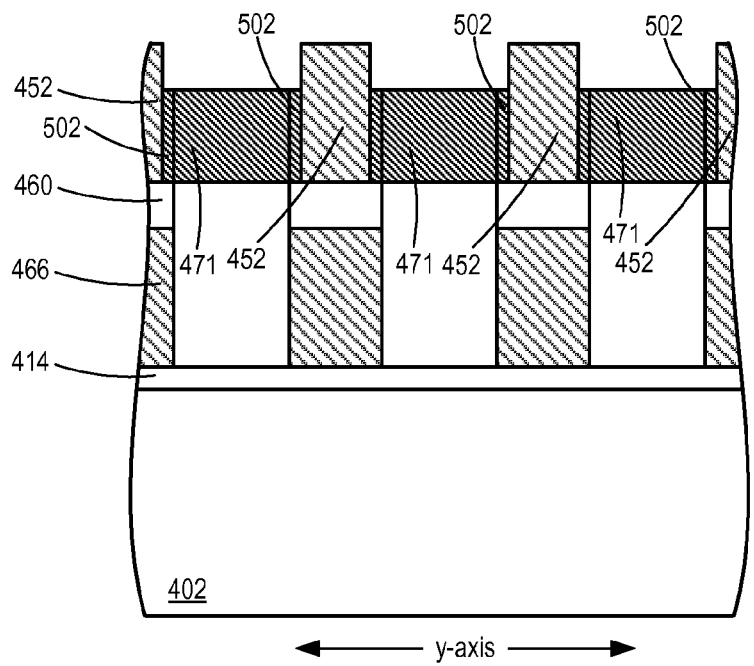
Figure 10M:
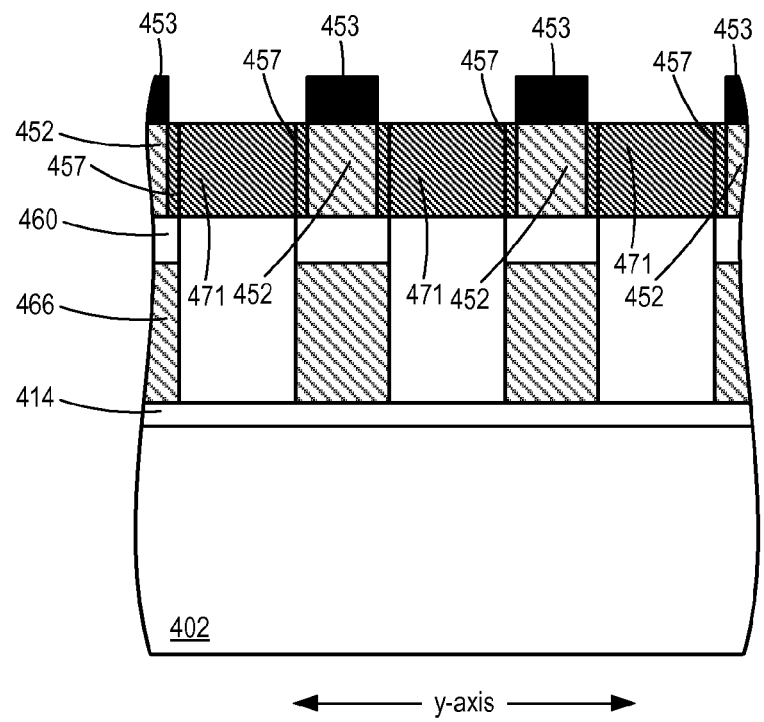
Figure 10N:
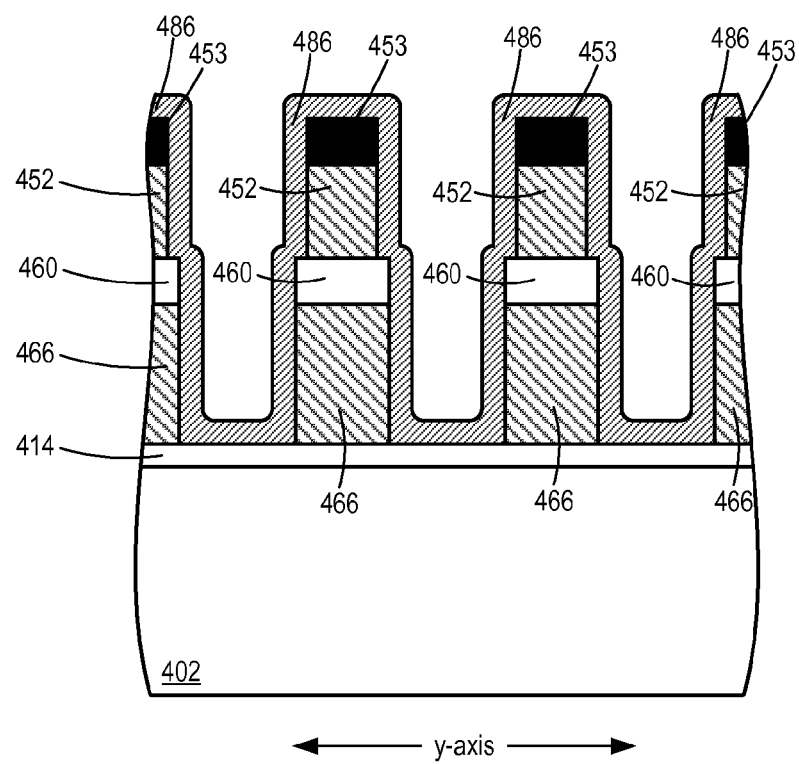

FIGS. 9 and 10A-10N describe another embodiment of forming bit line and word line air gaps. The described embodiment is exemplary only and its precise form should not be taken as limiting the disclosure. Air gaps are again formed in the bit line or column direction as part of the isolation regions. In this embodiment, a surface modification induced selective growth process is used to form the capping strips at upper portions of the isolation regions.

At steps 552-554 of FIG. 9, the substrate is processed, followed by forming the layer stack. FIG. 10A is a cross-sectional view taken along the x-axis through a memory array undergoing fabrication that depicts the results of steps 552-554 in one example. As before, tunnel dielectric layer 404, charge storage layer 406, sacrificial layer 408, and one or more hard masking layers 410 make up layer stack 401.

The layer stack is patterned at step 556 and etched at step 558, again stopping at the substrate surface. At step 560, the charge storage strips are subjected to surface modification that will subsequently induce the selective growth of a capping material at the charge storage strips.

FIG. 10B depicts the results of steps 556-560 in one embodiment, with layer stack rows 403 elongated in the direction of the y-axis (column direction) as described above. In FIG. 10B, an example is depicted where ion implantation is used for the surface modification. Ion implantation can be used to modify the surface of the charge storage material and form lightly to moderately doped charge storage strips. As described more fully hereinafter, the doping concentration (e.g., n-type impurities) of the charge storage layer may be selected at a level less than the concentration of the subsequently formed control gate material. Nevertheless, the doping concentration may be higher than for traditional charge storage regions to enable the selective growth of a capping layer in subsequent process steps.

At step 562 the substrate is etched to form isolation regions that separate active areas under the layer stack columns. FIG. 10C depicts the results of step 562 in one embodiment, with isolation regions 430 separating active areas 421.

At step 564, a capping layer is selectively grown on the charge storage strips and optionally other layers of the stack. FIG. 10D depicts the results of step 564 in one embodiment. A capping layer, shown here after forming into strips 431, is grown on the sidewalls of the charge storage strips to fill the spaces therebetween. As is shown, the selective growth process is not limited exclusively to the surface modified charge storage strips in this example. The capping layer may also form on the sidewalls and lower surface of the isolation regions, the sidewalls of the tunnel dielectric strips 414 and sacrificial strips 418 or along portions of these surfaces. Nevertheless, the surface modification of the charge storage strips allows the capping layer to form more quickly on the modified sidewalls of the charge storage strips. Thus, although the capping layer may also grow in the isolation regions, it accumulates faster along the modified sidewalls. Accordingly, the capping layer meets over isolation regions 430, sealing or providing an upper cap over them (at least temporarily) so that an air gap 436 is formed in the isolation regions. The capping layer accumulates faster along the layer stack columns so that before the regions are completely filled, the capping layer meets to provide an upper surface for the isolation regions and air gaps. The oxide will "pinch off" or form a solid bridge or dielectric cap at the upper portion of the trench. In this example, the capping layer's lower surface that defines the upper endpoint of air gaps 436 is above the substrate surface. The cap may extend into the trench in another example. FIG. 10D also depicts the results of a polishing or etch back process to create a planar layer stack surface. In this example, the hard masking strips 420 are removed. Etching back forms the individual caps 431 from capping layer.

In one embodiment, the capping layer is an oxide formed using a high-density plasma chemical vapor deposition process (HDP-CVD). During deposition, a TEOS and ozone ($O_3$) mixture may applied at a first ratio to form a nucleation layer on the modified surface(s). The nucleation layer may form on untreated surfaces as well, but not as quickly such that a greater quantity accumulates as on the modified surfaces. After forming the nucleation layer, the ratio of TEOS to $O_3$ may be modified to promote selective growth of the oxide on the modified surfaces of the charge storage strips. For example, the amount of ozone may be increased. Other deposition techniques that will deposit oxide faster on a polysilicon charge storage layer than on a single crystal silicon substrate can be used.

At step 566, an intermediate dielectric layer is formed and at step 568, a control gate layer is formed. In one embodiment, the caps 433 can first be recessed, followed by stripping the remaining sacrificial strips 418 as described in FIG. 7G. In this manner, the intermediate dielectric layer and control gate layer can be formed at least partially in the spaces between charge storage strips to improve coupling between the control gate and underlying charge storage regions by wrapping around the charge storage regions in the row direction. In another embodiment, the sacrificial strips and caps can be polished or etched back to remove the sacrificial strips and create a planar surface without recessing the caps. In this case, a flat type of cell structure can be formed.

FIG. 10E is cross-sectional view of the memory array taken along line C-C in FIG. 10D. FIG. 10E depicts the layer stack including a tunnel oxide strip 414 and charge storage strip 416. The sacrificial strip 418 has been removed and an intermediate dielectric layer 440, control gate layer 442 and one or more hard masking layers 444 have been formed.

At step 570, a second pattern is formed over the layer stack. The second pattern includes strips (not shown) that extend in a direction (row direction) that is orthogonal to the direction (column direction) of the first pattern applied at step 556. At step 572, the second pattern is used to etch the control gate layer 442 into control gates. FIG. 10F depicts the results of step 570 and 572 in one embodiment. Strips of photoresist or some other patterning agent are used to etch hard masking layer 444 into strips 454. Strips 454 are then used as a mask to etch the control gate layer into control gates 452. Etching stops when the intermediate dielectric 440 is reached.

At step 574, the surface of the control gate sidewalls is modified. FIG. 10G shows an embodiment where ion implantation is used to form a modified surface 457 on control gates 452. In one embodiment, the implantation at step 574 is at a higher concentration than that used in the implantation at step 560 for the charge storage layer. In this manner, selective growth process in subsequent processes can be promoted on the control gate strips, while inhibiting or causing a slower growth at the charge storage layer. In one example, the control gate layer and charge storage layers are both polysilicon.

At step 576, the layer stack is further etched using strips 454. Etching continues to the tunnel dielectric layer in one embodiment, but may continue through all or some portion of the tunnel dielectric. FIG. 10H depicts the results of step 576 in one embodiment. Layer stack rows 411 extend in the row direction over the tunnel dielectric strips and the isolation regions 430. Each layer stack row includes a hard masking strip 454, a control gate 452, intermediate dielectric strip 460, and a charge storage region 466. Etching may expose the bit line air gaps by removing portions of caps 431 between the rows. As described hereinafter, the formation of word line air gaps and caps will subsequently provide an upper endpoint for the air gaps at those exposed regions.

At step 578, a temporary capping layer is selectively grown on the modified surfaces of the vertical sidewalls of the control gates. As described, the control gates are subjected to ion implantation at a higher doping concentration than that of the charge storage regions. In this manner, a dielectric (e.g., oxide) that selectively grows upon polysilicon can be applied to selectively grow the temporary capping layer upon the sidewalls of the control gate strips while not growing (or not growing at as fast a rate) upon the sidewalls of the charge storage layer.

FIG. 10I depicts the results of step 578 in one embodiment. A capping material is selectively grown upon the modified surface 502 of the control gates 452 forming temporary caps 471. As with capping strips 431 formed at step 564, the capping layer is selectively grown on the surfaces that were subjected to modification by ion implantation. In this example, the modification promotes growth of the capping layer on the polysilicon control gate layer. In other embodiments, some amount of the capping layer may also grow on the unmodified surfaces on the charge storage regions 468. Nevertheless, the modification causes a faster rate of growth of the capping material on the control gate layer than the charge storage layer. Accordingly, the capping material will accumulate faster on the control gates than the charge storage regions. Similarly, it is possible that some amount of the capping layer may grown on the intermediate dielectric strips 460 and tunnel dielectric strips 414. In this manner, the capping material meets over the spaces between rows before those spaces are completely filled. Accordingly, a seal or solid upper surface is formed before the spaces are filled.

At step 580, the temporary caps are recessed such that their upper surfaces are below the upper surface level of the control gates. In one embodiment, the temporary caps are recessed directly by etching back the oxide material of the caps using the sacrificial nitride strips as a mask in the same manner described in FIGS. 8D-8E. In another embodiment, a spacer dielectric 474 (e.g., oxide) is formed as shown in FIG. 10J. The spacer material and hard masking strips 454 are planarized to form spacers 484 between strips 454 as shown in FIG. 10K. The nitride is then used as a mask to recess the caps 471 below the level of the control gates 452. The sacrificial nitride strips 454 are removed after recessing caps 471. FIG. 10L depicts the memory array after recessing caps 471.

At step 582, the control gates are silicided. FIG. 10M depicts the results of step 582 in one embodiment. Control gates 452 have been silicided to create a metal silicide end portion 453 for each control gate. After siliciding the control gates, the temporary caps are removed from the spaces between layer stack rows at step 584. After the caps are removed, a dielectric liner is formed over and along the vertical sidewalls of the layer stack rows. FIG. 10N depicts the results of steps 582 and 584 in one embodiment. Dielectric liner 486 is formed over the upper surface of the control gates 452 and along the vertical sidewalls of the control gates 452, intermediate dielectric strips 460 and charge storage regions 466.

Figure 10O:
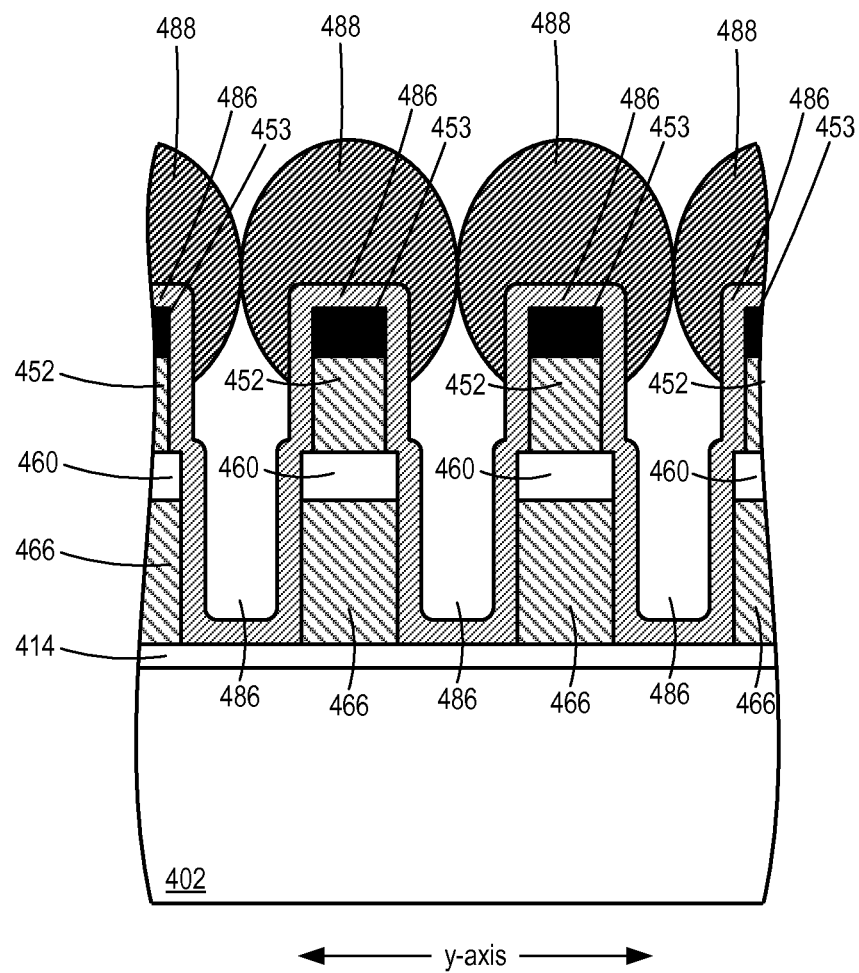

At step 586, air gaps are formed at least partially in the spaces between layer stack rows using permanent word line air gap caps. FIG. 10O depicts the results of step 586 in an embodiment where a capping layer 488 is formed over the layer stack rows using a non-conformal deposition process as earlier described. Although not shown, a polishing or etch back step can be applied to form individual caps from layer 488. At step 588, front end processing is completed.

In one embodiment where silicided control gates are not used, word line air gaps can be formed by etching the layer stack into rows 411 as shown in FIG. 10H without performing a surface modification to the control gates. Liner 486 can be formed directly after etching as shown in FIG. 10N, followed by forming the capping material as shown in FIG. 10O.

Additionally, the process of using a catalyst layer to form temporary word line air gaps as shown in FIGS. 7J-7T or 8A-8E may be substituted for the word line air gap formation process depicted in FIGS. 10E-10O. Likewise, the process of using a surface modification as depicted in FIGS. 10E-10O may be substituted for the word line air gap formation process depicted in FIGS. 7J-7T.

Figure 11A:
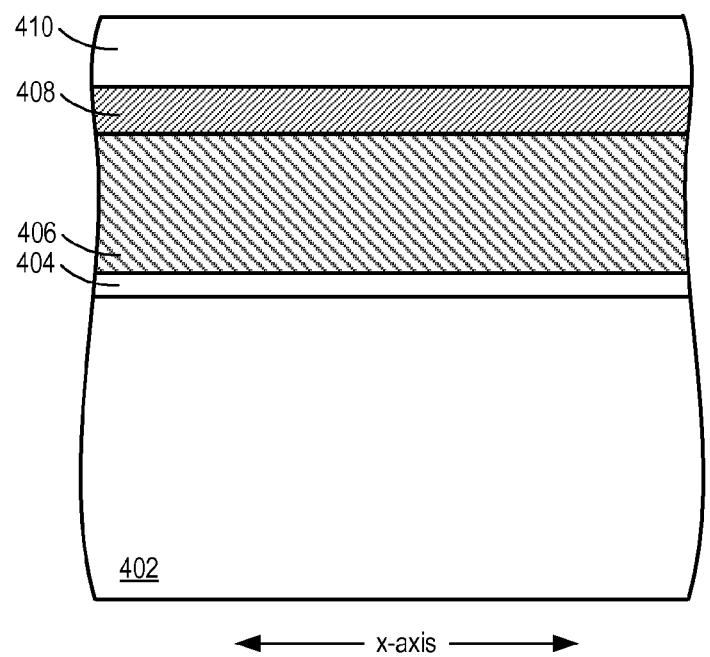
FIGS. 11A-11F are orthogonal cross-sectional views through a portion of a non-volatile memory array depicting a variation of the method of FIG. 9.
Figure 11B:
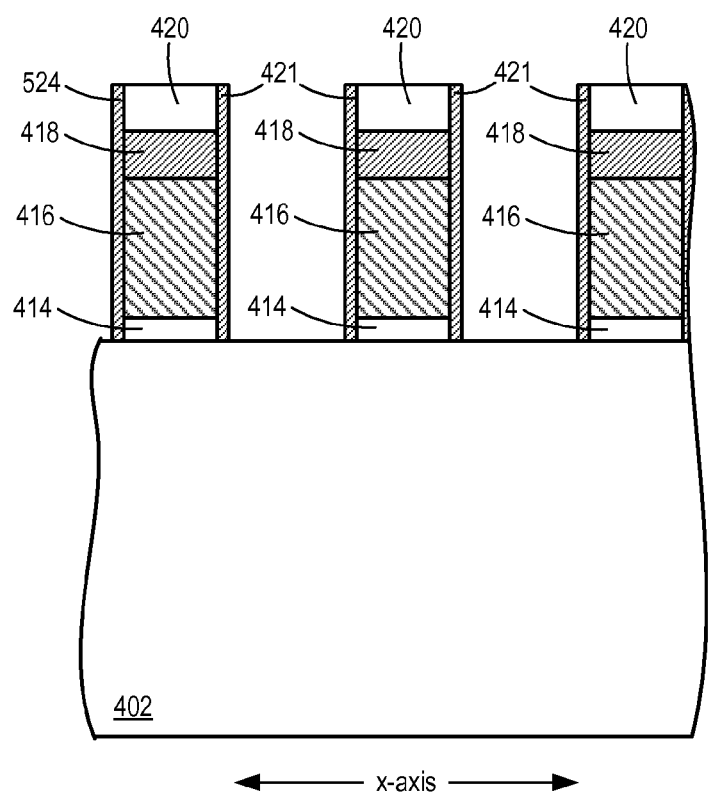

FIGS. 11A-11F are cross-sectional views depicting a variation to the process of FIG. 9 for forming bit line air gaps in steps 552-564. FIG. 11A shows the results of steps 552-556 after processing substrate 402, forming layer stack 401 and forming a pattern (not shown). After forming the pattern, the layer stack is etched as described in step 558 and ions are implanted into the charge storage strips at step 560. After implanting the charge storage strips, a protective liner is applied to the layer stack rows to protect the modified surfaces of the charge storage strips. FIG. 11B depicts a nitride liner 421 formed along the vertical sidewalls of the layer stack rows 401. The liner may be formed using a conformal deposition process and etch back to form the liner along the layer stack rows. The etch back will remove the liner from the substrate surface at locations between layer stack rows.

Figure 11C:
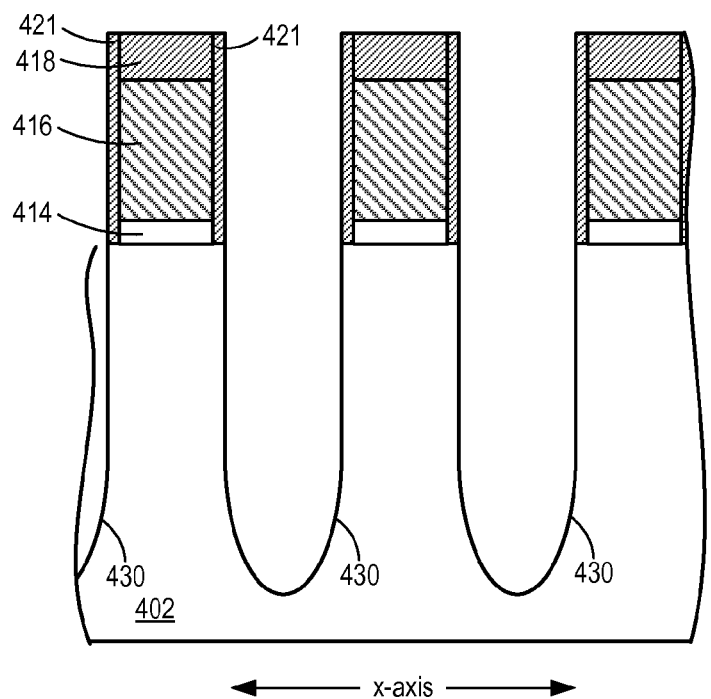

After forming the liner, the substrate is etched to form isolation regions 430 as shown in FIG. 11C. Liner 421 protects the sidewalls of the charge storage strips 416 during this etch process. The liner can avoid damage to the modified surface of the charge storage strips so that the subsequent selective growth of the capping layer upon the charge storage regions remains promoted.

Figure 11D:
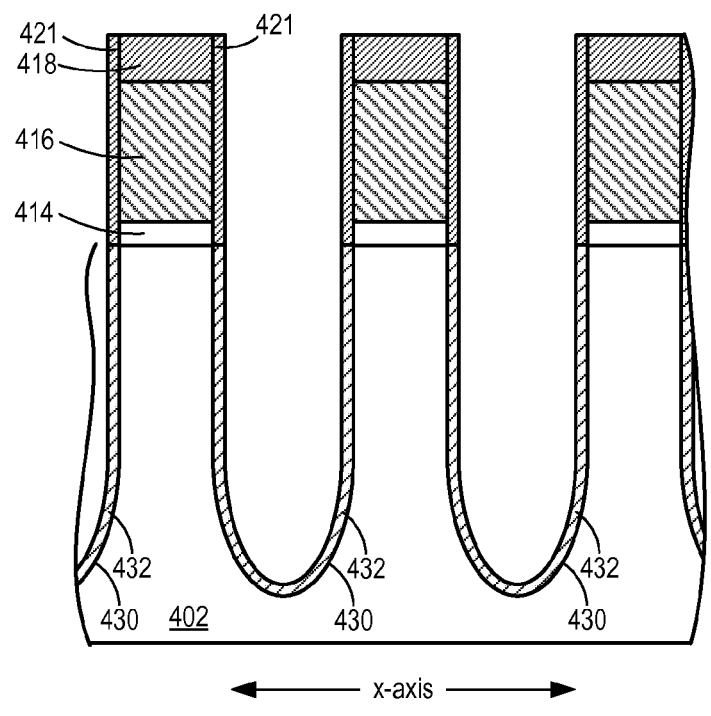

After etching the substrate into isolation regions, an oxide trench liner 432 is grown in the isolation regions as shown in FIG. 11D. Liner 432 is formed along the sidewalls and lower surface of isolation regions 432. In one example, the liner has a thickness of 3-4 nm. Liner 432 is an oxide in one example. A thermal oxidation process can be used to selectively grow liner 432 within the isolation regions. In other examples, a deposition process can be used to selectively grown the liner in the isolation regions.

Figure 11E:
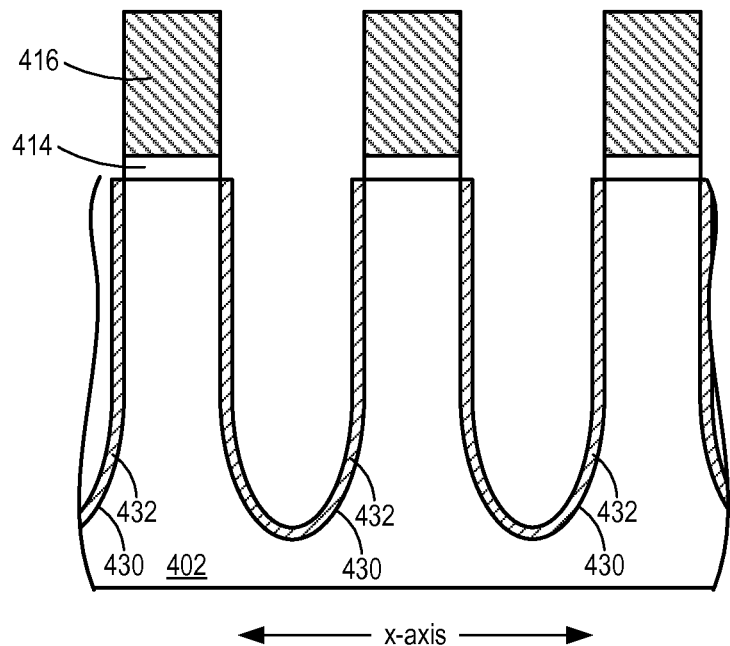

After forming trench liner 432, the nitride layer stack liner 421 and nitride sacrificial strips 418 are removed as shown in FIG. 11E. A reactive ion etching process is used in one embodiment to selectively remove the nitride while not removing liner 432.

Figure 11F:
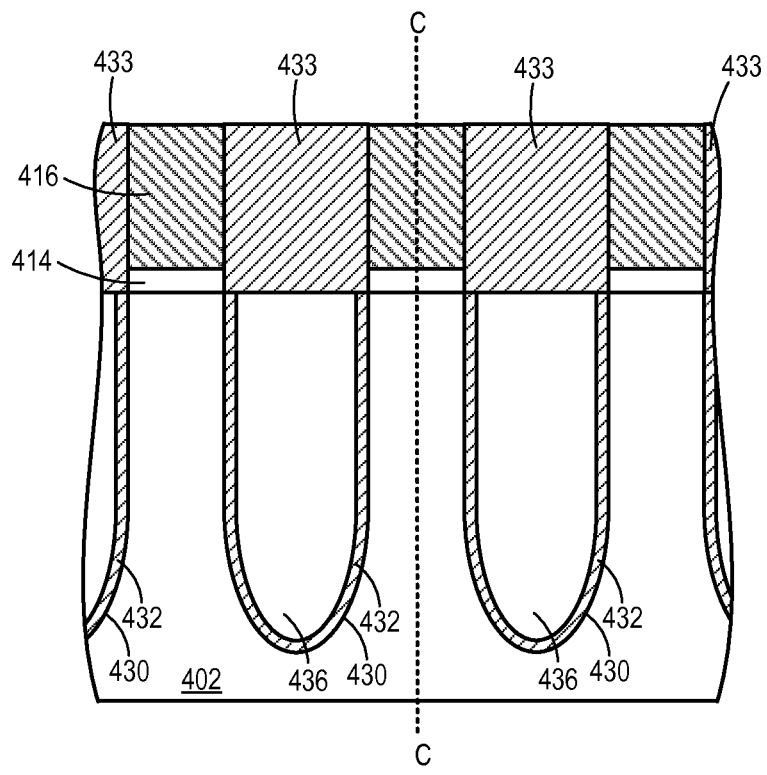

After removing nitride 418 and 421, a dielectric capping layer is selectively formed on the sidewalls of the charge storage strips 418 and tunnel dielectric strips 414 as shown in FIG. 11F. Individual caps 433 are formed between adjacent layer stack columns. The dielectric capping layer does not accumulate within isolation regions 430 in this example. Trench liner 432, an oxide, covers the silicon substrate and inhibits growth of the capping layer within. After forming the caps, processing continues as shown in FIG. 10E-10O to etch the layer stack into rows and to form word line air gaps.

Figure 12:
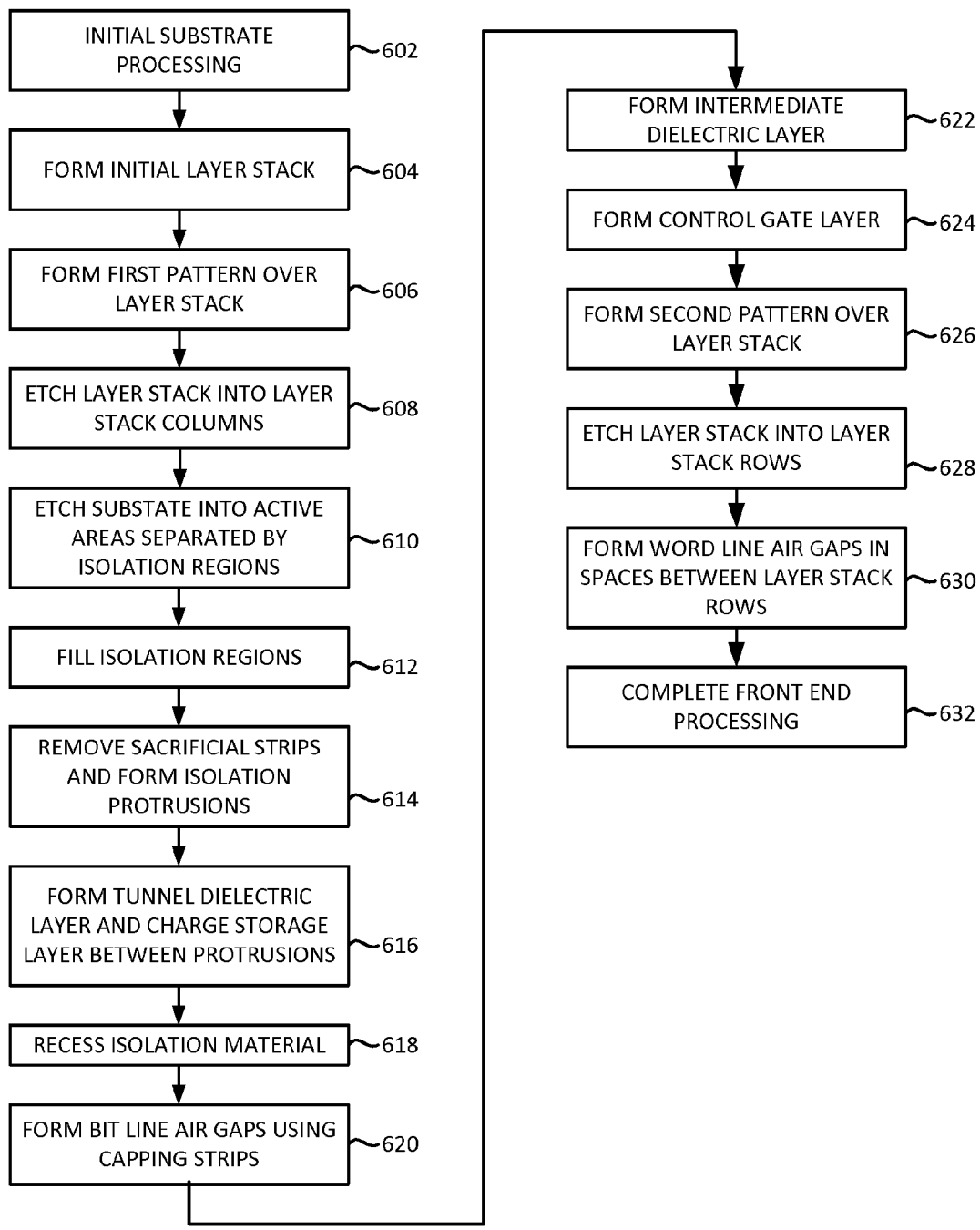
FIG. 12 is a flowchart describing a method of forming bit line and word line air gaps in accordance with one embodiment of the disclosure.
Figure 13A:
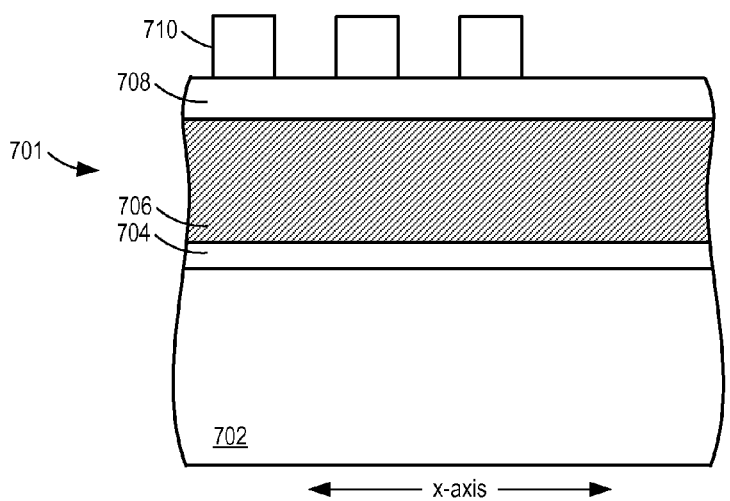
FIGS. 13A-13Q are orthogonal cross-sectional views of a portion of a non-volatile memory array that may be fabricated according to the method of FIG. 12 in one embodiment.
Figure 13B:
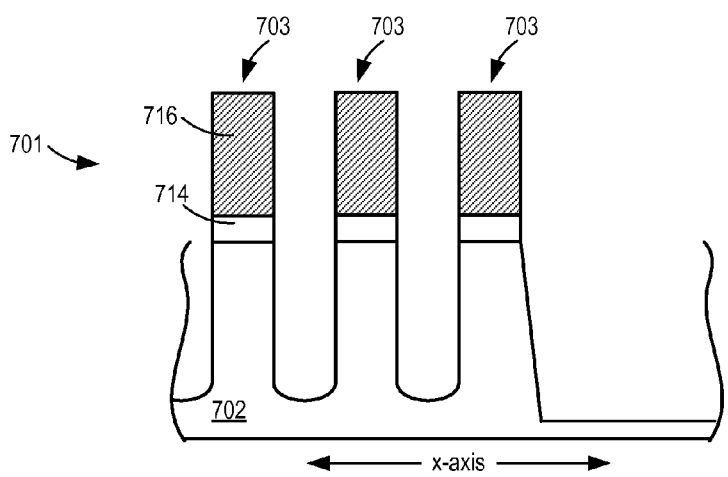
Figure 13C:
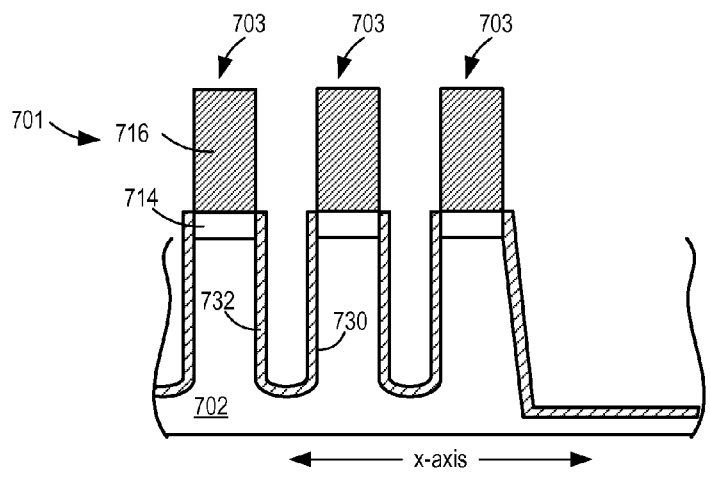
Figure 13D:
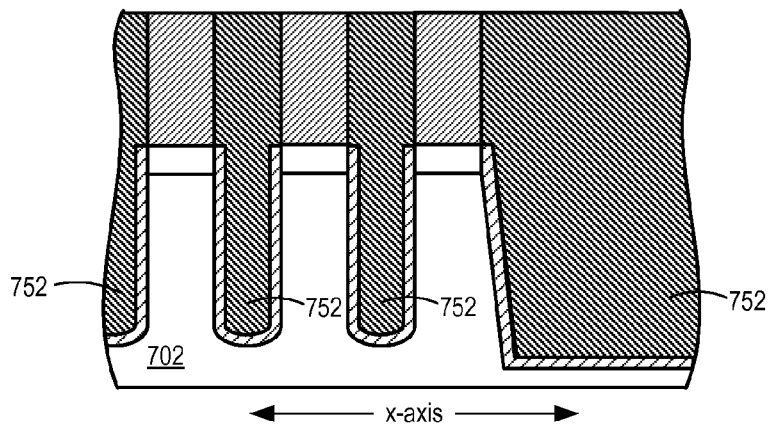
Figure 13E:
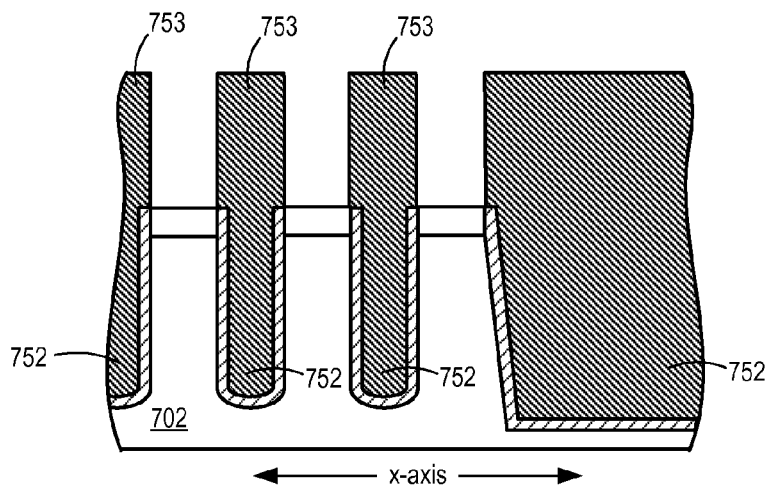
Figure 13F:
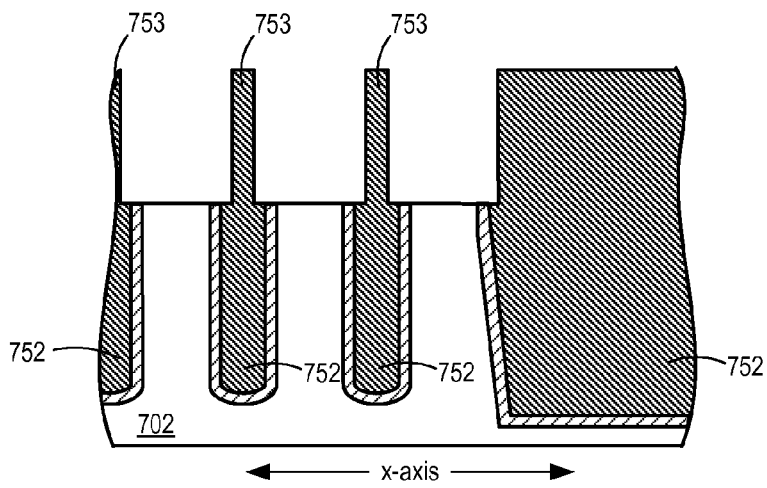
Figure 13G:
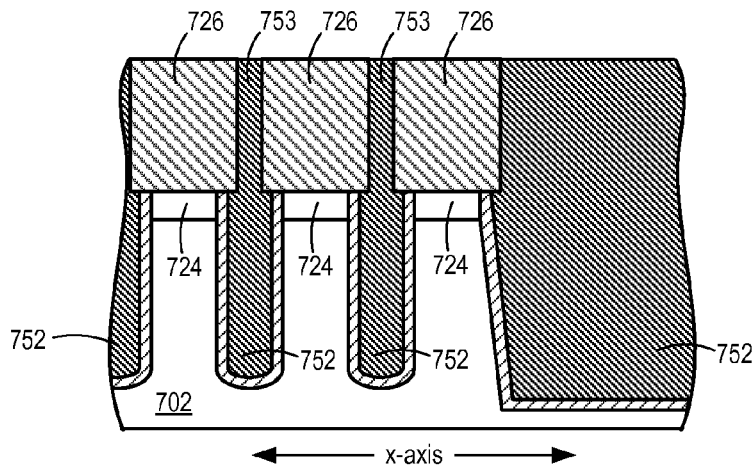
Figure 13H:
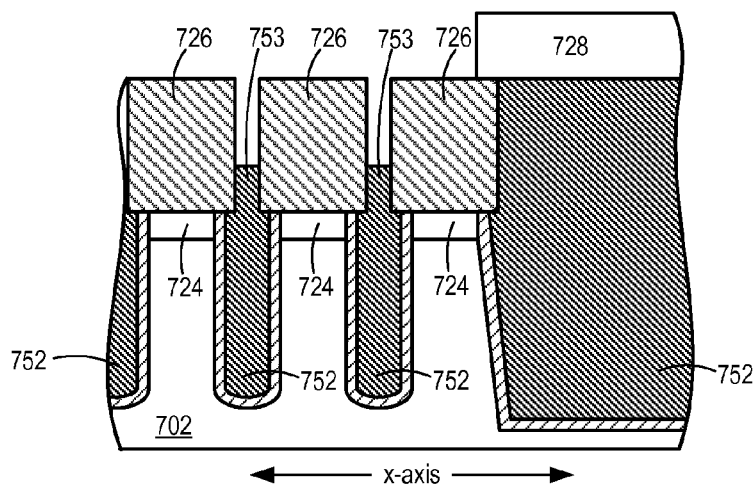
Figure 13I:
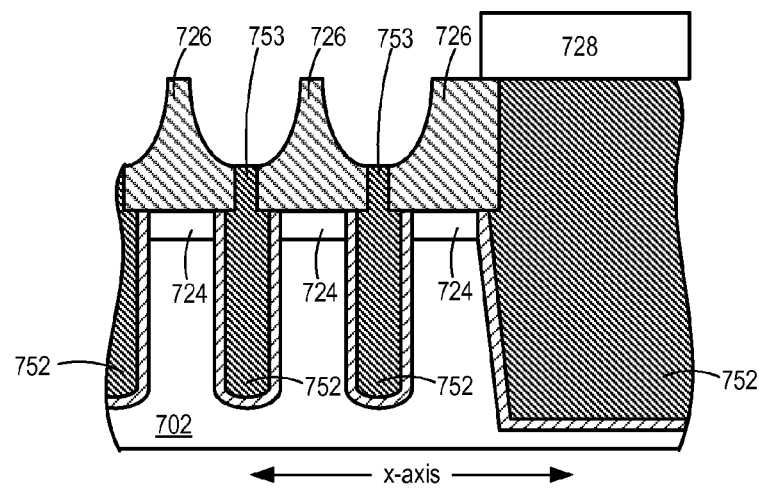
Figure 13J:
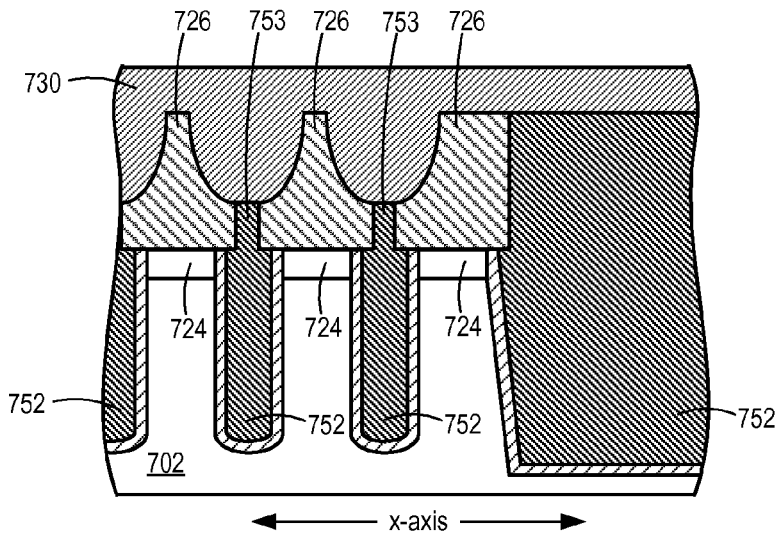
Figure 13K:
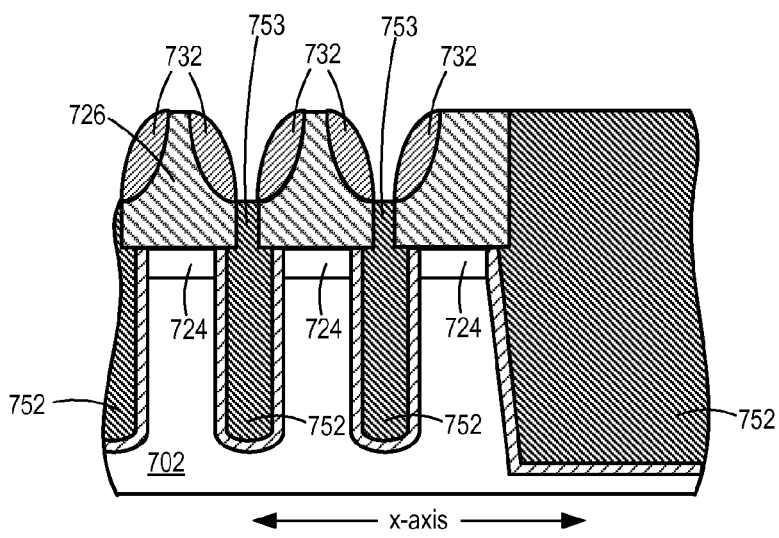
Figure 13L:
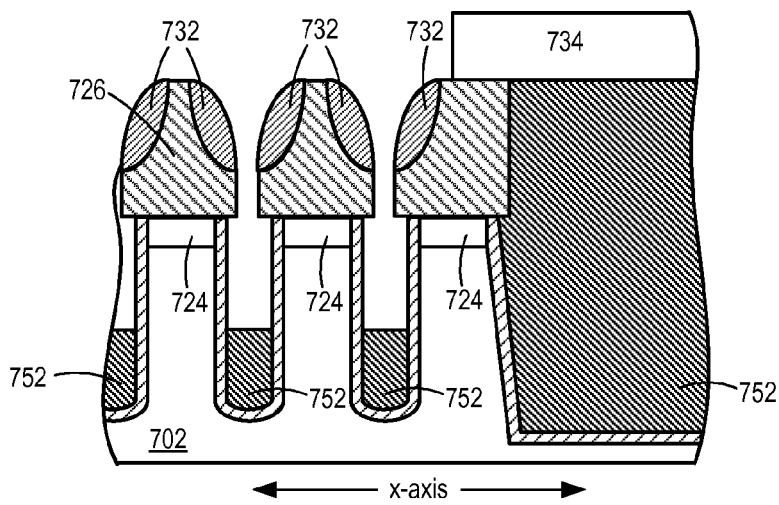
Figure 13M:
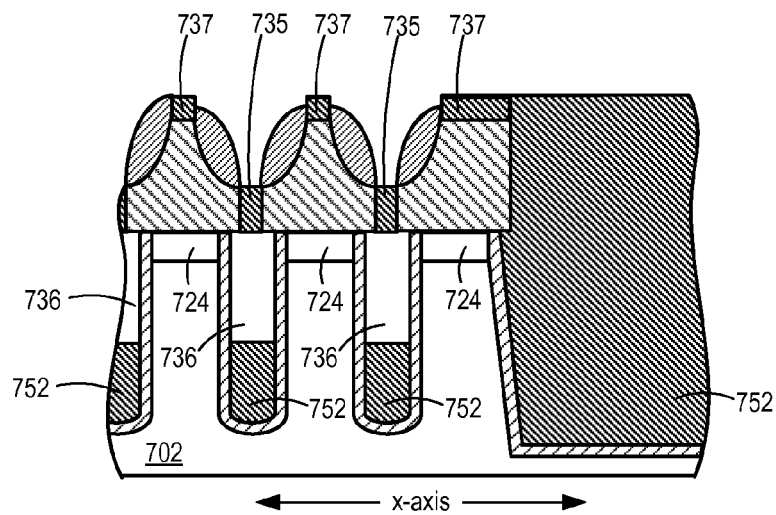
Figure 13N:
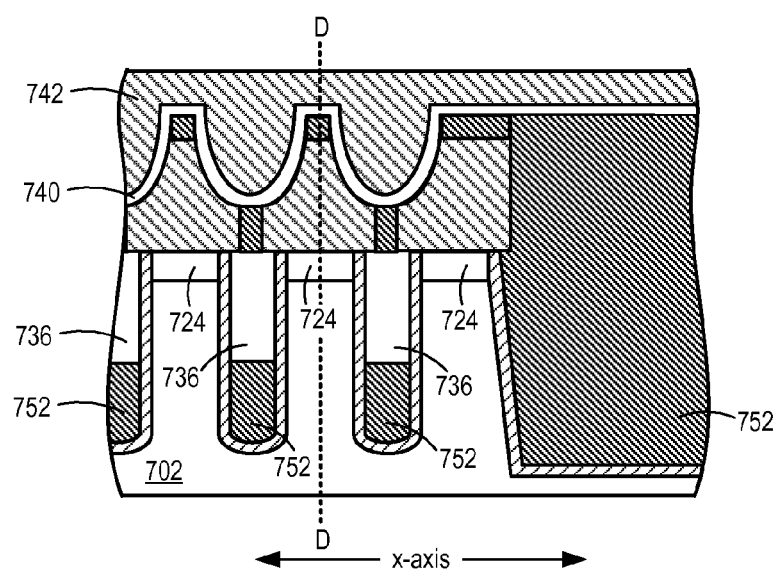

FIGS. 12 and 13A-13N describe another embodiment of forming bit line and word line air gaps. The described embodiment is exemplary only and its precise form should not be taken as limiting the disclosure. Air gaps are again formed in the bit line or column direction as part of the isolation regions. In this embodiment, a damascene process is used to form the charge storage strips after forming the isolation regions. The charge storage regions are formed with vertical sidewalls that overlie the isolation regions. A capping layer is then grown between adjacent charge storage strips to form the bit line air gaps. The described embodiment is exemplary only and its precise form should not be taken as limiting the disclosure.

At step 602, the substrate undergoes initial processing, followed by forming an initial layer stack at step 604 and first pattern at step 606. FIG. 13A depicts the results of steps 602-606 in one embodiment. In this example, layer stack 701 includes a pad layer 704, sacrificial layer 706, hard mask layer 708 and patterning strips 710. In one particular example, the pad layer is an oxide, the sacrificial layer is SiN, and the hard mask layer is an oxide. FIG. 13A and the following depict processing at both the memory array portion of the device and a peripheral circuitry area.

At step 608, the layer stack is etched into layer stack columns and the substrate is etched into active areas separated by isolation regions. FIG. 13B depicts the results of steps 608-610 in one example after forming layer stack columns 703, active areas 721 and isolation regions 730. Sacrificial layer 706 has been etched into strips 716 and pad layer 704 has been etched into strips 714.

At step 612, the isolation regions are filled with an isolation material. FIGS. 13C-13D depict a process for filling the isolation regions in one example. An isolation liner 732 such as a thermally grown or deposited oxide is formed in the isolation trenches as shown in FIG. 13C. After forming the liner, an isolation material 752 such as oxide is deposited to complete filling of the trenches as shown in FIG. 13D. A polishing or etch back process can be applied to provide a planar surface before additional processing.

At step 614, the sacrificial strips are removed as depicted in FIG. 13E. A selective etch process can be used. Removing the sacrificial strips leaves protrusions 753 of the isolation material that extend above the substrate surface. FIG. 13F depicts the results of an optional slimming process to slim the dimension of the protrusions in the row direction. A selective or non-selective etch back can be used. Slimming the protrusions removes pad strips 714.

At step 616, tunnel dielectric strips and charge storage strips are formed over the substrate surface between adjacent protrusions 753 of the isolation material. FIG. 13G depicts the results of step 616 in one embodiment. In this example, the tunnel dielectric strips 724 are a thermally grown oxide. The charge storage strips 726 are polysilicon deposited to fill the spaces between adjacent protrusions. After forming the charge storage strips, the layer stack is polished or etched back to at least the level of the upper surface of the protrusions. In this manner, discrete strips of polysilicon are formed between adjacent protrusions.

At step 618, the isolation material is recessed to below the surface of the substrate. Different techniques for recessing the isolation material may be used. FIGS. 13H-13L depict one example for recessing the isolation material that includes slimming the charge storage strips. The peripheral circuitry area is covered with a mask 728 as shown in FIG. 13H. After forming the mask, an etch back process selective to oxide is applied to recess protrusions 753 to a level between the upper surface of the charge storage strips and the upper surface of the substrate. In one example, the protrusions are recessed to a level 60-100 nm below the upper surface of the charge storage strips.

After recessing the protrusions, the charge storage strips are slimmed as shown in FIG. 13I. The dimension of the charge storage strips in the row direction is decreased where the sidewalls of the charge storage strips are exposed by recessing the protrusions. A selective etch back process can be applied. After slimming the charge storage strips, the mask 728 is removed and a sacrificial layer 730 of nitride is applied as shown in FIG. 13J. A deposition process can be used to fill the spaces between adjacent charge storage strips. The nitride can be selectively etched back to form spacers 732 along the exposed sidewalls of the charge storage strips as shown in FIG. 13K. A mask 734 is again applied over the peripheral circuitry area, followed by recessing the isolation material to below the substrate surface as shown in FIG. 13L. The nitride spacers serve as a mask to protect the charge storage strips during the etch process. In one example, the isolation material is recessed to a level 40-150 nm below the substrate surface.

At step 620, bit line air gaps are formed using capping strips between the charge storage strips. FIG. 13M depicts the results of step 620 in one embodiment. Recessing the isolation material exposes the vertical sidewalls of the charge storage strips below the nitride spacers. Capping strips 735 are an oxide formed by thermal oxidation in one example. The oxide is selectively grown on the exposed polysilicon of the charge storage strips but not the liner 732 in the isolation regions or the nitride spacers. Accordingly, the capping strips overlie air in the isolation regions forming air gaps 736. The air gaps extend vertically from the upper surface of the recessed isolation material to the lower surface of the capping strips 735. In other embodiment, some portion of the capping material may form within the isolation regions. Nevertheless, the small dimension achieved between adjacent charge storage strips facilitates the capping material meeting to seal the air gaps before the isolation regions completely fill.

At step 622, an intermediate dielectric layer is formed after removing the nitride spacers. At step 624, a control gate layer is formed over the intermediate dielectric layer. FIG. 13N depicts the results of steps 622-624 in one embodiment. A conformal deposition process is used to form an intermediate dielectric layer 740 equally along all exposed surfaces. In this manner, spaces between the charge storage strips remain after forming the intermediate dielectric layer. The control gate layer 742 is then applied, filling the remaining spaces between charge storage strips.

At step 626, a second pattern is applied over the layer stack. The second pattern is formed for etching orthogonal to the direction of etching using the first pattern. The second pattern may include strips of hard masking material and/or photoresist, or other suitable mask, that are elongated in the row direction along the x-axis with a spacing between strips in the column direction along the y-axis. The pattern defines the gate length for the charge storage region of each memory cell.

Figure 13O:
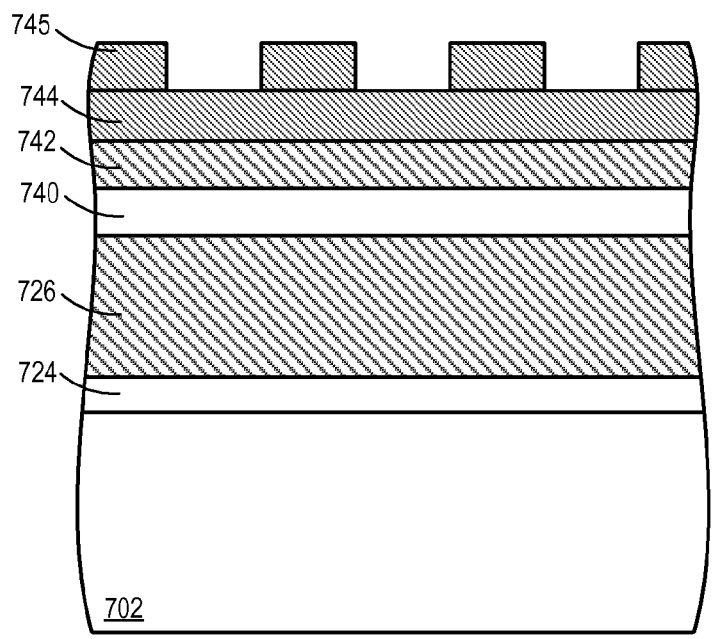

FIG. 13O is a cross-sectional view taken along line D-D of FIG. 13N, depicting the device in cross-section in the direction of the y-axis or bit line direction. FIG. 13O depicts the results of step 626 after forming the second pattern. Over the control gate layer 742 is formed one or more hard masking layers 744 and strips 745 of photoresist or another patterning agent.

Figure 13P:
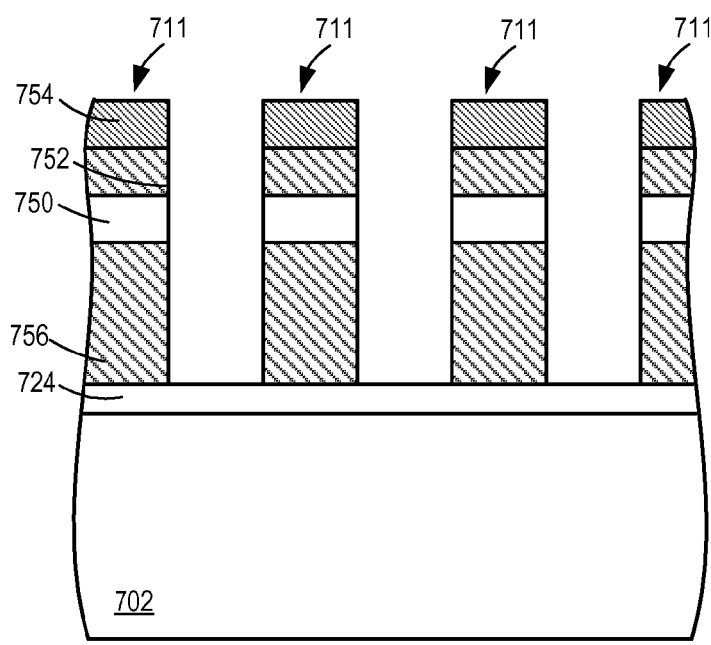

At step 628, the layer stack is etched into layer stack rows. FIG. 13P depicts the results of step 628. Etching continues until reaching the tunnel dielectric layer in this example. In other examples, etching may continue until reaching the substrate surface. In another example, some portion of the tunnel dielectric layer is etched without completely etching through the layer. Etching forms layer stack rows 711. The hard masking material is etched into hard mask strips (HMS) 754 and the control gate layer is etched into control gates (CG) 752. In one embodiment, the control gates 752 form word lines. The intermediate dielectric layer 740 is etched into intermediate dielectric strips (IDS) 750. The charge storage strips 726 are etched into individual charge storage regions (CSR) or floating gates 756. After etching the layer stack, into rows an implant process can be performed to create n+ source/drain regions. In one embodiment, the n+ source/drain regions are created by implanting n-type dopants such as arsenic or phosphorus into the p-well.

At step 630, air gaps are formed at least partially in the spaces between the layer stack rows. The air gaps are elongated in the x-direction. They extend in the x-direction to provide electrical isolation or shielding between elements of adjacent layer stack rows. The vertical dimension and column dimension (along y-axis) of the air gaps can vary to meet the particular requirements of a given implementation.

Figure 13Q:
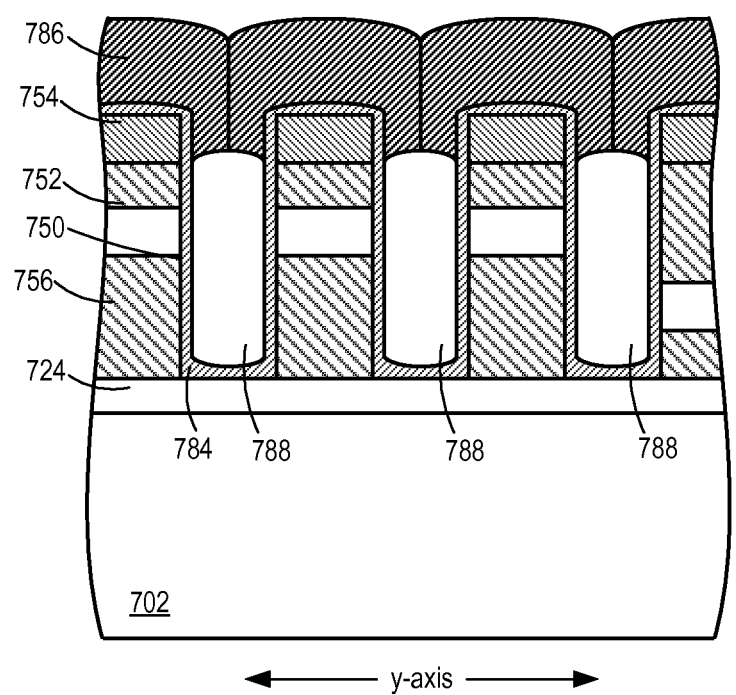

FIG. 13Q depicts the results of step 630 in an example where a capping layer 786 is formed over the layer stack rows using a non-conformal deposition process. A dielectric liner 784 (e.g., oxide) is formed along the sidewalls of the layer stack rows, over the upper surface over hard mask strips 754, and over the exposed upper surface of the tunnel dielectric strips 724. The dielectric liner will also be formed along the sidewalls (not shown) of the rows (extending in the y-direction) that are exposed along the bit line air gaps 736. Capping layer 786 accumulates by using a non-conformal deposition process and meets at a location over the spaces between rows to form air gaps 788 that are elongated in the x-direction. Material 786 extends vertically toward the substrate surface along the liner 784 on a portion of vertical sidewalls 413 of the layer stack rows. The amount of this vertical dimension will define an upper endpoint of the air gaps at a lower surface of material 786. In this example, it is seen that the air gap extends vertically beyond the level of the upper surface of control gate strips 752. Although not shown, some portion of dielectric 786 may enter the spaces between rows. This portion of the dielectric 786 may raise the lower endpoint of the air gap. Any accumulation will be minor and only decrease the size of the air gap minimally. Although not shown, a polishing step can be applied to form individual caps from layer 786.

At step 632, front end processing is completed.

Figure 14:
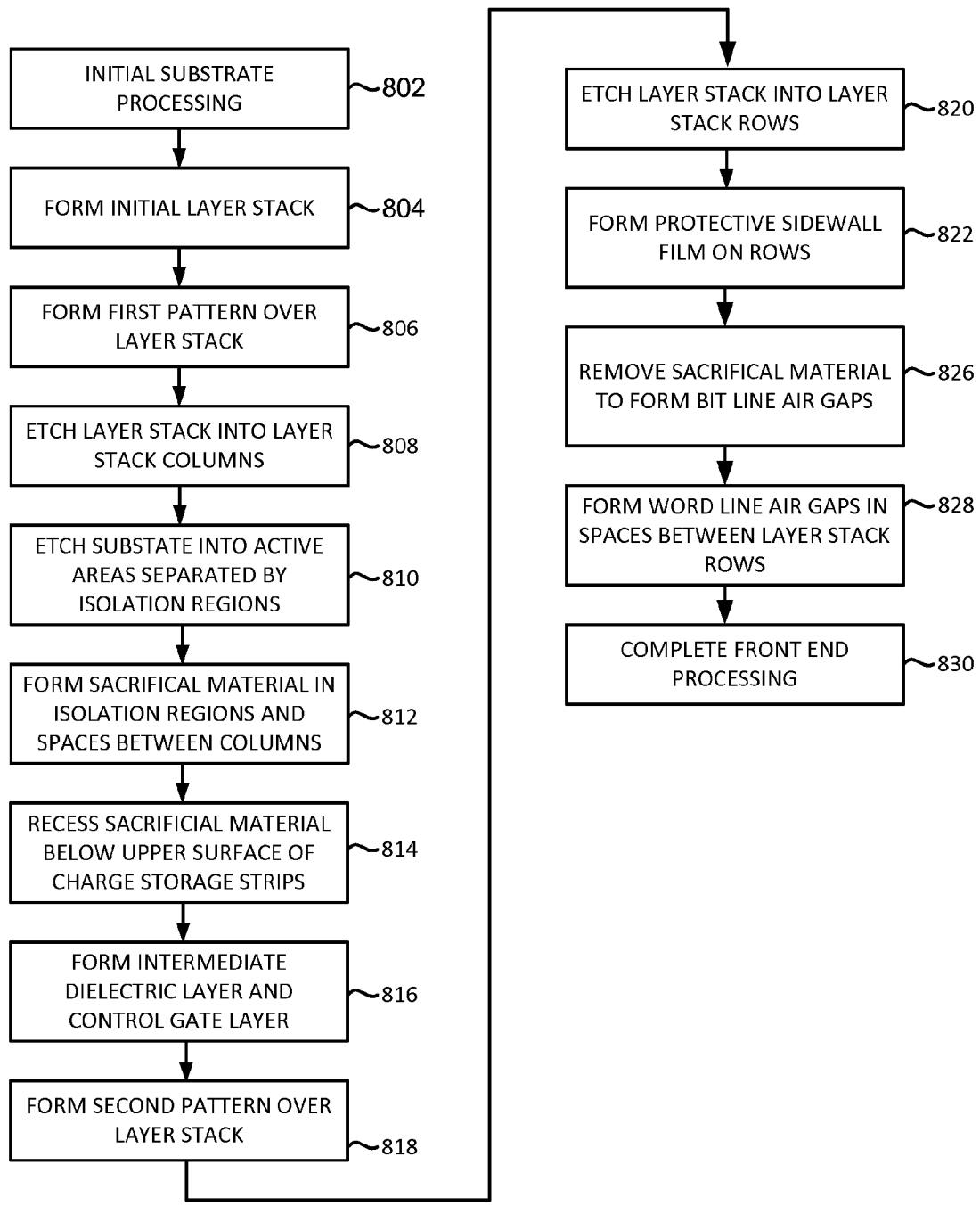
FIG. 14 is a flowchart describing a method of forming bit line and word line air gaps in accordance with one embodiment of the disclosure.
Figure 15A:
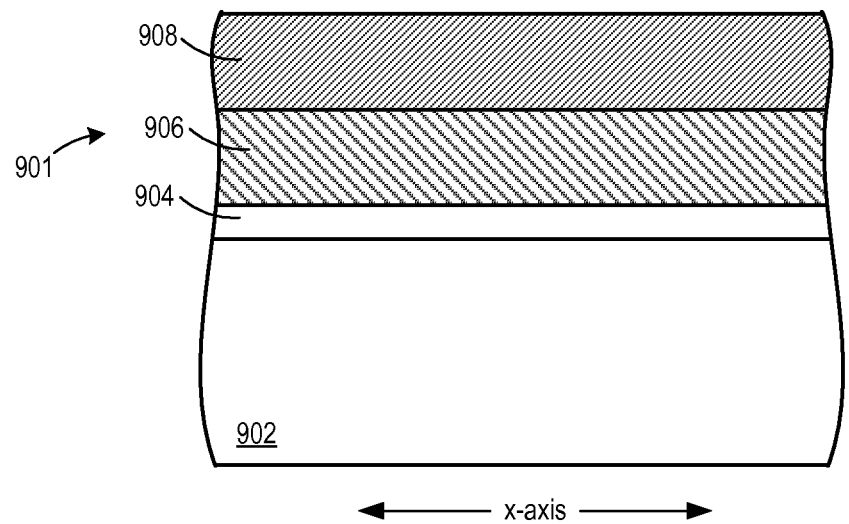
FIGS. 15A-15N are orthogonal cross-sectional and perspective views of a portion of a non-volatile memory array that may be fabricated according to the method of FIG. 14 in one embodiment.

FIGS. 14 and 15A-15O describe another embodiment where a sacrificial fill material is formed in the isolation regions and spaces between layer stack columns. This material remains in the memory array until after the control gate layer is etched into word lines and the charge storage layer strips are etched into individual charge storage regions. The material is then removed, forming bit line air gaps. The described embodiment, including the described dimensions and materials, is exemplary only and its precise form should not be taken as limiting the disclosure.

At steps 602-606 of FIG. 14, a substrate is processed, followed by forming and patterning an initial layer stack. FIG. 15A is a cross-sectional view taken along the x-axis through a memory array undergoing fabrication that depicts the results of steps 602-606 in one example. A tunnel dielectric layer 904, charge storage layer 906, and a sacrificial layer make up layer stack 901. One or more hard masking layers (not shown) may be patterned and etched to form the first pattern.

Figure 15B:
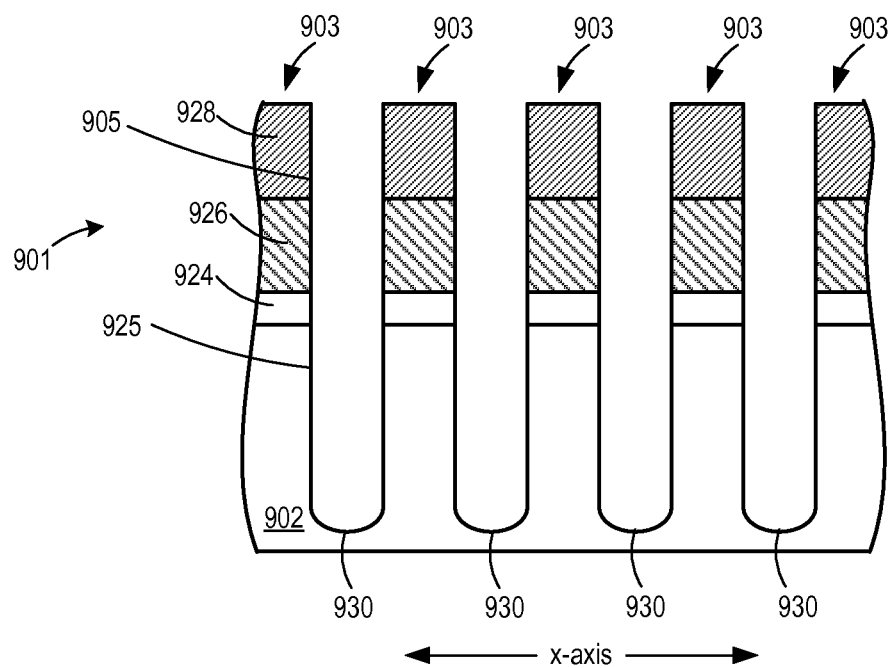

The layer stack is etched into layer stack columns at step 808 and the substrate is etched into active areas separated by isolation regions at step 810. FIG. 15B depicts the results of steps 808-810 in one embodiment, forming layer stack rows 903, isolation regions 930 and active areas 921.

Figure 15C:
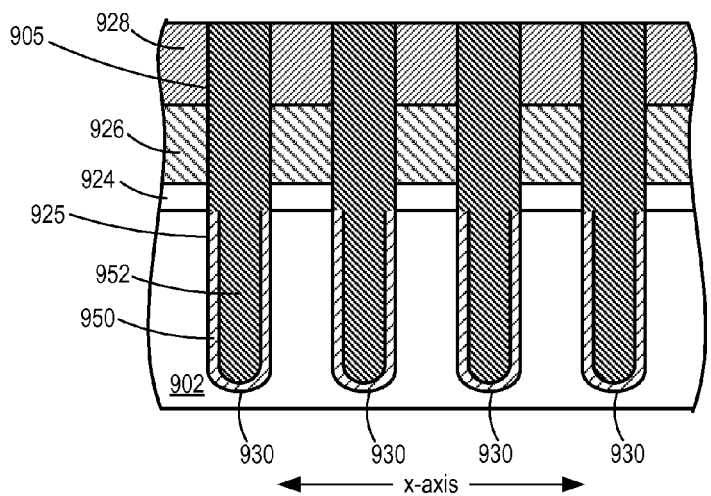

At step 812, a sacrificial material is formed in the isolation regions and spaces between adjacent layer stack columns. FIG. 15C depicts the results of step 812 in one embodiment. In this example, a trench liner 950 (e.g., HTO) is first formed along the vertical sidewalls and lower surface of the isolation regions. Then, the sacrificial material 952 is formed to complete filling of the isolation regions and spaces. In one embodiment, material 952 is a spin on dielectric (SOD) having a high etch selectivity with respect to the liner 950. In one example, the sacrificial film is a borosilicate glass (BSG) or other type of oxide. In another example, a spin-on-carbon can be used. Other materials can also be used such as polysilicon, silicon nitride (SiN) or an undensified polysilazane (PSZ) such as a PSZ-based inorganic spin-on-glass (SOG) material. The sacrificial film can be chosen for a high etch selectivity with respect to the liner so that it etches at a faster rate than the liner. A high etch selectivity of material 952 to material 950 can be achieved by skipping anneals. By not annealing fill material 952, or by not annealing fill material 952 to the same degree as liner 950, a high etch selectivity between layer 952 and liner 950 may be obtained. Layer stack 901 now includes portions of the fill material extending above the substrate surface. In one embodiment, the sacrificial film is a spin-on dielectric (SOD).

Figure 15D:
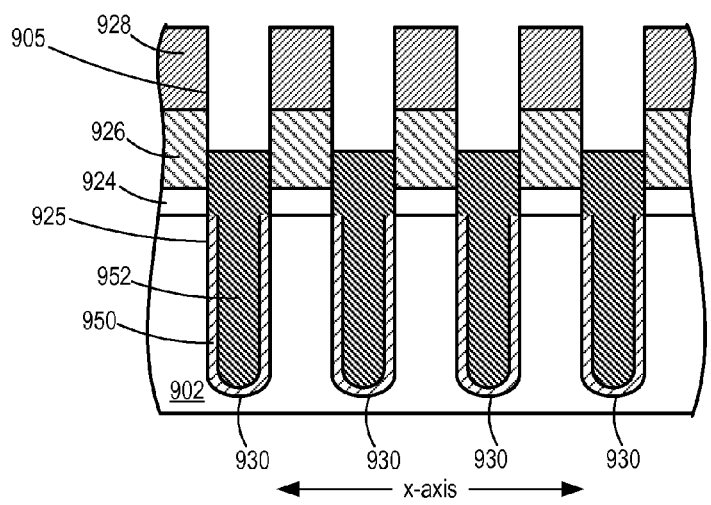

At step 814, the sacrificial material is recessed to a level below that of the upper surface of the strips of the charge storage layer. FIG. 15D depicts the results of step 814 in one embodiment. A selective etch process can be applied to recess an oxide sacrificial material using nitride strips 928 as a mask. Recessing the sacrificial material such that its upper surface is lower than the level of the upper surface of the charge storage strips provides spaces between the control gates which can be filled with the intermediate dielectric and control gate materials.

Figure 15E:
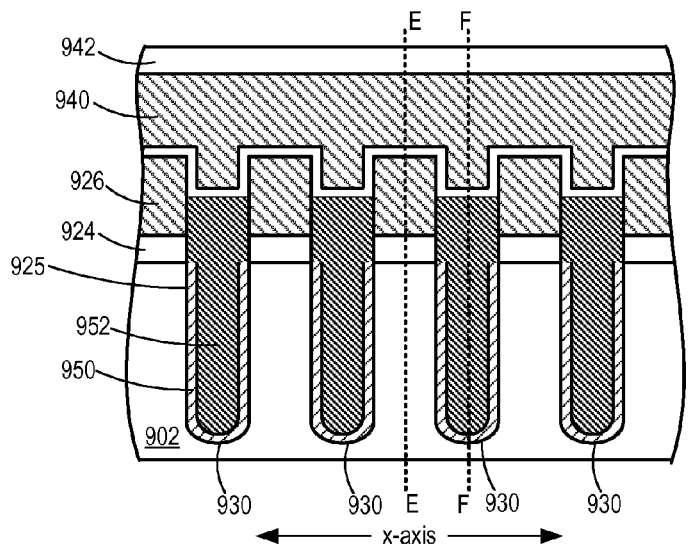

At step 816, an intermediate dielectric layer and control gate layer are formed. FIG. 15E depicts the results of step 816 in one embodiment. The sacrificial strips 928 are first removed, exposing the upper surface of the charge storage strips. Intermediate dielectric layer 940 and control gate layer 942 are formed over the layer stack. In this example, IDL 940 is formed using a conformal deposition process to form the IDL equally upon exposed surfaces such that some space remains between adjacent charge storage strips 926. After forming the IDL, the control gate layer is formed, by depositing a layer of polysilicon for example. The control gate layer may also be formed of metal or a combination of polysilicon and metal.

At step 818, a second pattern is formed over the layer stack. The second pattern is formed for etching orthogonal to the direction of etching using the first pattern. The second pattern may include strips of hard masking material and/or photoresist, or other suitable mask, that are elongated in the row direction along the x-axis with a spacing between strips in the column direction along the y-axis. The pattern defines the gate length for the charge storage region of each memory cell.

Figure 15F:
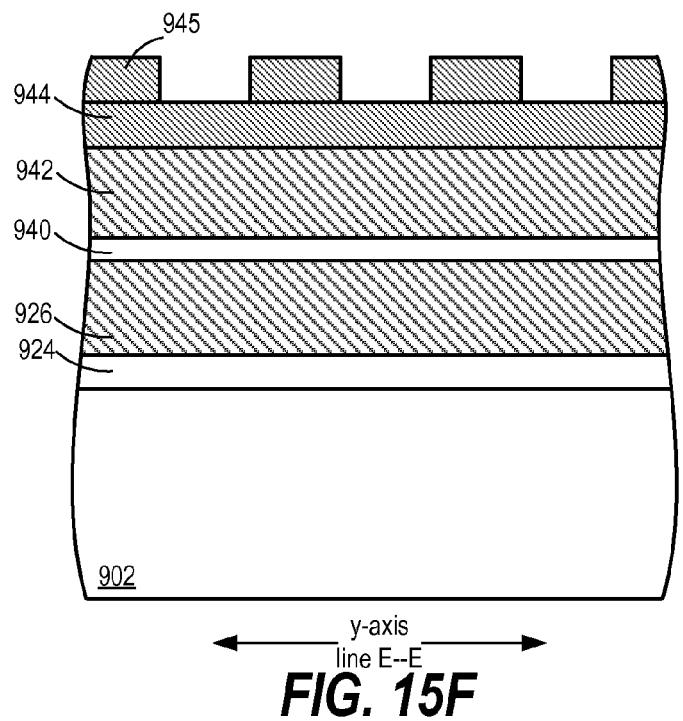
Figure 15G:
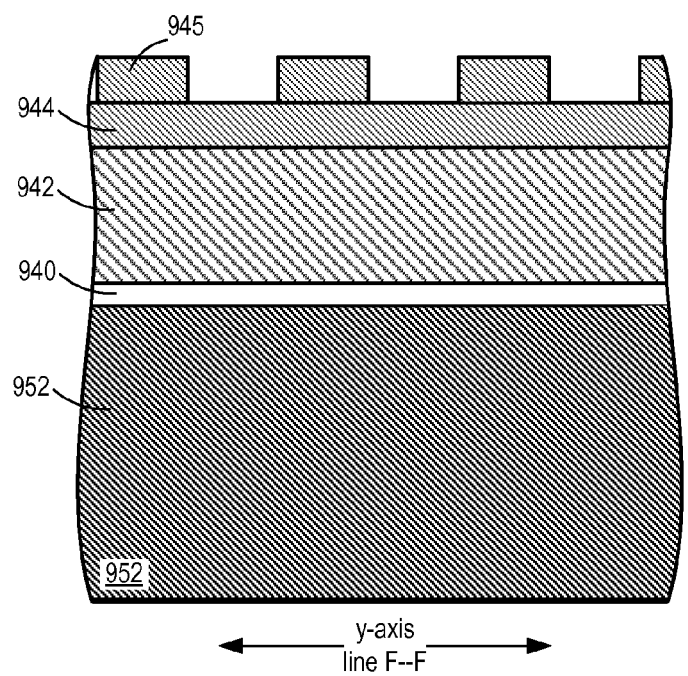

FIG. 15F is a cross-sectional view taken along line E-E of FIG. 15E, depicting the device in cross-section in the direction of the y-axis or bit line direction. FIG. 15G is a cross-sectional view taken along line F-F of FIG. 15E, also depicting the device in cross-section in the direction of the y-axis or bit line direction. FIGS. 15F and 15G both depict the results of step 818 after forming the second pattern. Over the control gate layer is formed one or more hard masking layers 944. Strips 945 of photoresist or another patterning agent are then applied for etching the hard masking layers.

At step 820, the layer stack is etched into layer stack rows using the second pattern. The hard masking layer may be etched using the photoresist, followed by etching the remaining layer stack using the hard mask strips. At step 822, a dielectric liner is formed on the layer stack rows.

Figure 15H:
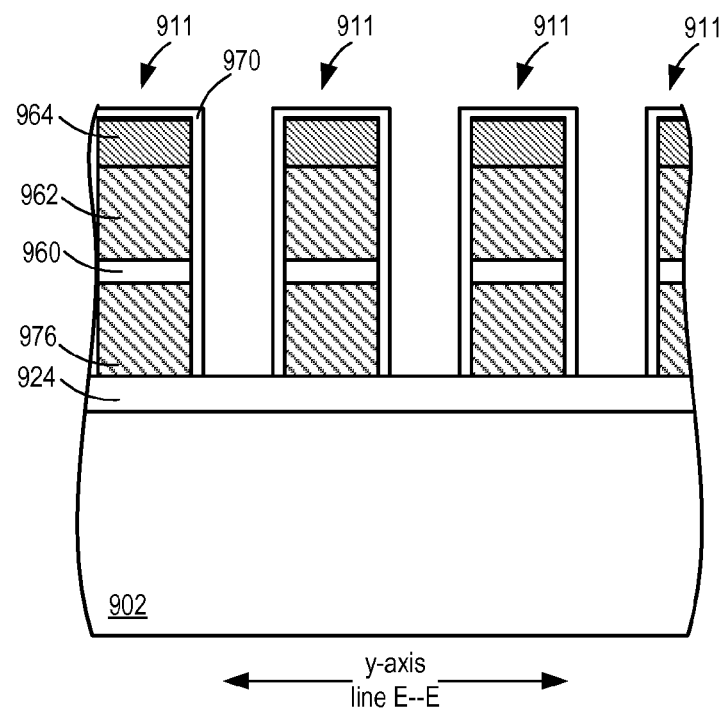

FIGS. 15H (line A-A) and 15I (line B-B) depict the results of steps 620 and 622 in one embodiment. The tunnel dielectric material is not etched in this example such that layer stack rows 911 include charge storage regions 976, intermediate dielectric strips 960, control gates 962 and the hard mask strips 964. The tunnel dielectric may be etched in other embodiments. Reactive ion or another suitable etch process may be used. One or more etch chemistries may be applied to etch through the various layers of the stack. A dielectric liner 970 (e.g., oxide) is formed along the sidewalls of the layer stack rows, over the upper surface of hard mask strips. The dielectric liner will also be formed along the sidewalls (not shown) of the rows (extending in the y-direction) that are exposed along the bit line air gaps. In one example, an oxide can be deposited and etched back to form sidewall films along the sidewalls of the individual layer stack rows. Traditional spacer formation processes may be used.

Figure 15I:
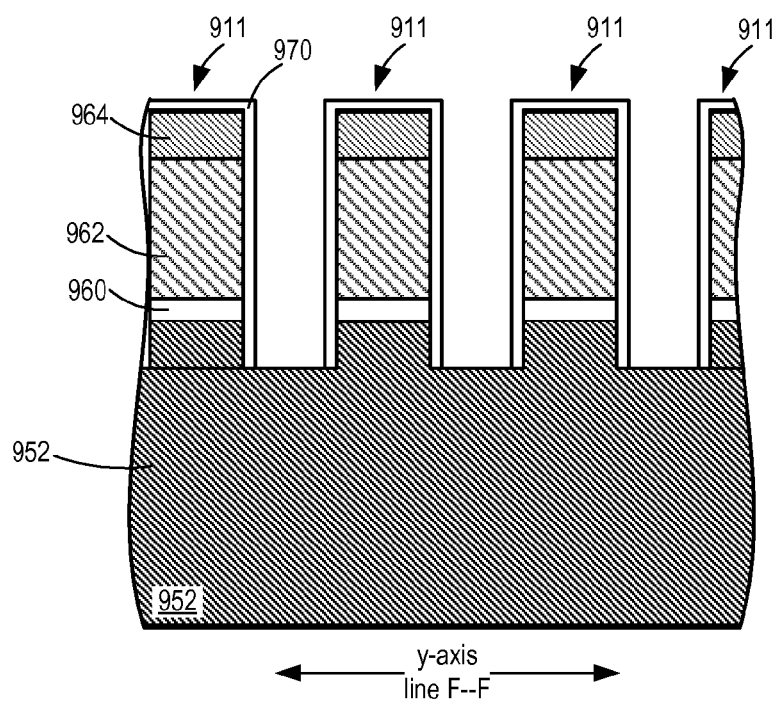
Figure 15J:
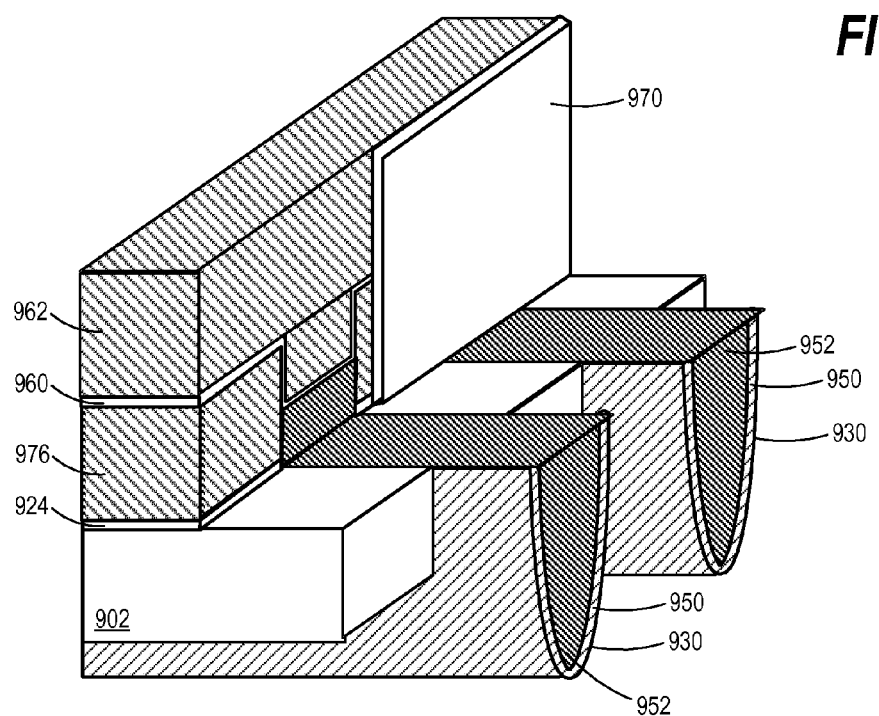

FIG. 15J is a perspective view of the memory array depicting the point in processing shown in the cross-sectional views of FIGS. 15H-15I. Protective dielectric liner 970 is formed along the sidewall of one of the layer stack rows 911. The liner 970 is depicted as only partially extending along the sidewall in the x-axis direction for clarity. The spacer will actually extend fully along the length of each layer stack row. Each layer stack row will include liners 970 on each vertical sidewall.

The liner will protect each layer stack row during subsequent processing steps. In one embodiment, the liner material is chosen for its etch selectivity with respect to the sacrificial film 952. In this manner, the sacrificial film can later be removed in processes where the layer stack sidewalls are not exposed to the various etch chemistries. This will protect the sidewalls of the control gate layer and charge storage layer as well as the various dielectric layers.

FIG. 15J illustrates that etching back the liner material exposes the sacrificial material 952 in trenches 930. A portion of an upper surface 905 of the sacrificial material 952 corresponding to the spaces between adjacent layer stack rows is exposed. This allows subsequent processing to remove the sacrificial material in order to form an air gap in the bit line direction.

At step 826, the sacrificial material is removed to form bit line air gaps in the isolation regions. A wet etch process using a reactive ion etch (RIE) chemistry is used in one embodiment, although other suitable etch processes (e.g., dry) can be used. As earlier described, the etch process is selective for the sacrificial film so that it can be removed without removing the liner 950 in the isolation regions and the sidewalls spacers 510 on the layer stack rows.

Figure 15K:
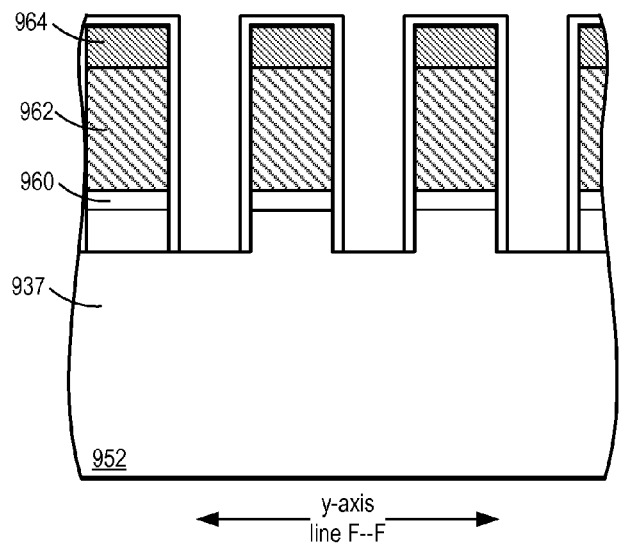
Figure 15L:
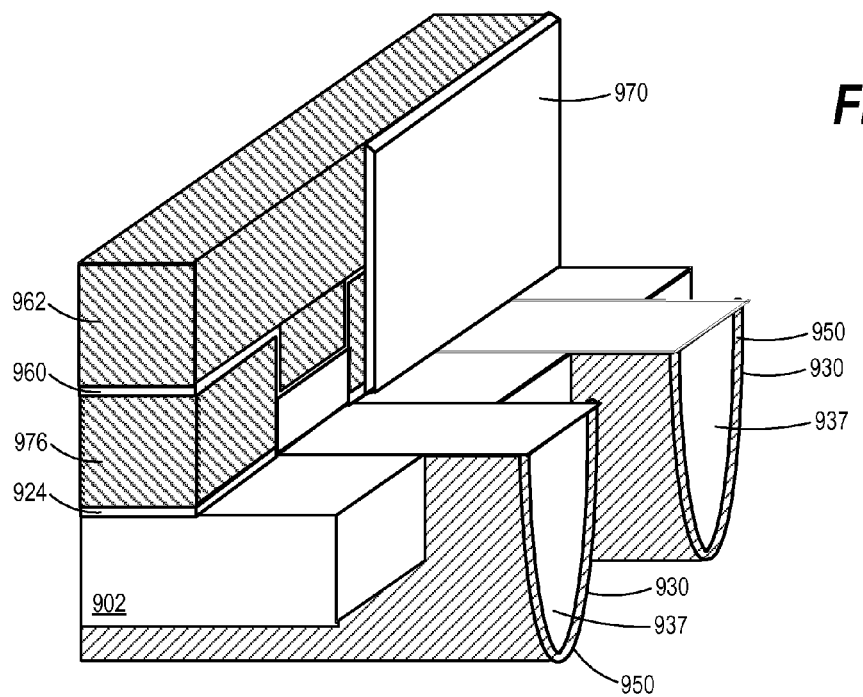

FIGS. 15K-15L depict the results of step 826 in one embodiment. FIG. 15K is a cross-section view taken along line F-F and FIG. 15L is a perspective view. Sacrificial material 952 has been removed from isolation regions 930 and the areas between layer stack columns. Etching removes the film from the isolation regions, beginning with the material exposed by etching back liner 970. Etching will also remove the sacrificial material in the isolation regions that underlies the layer stack rows. Etching will begin attacking the sacrificial material from the side under the rows after etching proceeds vertically down into the isolation regions. Etching will further continue behind the liner 970 to remove portions of the sacrificial material that extend above the isolation regions and substrate surface. Etching removes the material between charge storage regions 976 and intermediate dielectric regions 960 that are adjacent in the word line or row direction. Some of the sacrificial material may not be removed. Thus, removing the sacrificial material does not necessarily have to include removing all of the material.

Removing the sacrificial material forms air gaps 937. The air gaps are elongated in the column direction in the isolation regions 930. The air gaps extend from below the surface of the substrate to the level of the upper surface of the intermediate dielectric regions. As earlier described, the air gaps may have different vertical dimensions in different embodiments. The air gaps may not extend as deep within isolation regions and may not extend as far above the substrate surface. Further, the air gaps may be formed exclusively within the isolation regions or exclusively between adjacent layer stack columns in other examples.

At step 828, word line air gaps are formed that extend in the row or word line direction between adjacent layer stack rows. In one embodiment, the word line air gaps are formed as described in FIGS. 6 and 7A-7J. Liner 970 can protect the sidewalls of the layer stack rows such that an additional material can be omitted. In one example, a capping layer 986 is formed along the vertical sidewalls of liner 970 to form word line air gaps 988. The capping layer may extend vertically toward the substrate surface to the level of the upper surface of the sacrificial strips 964 in one example, although other dimensions may be formed in other examples.

Figure 15M:
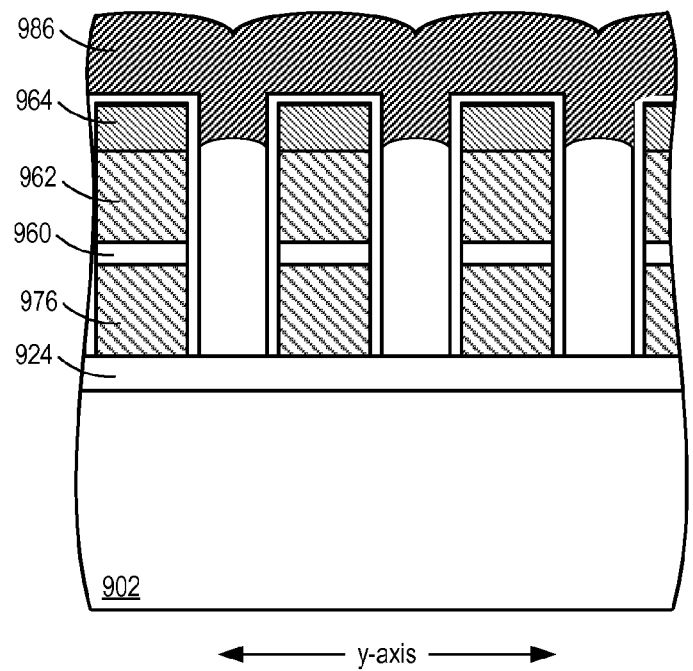
Figure 15N:
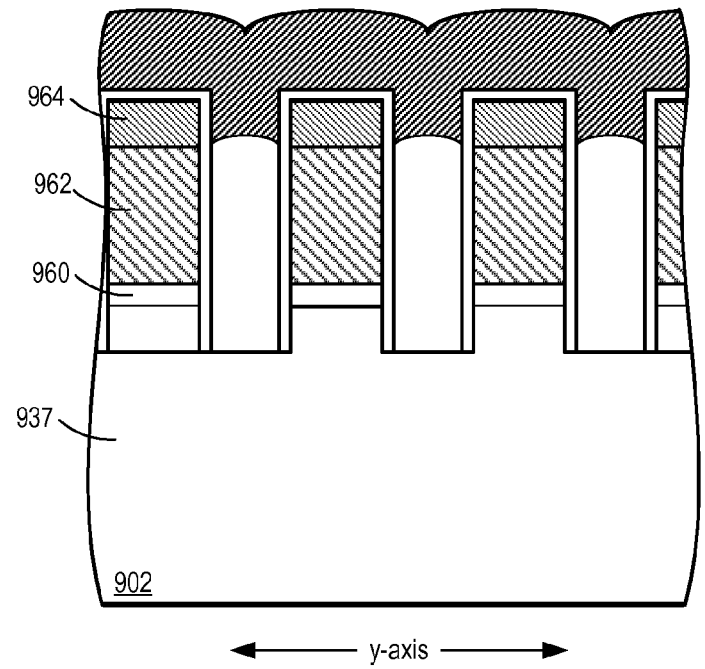

FIG. 15M depicts the results of step 828 in an example where a capping layer 986 is formed over the layer stack rows using a non-conformal deposition process. A dielectric liner 984 (e.g., oxide) is formed along the sidewalls of the layer stack rows. Although not shown, a polishing step can be applied to form individual caps from layer 986 as earlier described.

At step 880, front end processing can be completed as described above.

Figure 16:
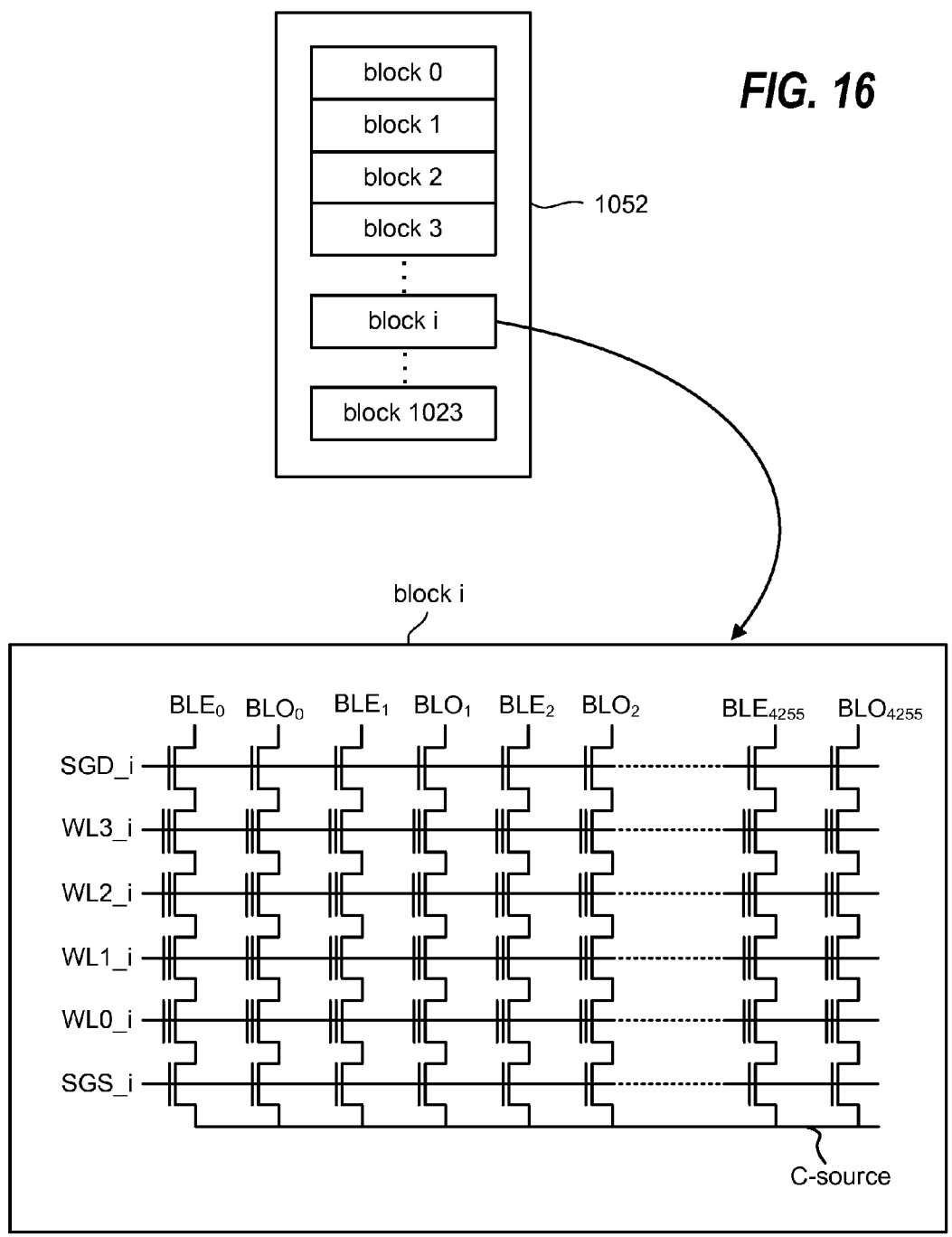
FIG. 16 depicts an example of the organization of a memory array in accordance with one embodiment.

FIG. 16 depicts an exemplary structure of a memory cell array 1052 that can be fabricated using one or more embodiments of the disclosed technology. As one example, a NAND flash EEPROM is described that is partitioned into 1,024 blocks. The data stored in each block can be simultaneously erased. In one embodiment, the block is the minimum unit of cells that are simultaneously erased. In each block, in this example, there are 8,512 columns that are divided into even columns and odd columns. The bit lines are also divided into even bit lines (BLE) and odd bit lines (BLO). FIG. 16 shows four memory cells connected in series to form a NAND string. Although four cells are shown to be included in each NAND string, more or less than four can be used (e.g., 16, 32, or another number). One terminal of the NAND string is connected to a corresponding bit line via a first select transistor (also referred to as a select gate) SGD, and another terminal is connected to c-source via a second select transistor SGS.

During read and programming operations for memory cells of one embodiment, 4,256 memory cells are simultaneously selected. The memory cells selected have the same word line (e.g. WL2-$i$), and the same kind of bit line (e.g. even bit lines). Therefore, 532 bytes of data can be read or programmed simultaneously. These 532 bytes of data that are simultaneously read or programmed form a logical page. Therefore, in this example, one block can store at least eight pages. When each memory cell stores two bits of data (e.g. a multi-level cell), one block stores 16 pages. In another embodiment, a memory array is formed that utilizes an all bit-line architecture such that each bit line within a block is simultaneously selected, including those adjacent in the x-direction.

In other embodiments, the bit lines are not divided into odd and even bit lines. Such architectures are commonly referred to as all bit line architectures. In an all bit line architecture, all the bit lines of a block are simultaneously selected during read and program operations. Memory cells along a common word line and connected to any bit line are programmed at the same time. In other embodiments, the bit lines or block can be broken up into other groupings (e.g., left and right, more than two groupings, etc.).

Figure 17:
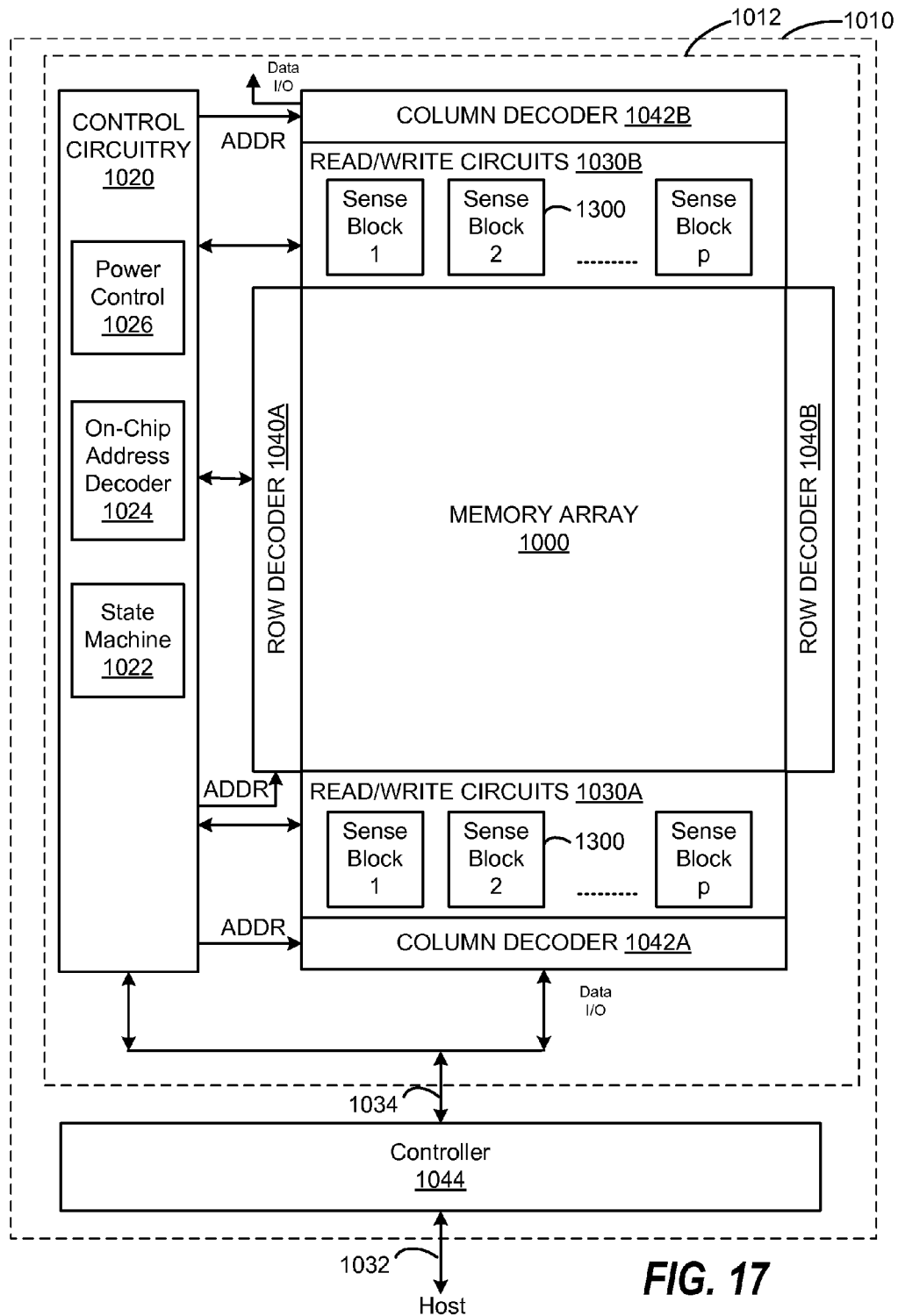
FIG. 17 is a block diagram depicting an example of a memory system that can be fabricated or used to implement embodiments of the disclosed technology.

FIG. 17 illustrates a non-volatile storage device 1010 that may include one or more memory die or chips 1012. Memory die 1012 includes an array (two-dimensional or three dimensional) of memory cells 1000, control circuitry 1020, and read/write circuits 1030A and 1030B. In one embodiment, access to the memory array 1000 by the various peripheral circuits is implemented in a symmetric fashion, on opposite sides of the array, so that the densities of access lines and circuitry on each side are reduced by half. The read/write circuits 1030A and 1030B include multiple sense blocks 1300 which allow a page of memory cells to be read or programmed in parallel. The memory array 1000 is addressable by word lines via row decoders 1040A and 1040B and by bit lines via column decoders 1042A and 1042B. In a typical embodiment, a controller 1044 is included in the same memory device 1010 (e.g., a removable storage card or package) as the one or more memory die 1012. Commands and data are transferred between the host and controller 1044 via lines 1032 and between the controller and the one or more memory die 1012 via lines 1034. One implementation can include multiple chips 1012.

Control circuitry 1020 cooperates with the read/write circuits 1030A and 1030B to perform memory operations on the memory array 1000. The control circuitry 1020 includes a state machine 1022, an on-chip address decoder 1024 and a power control module 1026. The state machine 1022 provides chip-level control of memory operations. The on-chip address decoder 1024 provides an address interface to convert between the address that is used by the host or a memory controller to the hardware address used by the decoders 1040A, 1040B, 1042A, and 1042B. The power control module 1026 controls the power and voltages supplied to the word lines and bit lines during memory operations. In one embodiment, power control module 1026 includes one or more charge pumps that can create voltages larger than the supply voltage.

In one embodiment, one or any combination of control circuitry 1020, power control circuit 1026, decoder circuit 1024, state machine circuit 1022, decoder circuit 1042A, decoder circuit 1042B, decoder circuit 1040A, decoder circuit 1040B, read/write circuits 1030A, read/write circuits 1030B, and/or controller 1044 can be referred to as one or more managing circuits.

Figure 18:
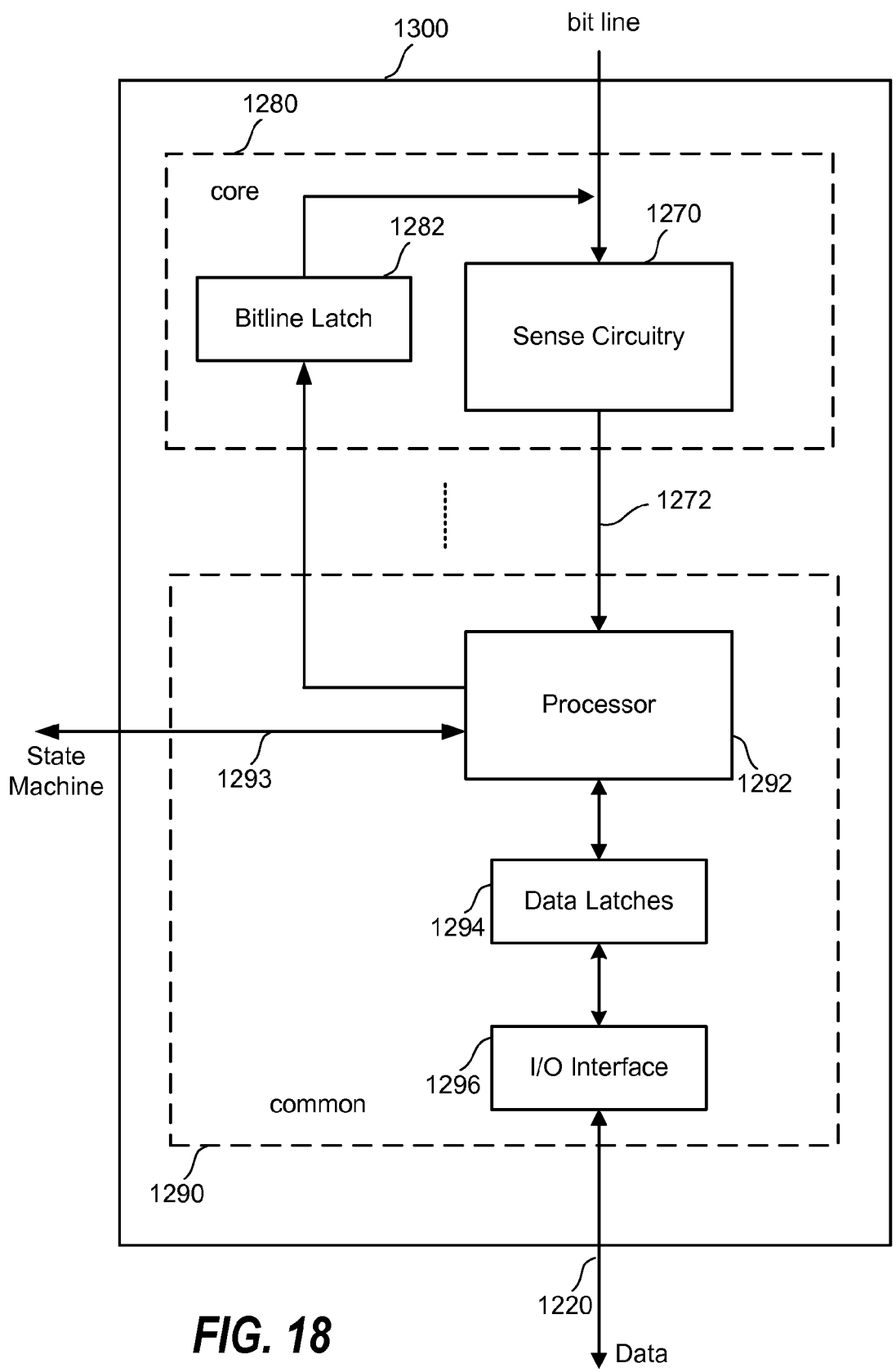
FIG. 18 is a block diagram depicting one embodiment of a sense block.

FIG. 18 is a block diagram of an individual sense block 1300 partitioned into a core portion, referred to as a sense module 1280, and a common portion 1290. In one embodiment, there will be a separate sense module 1280 for each bit line and one common portion 1290 for a set of multiple sense modules 1280. In one example, a sense block will include one common portion 1290 and eight sense modules 1280. Each of the sense modules in a group will communicate with the associated common portion via a data bus 1272. For further details, refer to U.S. Patent Application Publication 2006/0140007, which is incorporated herein by reference in its entirety.

Sense module 1280 comprises sense circuitry 1270 that determines whether a conduction current in a connected bit line is above or below a predetermined threshold level. In some embodiments, sense module 1280 includes a circuit commonly referred to as a sense amplifier. Sense module 1280 also includes a bit line latch 1282 that is used to set a voltage condition on the connected bit line. For example, a predetermined state latched in bit line latch 1282 will result in the connected bit line being pulled to a state designating program inhibit (e.g., Vdd).

Common portion 1290 comprises a processor 1292, a set of data latches 1294 and an I/O Interface 1296 coupled between the set of data latches 1294 and data bus 1220. Processor 1292 performs computations. For example, one of its functions is to determine the data stored in the sensed memory cell and store the determined data in the set of data latches. The set of data latches 1294 is used to store data bits determined by processor 1292 during a read operation. It is also used to store data bits imported from the data bus 1220 during a program operation. The imported data bits represent write data meant to be programmed into the memory. I/O interface 1296 provides an interface between data latches 1294 and the data bus 1220.

During read or sensing, the operation of the system is under the control of state machine 1022 that controls the supply of different control gate voltages to the addressed cell. As it steps through the various predefined control gate voltages corresponding to the various memory states supported by the memory, the sense module 1280 may trip at one of these voltages and an output will be provided from sense module 1280 to processor 1292 via bus 1272. At that point, processor 1292 determines the resultant memory state by consideration of the tripping event(s) of the sense module and the information about the applied control gate voltage from the state machine via input lines 1293. It then computes a binary encoding for the memory state and stores the resultant data bits into data latches 1294. In another embodiment of the core portion, bit line latch 1282 serves double duty, both as a latch for latching the output of the sense module 1280 and also as a bit line latch as described above.

It is anticipated that some implementations will include multiple processors 1292. In one embodiment, each processor 1292 will include an output line (not depicted in FIG. 12) such that each of the output lines is wired-OR'd together. In some embodiments, the output lines are inverted prior to being connected to the wired-OR line. This configuration enables a quick determination during the program verification process of when the programming process has completed because the state machine receiving the wired-OR line can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. In embodiments where each processor communicates with eight sense modules, the state machine may (in some embodiments) need to read the wired-OR line eight times, or logic is added to processor 1292 to accumulate the results of the associated bit lines such that the state machine need only read the wired-OR line one time.

During program or verify, the data to be programmed is stored in the set of data latches 1294 from the data bus 1220. The program operation, under the control of the state machine, comprises a series of programming voltage pulses (with increasing magnitudes) applied to the control gates of the addressed memory cells. Each programming pulse is followed by a verify process to determine if the memory cell has been programmed to the desired state. Processor 1292 monitors the verified memory state relative to the desired memory state. When the two are in agreement, processor 1292 sets the bit line latch 1282 so as to cause the bit line to be pulled to a state designating program inhibit. This inhibits the cell coupled to the bit line from further programming even if it is subjected to programming pulses on its control gate. In other embodiments the processor initially loads the bit line latch 1282 and the sense circuitry sets it to an inhibit value during the verify process.

Data latch stack 1294 contains a stack of data latches corresponding to the sense module. In one embodiment, there are 3-5 (or another number) data latches per sense module 1280. In one embodiment, the latches are each one bit. In some implementations (but not required), the data latches are implemented as a shift register so that the parallel data stored therein is converted to serial data for data bus 1220, and vice versa. In one preferred embodiment, all the data latches corresponding to the read/write block of m memory cells can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Additional information about the read operations and sense amplifiers can be found in (1) U.S. Pat. No. 7,196,931, "Non-Volatile Memory And Method With Reduced Source Line Bias Errors,"; (2) U.S. Pat. No. 7,023,736, "Non-Volatile Memory And Method with Improved Sensing,"; (3) U.S. Patent Application Pub. No. 2005/0169082; (4) U.S. Pat. No. 7,196,928, "Compensating for Coupling During Read Operations of Non-Volatile Memory," and (5) United States Patent Application Pub. No. 2006/0158947, "Reference Sense Amplifier For Non-Volatile Memory," published on Jul. 20, 2006. All five of the immediately above-listed patent documents are incorporated herein by reference in their entirety.

Various features and techniques have been presented with respect to the NAND flash memory architecture. It will be appreciated from the provided disclosure that implementations of the disclosed technology are not so limited. By way of non-limiting example, embodiments in accordance with the present disclosure can provide and be used in the fabrication of a wide range of semiconductor devices, including but not limited to logic arrays, volatile memory arrays including SRAM and DRAM, and non-volatile memory arrays including both the NOR and NAND architecture.

A non-volatile memory array in one embodiment includes a first column of non-volatile storage elements formed over a first active area of a substrate, a second column of non-volatile storage elements formed over a second active area of the substrate, an isolation region in the substrate between the first active area and the second active area, a bit line air gap in the isolation region, and a cap extending in the row direction between a first charge storage region of the first column and a first charge storage region of the second column. The cap extends vertically with respect to a surface of the substrate along at least a portion of the first charge storage region and the second charge storage region.

A method of fabricating non-volatile storage is provided in one embodiment that includes forming a first layer stack column and a second layer stack column elongated in a column direction over a substrate. Each layer stack column has two vertical sidewalls and includes a charge storage strip over a tunnel dielectric strip. The first layer stack column overlies a first active area of the substrate and the second layer stack column overlies a second active area of the substrate. The method includes etching the substrate to define an isolation region between the first active area and the second active area, growing a cap between the first layer stack column and the second layer stack column such that the cap extends vertically along at least a portion of the charge storage strip of the first column and the charge storage strip of the second column, and forming a bit line air gap in the isolation region that has an upper endpoint defined at least partially by the cap.

A non-volatile memory array in one embodiment includes a plurality of non-volatile storage elements arranged into rows and columns above a surface of a substrate, a plurality of isolation regions formed in the substrate between active areas of the substrate that underlie adjacent columns of non-volatile storage elements. The non-volatile storage element include a charge storage region. The array further includes a plurality of bit line air gaps formed in the plurality of isolation regions and a plurality of air gap caps including at least one air gap cap overlying air within each isolation region. The at least one air gap extends vertically with respect to a surface of the substrate to at least a level of a lower surface of the charge storage regions of the adjacent column. The array further includes a plurality of word line air gaps formed at least partially between adjacent rows of non-volatile storage elements.

A non-volatile memory array in one embodiment includes an array of non-volatile storage elements arranged into a plurality of rows and a plurality of columns over a substrate. The plurality of columns overlie a plurality of active areas in the substrate and each non-volatile storage element includes a charge storage region. The array further includes a plurality of isolation regions in the substrate between adjacent active areas, a plurality of bit line air gaps formed in the plurality of isolation regions, and a plurality of caps overlying the plurality of isolation regions. Each cap overlies a corresponding isolation region to define an upper endpoint for at least a portion of the air gap formed in the corresponding isolation region. Each cap extends vertically with respect to a surface of the substrate along at least a portion of an adjacent charge storage region.

The foregoing detailed description has been presented for purposes of illustration and description. It is not intended to be exhaustive or to limit the subject matter claimed herein to the precise form(s) disclosed. Many modifications and variations are possible in light of the above teachings. The described embodiments were chosen in order to best explain the principles of the disclosed technology and its practical application to thereby enable others skilled in the art to best utilize the technology in various embodiments and with various modifications as are suited to the particular use contemplated. It is intended that the scope of the invention be defined by the claims appended hereto.

What is claimed is:

1. A method of fabricating non-volatile storage, comprising:
   forming a first layer stack column and a second layer stack column elongated in a column direction over a substrate, each layer stack column having two vertical sidewalls and including a charge storage strip over a tunnel dielectric strip, the first layer stack column overlying a first active area of the substrate and the second layer stack column overlying a second active area of the substrate;
   etching the substrate to define an isolation region between the first active area and the second active area;
   modifying a surface of at least a portion of the two vertical sidewalls of each layer stack column by ion implantation prior to etching the substrate;
   growing a cap between the first layer stack column and the second layer stack column, the cap extending vertically along at least a portion of the charge storage strip of the first column and the charge storage strip of the second column; and
   forming a bit line air gap in the isolation region having an upper endpoint defined at least partially by the cap.

2. A method according to claim 1, wherein growing the cap between the first layer stack column and the second layer stack column includes:
   selectively growing the cap using the modified surface of the two vertical sidewalls to form the cap between the charge storage strip of the first layer stack column and the charge storage strip of the second layer stack column.

3. A method according to claim 1, wherein selectively growing the cap includes:
   providing ozone and tetraethyl orthosilicate in a first ratio to form a nucleation layer on the modified surface of the two vertical sidewalls; and
   changing the ratio of the ozone to the tetraethyl orthosilicate to induce selective growth of the cap along the nucleation layer.

4. A method according to claim 1, further comprising:
   recessing the cap below a level of an upper surface of the charge storage strips;
   forming an intermediate dielectric layer over the upper surface and along the vertical sidewalls of the charge storage strips; and
   forming a control gate layer over the intermediate dielectric layer, the control gate layer extending below the upper surface of the charge storage strips between adjacent portions of the intermediate dielectric layer.

5. A method according to claim 4, further comprising:
   etching the control gate layer into a plurality of control gates;
   etching the charge storage strip for the first column into a first plurality of charge storage regions;
   etching the charge storage strip for the second column into a second plurality of charge storage regions;
   wherein the plurality of control gates includes a first control gate separated from a first charge storage region of the first plurality and a first charge storage region of the second plurality;
   wherein the plurality of control gates includes a second control gate separated from a second charge storage region of the first plurality and a second charge storage region of the second plurality.

6. A method according to claim 5, wherein:
   etching the control gate layer, the charge storage strip for the first column and the charge storage strip for the second column is orthogonal to a direction of the first layer stack column and the second layer stack column.

7. A method according to claim 6, wherein:
   etching the control gate layer, the charge storage strip for the first column and the charge storage strip for the second column forms a plurality of layer stack rows including a first layer stack row and a second layer stack row;
   the first layer stack row includes the first control gate, a first intermediate dielectric strip, and the first plurality of charge storage regions; and
   the second layer stack row includes the second control gate, a second intermediate dielectric strip, and the second plurality of charge storage regions.

8. A method according to claim 7, further comprising:
   forming a plurality of word line air gaps including a first word line air gap formed between the first layer stack row and the second layer stack row.

9. A method according to claim 8, wherein:
   the first word line air gap extends vertically, with respect to the substrate surface, from a level above the substrate surface to at least a level of an upper surface of the first and second control gate.

10. A method according to claim 9, further comprising, after etching the control gate layer and before etching the charge storage strip for the first column and the charge storage strip for the second column:
    forming a catalytic layer on a first and a second sidewall of each control gate.

11. A method according to claim 10, further comprising, after etching the charge storage strip for the first column and the charge storage strip for the second column and before forming the plurality of word line air gaps:
    selectively growing a temporary cap between each pair of adjacent control gates;
    recessing the temporary caps below an upper surface of each control gate;
    siliciding the control gates after recessing the temporary caps.

12. A method according to claim 11, further comprising:
removing the temporary caps after siliciding the control gates;
nonconformally depositing a capping layer to form permanent word line air gap caps that overlie air between adjacent layer stack rows, the permanent word line air gap caps defining an upper endpoint of the corresponding word line air gap.

13. A method of fabricating non-volatile storage, comprising:
forming a first layer stack column and a second layer stack column elongated in a column direction over a substrate, each layer stack column having two vertical sidewalls and including a charge storage strip over a tunnel dielectric strip, the first layer stack column overlying a first active area of the substrate and the second layer stack column overlying a second active area of the substrate;
etching the substrate to define an isolation region between the first active area and the second active area;
growing a cap between the first layer stack column and the second layer stack column, the cap extending vertically along at least a portion of the charge storage strip of the first column and the charge storage strip of the second column;
recessing the cap below a level of an upper surface of the charge storage strips;
forming an intermediate dielectric layer over the upper surface and along the vertical sidewalls of the charge storage strips;
forming a control gate layer over the intermediate dielectric layer, the control gate layer extending below the upper surface of the charge storage strips between adjacent portions of the intermediate dielectric layer; and
forming a bit line air gap in the isolation region having an upper endpoint defined at least partially by the cap.

14. A method according to claim 13, further comprising:
etching the control gate layer into a plurality of control gates;
etching the charge storage strip for the first column into a first plurality of charge storage regions;
etching the charge storage strip for the second column into a second plurality of charge storage regions;
wherein the plurality of control gates includes a first control gate separated from a first charge storage region of the first plurality and a first charge storage region of the second plurality;
wherein the plurality of control gates includes a second control gate separated from a second charge storage region of the first plurality and a second charge storage region of the second plurality.

15. A method according to claim 14, wherein:
etching the control gate layer, the charge storage strip for the first column and the charge storage strip for the second column is orthogonal to a direction of the first layer stack column and the second layer stack column.

16. A method according to claim 15, wherein:
etching the control gate layer, the charge storage strip for the first column and the charge storage strip for the second column forms a plurality of layer stack rows including a first layer stack row and a second layer stack row;

the first layer stack row includes the first control gate, a first intermediate dielectric strip, and the first plurality of charge storage regions; and
the second layer stack row includes the second control gate, a second intermediate dielectric strip, and the second plurality of charge storage regions.

17. A method according to claim 16, further comprising:
forming a plurality of word line air gaps including a first word line air gap formed between the first layer stack row and the second layer stack row.

18. A method according to claim 17, wherein:
the first word line air gap extends vertically, with respect to the substrate surface, from a level above the substrate surface to at least a level of an upper surface of the first and second control gate.

19. A method according to claim 18, further comprising, after etching the control gate layer and before etching the charge storage strip for the first column and the charge storage strip for the second column:
forming a catalytic layer on a first and a second sidewall of each control gate.

20. A method according to claim 19, further comprising, after etching the charge storage strip for the first column and the charge storage strip for the second column and before forming the plurality of word line air gaps:
selectively growing a temporary cap between each pair of adjacent control gates;
recessing the temporary caps below an upper surface of each control gate;
siliciding the control gates after recessing the temporary caps.

21. A method according to claim 20, further comprising:
removing the temporary caps after siliciding the control gates;
nonconformally depositing a capping layer to form permanent word line air gap caps that overlie air between adjacent layer stack rows, the permanent word line air gap caps defining an upper endpoint of the corresponding word line air gap.

22. A method according to claim 13, further comprising:
modifying a surface of at least a portion of the two vertical sidewalls of each layer stack column by ion implantation prior to etching the substrate.

23. A method according to claim 22, wherein growing the cap between the first layer stack column and the second layer stack column includes:
selectively growing the cap using the modified surface of the two vertical sidewalls to form the cap between the charge storage strip of the first layer stack column and the charge storage strip of the second layer stack column.

24. A method according to claim 23, wherein selectively growing the cap includes:
providing ozone and tetraethyl orthosilicate in a first ratio to form a nucleation layer on the modified surface of the two vertical sidewalls; and
changing the ratio of the ozone to the tetraethyl orthosilicate to induce selective growth of the cap along the nucleation layer.

* * * * *